(12) United States Patent
Nishimura et al.

(10) Patent No.: US 12,059,884 B2
(45) Date of Patent: Aug. 13, 2024

(54) OPTICAL LAMINATE, ORGANIC EL DISPLAY DEVICE, AND FOLDABLE DEVICE

(71) Applicant: FUJIFILM Corporation, Tokyo (JP)

(72) Inventors: Naoya Nishimura, Kanagawa (JP); Naoya Shibata, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 17/702,321

(22) Filed: Mar. 23, 2022

(65) Prior Publication Data
US 2022/0227101 A1 Jul. 21, 2022

Related U.S. Application Data

(63) Continuation of application No. PCT/JP2020/035756, filed on Sep. 23, 2020.

(30) Foreign Application Priority Data
Sep. 30, 2019 (JP) .................. 2019-178179

(51) Int. Cl.
*B32B 7/023* (2019.01)
*B32B 7/12* (2006.01)
(Continued)

(52) U.S. Cl.
CPC ............. *B32B 7/023* (2019.01); *B32B 7/12* (2013.01); *B32B 17/10018* (2013.01);
(Continued)

(58) Field of Classification Search
CPC ..................... B32B 7/023; B32B 17/10018
(Continued)

(56) References Cited

U.S. PATENT DOCUMENTS

2008/0198446 A1* 8/2008 Asakura ............... G02B 5/208 359/359
2016/0216424 A1 7/2016 Seo et al.
(Continued)

FOREIGN PATENT DOCUMENTS

| CN | 105824072 A | 8/2016 |
| CN | 106990472 A | 7/2017 |

(Continued)

OTHER PUBLICATIONS

Machine_English_translation_JP_2016038999_A1; Bando et al., Organic EL element and organic EL lighting system using the same; Mar. 22, 2016; EPO; whole document (Year: 2024).*
(Continued)

*Primary Examiner* — Tahseen Khan
(74) *Attorney, Agent, or Firm* — Edwards Neils LLC; Jean C. Edwards, Esq.

(57) ABSTRACT

Provided is an organic EL display device including an optical laminate, and a foldable device formed of the organic EL display device. The optical laminate includes a glass plate, a first pressure-sensitive adhesive layer, a polarizer layer, a second pressure-sensitive adhesive layer, and an optically anisotropic layer in this order, in which the glass plate has a thickness of less than 100 μm, the polarizing layer is formed of a composition for forming a polarizing layer which contains a liquid crystal compound and an organic dichroic material, a distance A between the first pressure-sensitive adhesive layer and the polarizer layer is 10 μm or less, and a distance B between the polarizer layer and the second pressure-sensitive adhesive layer is 10 μm or less.

11 Claims, 1 Drawing Sheet

(51) Int. Cl.
  *B32B 17/10* (2006.01)
  *G02F 1/1335* (2006.01)
  *H10K 50/80* (2023.01)
  *H10K 50/86* (2023.01)
  *H10K 77/10* (2023.01)

(52) U.S. Cl.
  CPC .. *B32B 17/10504* (2013.01); *G02F 1/133512* (2013.01); *G02F 1/133528* (2013.01); *H10K 50/865* (2023.02); *H10K 50/868* (2023.02); *H10K 77/111* (2023.02); *B32B 2307/42* (2013.01); *B32B 2307/732* (2013.01); *B32B 2457/202* (2013.01); *B32B 2457/206* (2013.01)

(58) Field of Classification Search
  USPC .......................................................... 428/212
  See application file for complete search history.

(56) References Cited

U.S. PATENT DOCUMENTS

| | | | | |
|---|---|---|---|---|
| 2016/0291225 | A1* | 10/2016 | Sato | G02F 1/1335 |
| 2017/0123124 | A1* | 5/2017 | Hatanaka | G02B 5/3016 |
| 2017/0184766 | A1 | 6/2017 | Ozawa et al. | |
| 2018/0006275 | A1 | 1/2018 | Maruyama et al. | |
| 2019/0168317 | A1* | 6/2019 | Kanno | C03C 19/00 |
| 2020/0318011 | A1 | 10/2020 | Shibata et al. | |
| 2020/0326590 | A1 | 10/2020 | Shibata et al. | |

FOREIGN PATENT DOCUMENTS

| | | | | |
|---|---|---|---|---|
| JP | 2001-097733 A | 4/2001 | | |
| JP | 2011-121320 A | 6/2011 | | |
| JP | 2016038999 A | * 3/2016 | | |
| JP | 2017-083843 A | 5/2017 | | |
| WO | 2016/158300 A1 | 10/2016 | | |
| WO | WO-2017086338 A1 | * 5/2017 | ............ | B32B 7/023 |
| WO | 2019/131943 A1 | 7/2019 | | |
| WO | 2019/131976 A1 | 7/2019 | | |

OTHER PUBLICATIONS

International Search Report issued in PCT/JP2020/035756 on Dec. 15, 2020.
Written Opinion issued in PCT/JP2020/035756 on Dec. 15, 2020.
International Preliminary Report on Patentability completed by WIPO on Apr. 5, 2022 in connection with International Patent Application No. PCT/JP2020/035756.
Office Action, issued by the Japanese Patent Office on Apr. 18, 2023, in connection with Japanese Patent Application No. 2021-550651.
Office Action, issued by the China National Intellectual Property Administration on Aug. 23, 2023, in connection with Chinese Patent Application No. 202080068849.6.
Office Action, issued by the China National Intellectual Property Administration on Apr. 27, 2024, in connection with Chinese Patent Application No. 202080068849.6.

\* cited by examiner

OPTICAL LAMINATE, ORGANIC EL DISPLAY DEVICE, AND FOLDABLE DEVICE

CROSS-REFERENCE TO RELATED APPLICATIONS

This application is a Continuation of PCT International Application No. PCT/JP2020/035756 filed on Sep. 23, 2020, which was published under PCT Article 21(2) in Japanese, and which claims priority under 35 U.S.C. § 119(a) to Japanese Patent Application No. 2019-178179 filed on Sep. 30, 2019. The above applications are hereby expressly incorporated by reference, in their entirety, into the present application.

BACKGROUND OF THE INVENTION

1. Field of the Invention

The present invention relates to an optical laminate, an organic EL display device, and a foldable device.

2. Description of the Related Art

In recent years, with the spread of thin displays, displays (organic EL display devices) equipped with an organic electroluminescence (EL) panel have been suggested. Further, an organic EL display device that can be used for a foldable device has been suggested, and a polarizing plate (optical laminate) that can be used for such an organic EL display device has also been suggested (for example, WO2016/158300A).

SUMMARY OF THE INVENTION

Under such circumstances, as a result of research on the optical laminate described in WO2016/158300A, the present inventors have clarified that damage such as cracks may occur in a case where the optical laminate is repeatedly bent. That is, it is clarified that repeated bending resistance (also simply referred to as "bending resistance") may be insufficient.

Further, in recent years, as demands for the performance of organic EL display devices have increased, further improvement in performance with respect to optical laminates used in organic EL display devices has been required. In particular, the optical laminates are required to have excellent scratch resistance, have performance that is unlikely to be changed (have excellent durability) even in a case of being exposed to a high-temperature environment, and have a shape that is unlikely to be changed (shape stability) even in a case of being exposed to a high-temperature and high-humidity environment.

In consideration of the above-described circumstances, an object of the present invention is to provide an optical laminate with excellent bending resistance, scratch resistance, durability, and shape stability, an organic. EL display device including the optical laminate, and a foldable device formed of the organic EL display device.

As a result of intensive research conducted by the present inventors in order to solve the above-described problem, it was found that the above-described problem can be solved by using a specific polarizer layer and setting the distance between layers to a predetermined value, thereby completing the present invention.

That is, the present inventors found that the above-described problems can be solved by employing the following configurations.

(1) An optical laminate comprising: a glass plate; a first pressure-sensitive adhesive layer; a polarizer layer; a second pressure-sensitive adhesive layer; and an optically anisotropic layer in this order, in which the glass plate has a thickness of less than 100 µm, the polarizer layer is a polarizer layer formed of a composition for forming a polarizer layer which contains a liquid crystal compound and an organic dichroic material, a distance A between the first pressure-sensitive adhesive layer and the polarizer layer is 10 µm or less, a distance B between the polarizer layer and the second pressure-sensitive adhesive layer is 10 µm or less, in a case where two or more pressure-sensitive adhesive layers are provided between the glass plate and the polarizer layer, the first pressure-sensitive adhesive layer denotes a pressure-sensitive adhesive layer closest to the polarizer layer among the two or more pressure-sensitive adhesive layers provided between the glass plate and the polarizer layer, and in a case where two or more pressure-sensitive adhesive layers are provided between the polarizer layer and the optically anisotropic layer, the second pressure-sensitive adhesive layer denotes a pressure-sensitive adhesive layer closest to the polarizer layer among the two or more pressure-sensitive adhesive layers provided between the polarizer layer and the optically anisotropic layer.

(2) The optical laminate according to (1), in which the first pressure-sensitive adhesive layer is a cohesive adhesive layer.

(3) The optical laminate according to (1) or (2), in which the second pressure-sensitive adhesive layer is an adhesive layer.

(4) The optical laminate according to (3), in which the adhesive layer is an adhesive layer formed of a PVA-based adhesive or a UV adhesive.

(5) The optical laminate according to any one of (1) to (4), in which a functional layer is provided in at least one of between the first pressure-sensitive adhesive layer and the polarizer layer or between the polarizer layer and the second pressure-sensitive adhesive layer.

(6) The optical laminate according to any one of (1) to (5), in which the polarizer layer has a thickness of 10 µm or less.

(7) The optical laminate according to any one of (1) to (6), in which the optically anisotropic layer is formed by being coated with a liquid crystal composition.

(8) The optical laminate according to any one of (1) to (7), in which the first pressure-sensitive adhesive layer has an absorbance of 0.5 or greater at a wavelength of 360 mu and a wavelength of 400 inn.

(9) The optical laminate according to any one of (1) to (8), thither comprising: a UV absorbing layer having an absorbance of 0.5 or greater at a wavelength of 360 nm and a wavelength of 400 run on a side of the glass plate with respect to the polarizer layer.

(10) An organic EL display device comprising: the optical laminate according to any one of (1) to (9).

(11) A foldable device which is formed of the organic EL display device according to (10).

As described below, according to the present invention, it is possible to provide an optical laminate with excellent bending resistance, scratch resistance, durability, and shape stability, an organic EL display device including the optical laminate, and a foldable device formed of the organic EL display device.

DESCRIPTION OF THE PREFERRED EMBODIMENTS

Hereinafter, the present invention will be described in detail.

The description of constituent elements described below may be made based on typical embodiments of the present invention, but the present invention is not limited to such embodiments.

In addition, in the present specification, a numerical range shown using "to" indicates a range including numerical values described before and after "to" as a lower limit and an upper limit.

Further, in the present specification, materials corresponding to respective components may be used alone or in combination of two or more kinds thereof. Here, in a case where two or more kinds of materials corresponding to respective components are used in combination, the content of the components indicates the total content of the combined materials unless otherwise specified.

Further, in the present specification, "(meth)acrylate" is a notation representing "acrylate" or "methacrylate", "(meth) acryl" is a notation representing "acryl" or "methacryl", and "(meth)acryloyl" is a notation representing "acryloyl" or "methacryloyl".

[I] Optical Laminate

An optical laminate according to the embodiment of the present invention (hereinafter, also referred to as a "laminate according to the embodiment of the present invention") includes a glass plate, a first pressure-sensitive adhesive layer, a polarizer layer, a second pressure-sensitive adhesive layer, and an optically anisotropic layer in this order, in which the glass plate has a thickness of less than 100 µm, the polarizer layer is a polarizer layer formed of a composition for forming a polarizer layer which contains a liquid crystal compound and an organic dichroic material, a distance A between the first pressure-sensitive adhesive layer and the polarizer layer is 10 µm or less, and a distance B between the polarizer layer and the second pressure-sensitive adhesive layer is 10 µm or less.

Here, in a case where two or more pressure-sensitive adhesive layers are provided between the glass plate and the polarizer layer, the first pressure-sensitive adhesive layer denotes a pressure-sensitive adhesive layer closest to the polarizer layer among the two or more pressure-sensitive adhesive layers provided between the glass plate and the polarizer layer, and in a case where two or more pressure-sensitive adhesive layers are provided between the polarizer layer and the optically anisotropic layer, the second pressure-sensitive adhesive layer denotes a pressure-sensitive adhesive layer closest to the polarizer layer among the two or more pressure-sensitive adhesive layers provided between the polarizer layer and the optically anisotropic layer.

First, the laminate according to the embodiment of the present invention will be described with reference to the accompanying drawings.

Figure 1:
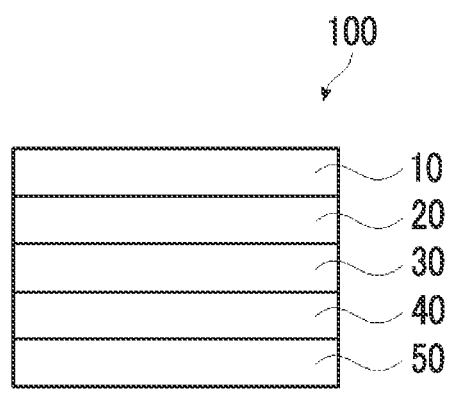
FIG. 1 is a schematic cross-sectional view showing an example of a laminate of the present invention.

FIG. 1 is a schematic cross-sectional view showing an example of the laminate according to the embodiment of the present invention.

An optical laminate 100 shown in FIG. 1 includes a glass plate 10, a first pressure-sensitive adhesive layer 20, a polarizer layer 30, a second pressure-sensitive adhesive layer 40, and a λ/4 plate 50 (optically anisotropic layer) in order.

Here, the glass plate 10 has a thickness of less than 100 µm.

Further, the polarizer layer 30 is a polarizer layer (specific polarizer layer) formed of a composition for forming a polarizer layer which contains a liquid crystal compound and an organic dichroic material.

Further, the distance A between the first pressure-sensitive adhesive layer 20 and the polarizer layer 30 is 10 µm or less.

Further, the distance B between the polarizer layer 30 and the second pressure-sensitive adhesive layer 40 is 10 µm or less.

Figure 2:
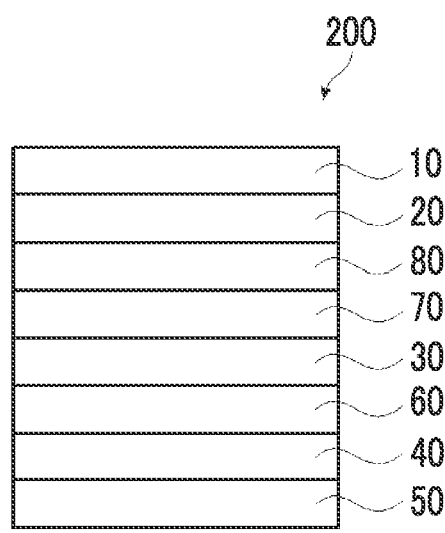
FIG. 2 is a schematic cross-sectional view showing an example of a laminate of the present invention.

FIG. 2 is a schematic cross-sectional view showing another example of the laminate according to the embodiment of the present invention.

An optical laminate 200 shown in FIG. 2 includes the glass plate 10, the first pressure-sensitive adhesive layer 20, an oxygen blocking layer 80, a cured layer 70, the polarizer layer 30, a photo-alignment layer 60, the second pressure-sensitive adhesive layer 40, and the λ/4 plate 50 (optically anisotropic layer) in order.

Here, the glass plate 10 has a thickness of less than 100 µm.

Further, the polarizer layer 30 is a polarizer layer (specific polarizer layer) formed of a composition for forming a polarizer layer which contains a liquid crystal compound and an organic dichroic material.

Further, the distance A between the first pressure-sensitive adhesive layer 20 and the polarizer layer 30 is 10 µm or less.

Further, the distance B between the polarizer layer 30 and the second pressure-sensitive adhesive layer 40 is 10 µm or less.

Hereinafter, each layer of the laminate according to the embodiment of the present invention will be described.

[1] Glass Plate

As described above, the laminate according to the embodiment of the present invention includes a glass plate.

The thickness of the glass plate is less than 100 µm.

Hereinafter, the glass plate having a thickness of less than 100 µm is also referred to as a "specific glass plate".

The material of the specific glass plate is not particularly limited, but according to the classification based on the composition, examples thereof include soda-lime glass, borosilicate glass, aluminosilicate glass, and quartz glass. Further, according to the classification based on alkaline components, examples thereof include non-alkali glass and low-alkali glass,

[Thickness of Glass Plate]

As described above, the thickness of the specific glass plate is less than 100 µm. From the viewpoint that the effects of the present invention are more excellent, the thickness thereof is preferably 80 µm or less and more preferably 60 µM or less. The lower limit of the thickness of the specific glass plate is not particularly limited, but is preferably 10 µm or greater, more preferably 20 µm or greater, and still more preferably 30 µm or greater from the viewpoint that the effects of the present invention are more excellent.

The specific glass plate has a minimum bending diameter of preferably 2 mmφ or less. Here, the minimum bending diameter denotes the minimum radius that enables bending without causing damage.

[2] First Pressure-Sensitive Adhesive Layer

As described above, the laminate according to the embodiment of the present invention includes a first pressure-sensitive adhesive layer.

In the present specification, the pressure-sensitive adhesive layer is a cohesive adhesive layer or an adhesive layer.

In a case where two or more pressure-sensitive adhesive layers are provided between the glass plate described above and the specific polarizer layer described below, the first pressure-sensitive adhesive layer is a pressure-sensitive adhesive layer closest to the specific polarizer layer among the two or more pressure-sensitive adhesive layers.

From the viewpoint that the effects of the present invention are more excellent, it is preferable that the first pressure-sensitive adhesive layer is a cohesive adhesive layer.

Examples of the pressure-sensitive adhesive contained in the cohesive adhesive layer include a rubber-based pressure-sensitive adhesive, an acrylic pressure-sensitive adhesive, a silicone-based pressure-sensitive adhesive, a urethane-based pressure-sensitive adhesive, a vinyl alkyl ether-based pressure-sensitive adhesive, a polyvinyl alcohol-based pressure-sensitive adhesive, a polyvinylpyrrolidone-based pressure-sensitive adhesive, a polyacrylamide-based pressure-sensitive adhesive, and a cellulose-based pressure-sensitive adhesive.

Among these, an acrylic pressure-sensitive adhesive (pressure-sensitive adhesive) is preferable from the viewpoints of the transparency, the weather resistance, the heat resistance, and the like.

From the viewpoint at the effects of the present invention are more excellent, the first pressure-sensitive adhesive layer has an absorbance of 0.5 or greater at a wavelength of 360 nm and a wavelength of 400 nm. Examples of a method of forming such a layer include a method of blending an ultraviolet absorbing agent.

[Thickness of the First Pressure-Sensitive Adhesive Layer]

The thickness of the first pressure-sensitive adhesive layer is not particularly limited, but is preferably in a range of 1 to 500 µm, more preferably in a range of 10 to 400 µm, and still more preferably in a range of 100 to 300 µm from the viewpoint that the effects of the present invention are more excellent.

[3] Polarizer Layer

As described above, the laminate according to the embodiment of the present invention includes a polarizer layer.

Here, the polarizer layer is a polarizer layer (hereinafter, also referred to as a "specific polarizer layer") formed of a composition for forming a polarizer layer which contains a liquid crystal compound and an organic dichroic material. From the viewpoint that the effects of the present invention are more excellent, it is preferable that the specific polarizer layer does not contain iodine.

Suitable Embodiment

It is preferable that the specific polarizer layer is a polarizer layer formed by being coated with a liquid crystal composition containing an organic dichroic material (hereinafter, also simply referred to as a "dichroic material") and a polymer liquid crystal compound. Hereinafter, the present embodiment will be described.

[Liquid Crystal Composition]

First, the components contained in the liquid crystal composition will be describe.

<Polymer Liquid Crystal Compound>

The liquid crystal composition used for forming the specific polarizer layer contains a polymer liquid crystal compound. Since the composition contains a polymer liquid crystal compound, the dichroic materials can be aligned with a high degree of alignment while the precipitation of the dichroic materials is suppressed.

Here, the "polymer liquid crystal compound" is a liquid crystal compound having a repeating unit in the chemical structure. The liquid crystal compound in the present invention is a liquid crystal compound that does not exhibit dichroism.

Examples of the polymer liquid crystal compound include thermotropic liquid crystal polymers described in JP2011-237513A. Further, the polymer liquid crystal compound may contain a crosslinkable group (such as an acryloyl group or a methacryloyl group) at a terminal.

The polymer liquid crystal compound may be used alone or in combination of two or more kinds thereof.

In a case where the liquid crystal composition contains a polymer liquid crystal compound, the content of the polymer liquid crystal compound is preferably in a range of 75% to 95% by mass, more preferably in a range of 75% to 90% by mass, and still more preferably in a range of 80% to 90% by mass in terms of the solid content ratio. In a case where the content of the polymer liquid crystal compound is in the above-described range, the degree of alignment of the specific polarizer layer is further improved.

(Repeating Unit Represented by Formula (1))

It is preferable that the liquid crystal composition contains a polymer liquid crystal compound having a repeating unit represented by Formula (1) as the structure of the polymer liquid crystal compound.

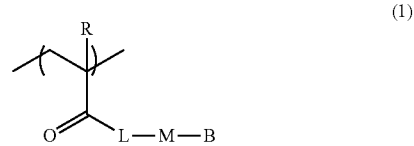

(1)

Here, in Formula (1), R represents a hydrogen atom or a methyl group.

L represents a single bond or a divalent linking group.

B represents a hydrogen atom, a halogen atom, a cyano group, an alkyl group, an alkoxy group, an amino group, an oxycarbonyl group, an acyloxy group, an acylamino group, are alkoxycarbonylamino group, a sulfonylamino group, a sulfamoyl group, a carbamoyl group, an alkylthio group, a sulfonyl group, a sulfinyl group, or a ureido group.

M represents a mesogen group represented by Formula (1-1).

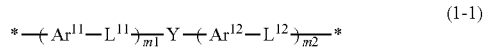

(1-1)

Here, in Formula (1-1), $Ar^{11}$ and $Ar^{12}$ each independently represent a phenylene group or biphenylene group which may have a substituent.

$L^{11}$ and $L^{12}$ each independently represent a single bond or a divalent linking group containing no azo group.

Y represents an imino group, a —OCO—CH=CH— group, or a —CH=CH—CO$_2$— group.

m1 and m2 each independently represent an integer of 1 to 3.

In a case where nil represents an integer of 2 or 3, a plurality of $Ar^{11}$'s may be the same as or different from each other, and a plurality of $L^{11}$'s may be the same as or different from each other.

In a case where m2 represents an integer of 2 or 3, a plurality of $Ar^{12}$'s may be the same as or different from each other, and a plurality of $L^{12}$'s may be the same as or different from each other.

Next, the divalent linking group represented by L in Formula (1) will be described.

Examples of the divalent linking group includes —O—, —S—, —COO—, —OCO—, —O—CO—O—, —$NR^N$CO—, —$CONR^N$—, an alkylene group, and a divalent group formed by combining two or more of these groups. Further, $R^N$ represents a hydrogen atom or an alkyl group.

Among these, a divalent group formed by combining one or more groups selected from the group consisting of —O—, —COO—, and —OCO— with an alkylene group is preferable.

Further, the number of carbon atoms of the alkylene group is preferably in a range of 2 to 16.

The mesogen group represented by Formula (1-1), which is represented by M in Formula (I) will be described below. Further, in Formula (1-1), * represents a bonding position with respect to L or B in Formula (1).

In Formula (1-1), $Ar^{11}$ and $Ar^{12}$ each independently represent a phenylene group or a biphenylene group which may have a substituent.

Here, the substituent is not particularly limited, and examples thereof include a halogen atom, an alkyl group, an alkyloxy group, an alkylthio group, an oxycarbonyl group, a thioalkyl group, an acyloxy group, an acylamino group, an alkoxycarbonylamino group, a sulfonylamino group, a sulfamoyl group, a carbamoyl group, a sulfinyl group, and a ureido group.

In Formula (1-1), $L^{11}$ and $L^{12}$ each independently represent a single bond or a divalent linking group containing no azo group.

Here, examples of the divalent linking group include —O—, —S—, —COO—, —OCO—, —O—CO—O—, —$NR^N$CO—, —$CONR^N$—, an alkylene group, and a divalent group formed by combining two or more of these groups. Further, $R^N$ represents a hydrogen atom or an alkyl group.

In Formula (1-1), Y represents an amino group, a —OCO—CH=CH— group, or a —CH=CH—$CO_2$— group.

In Formula (1-1), m1 and m2 each independently represent an integer of 1 to 3.

Here, m1+m2 is preferably an integer of 2 to 5 and more preferably an integer of 2 to 4.

B in Formula (1) will be described.

B represents a hydrogen atom, a halogen atom, a cyano group, an alkyl group, an alkoxy group, an amino group, an oxycarbonyl group, an alkoxycarbonyl group, an acyloxy group, a (poly)alkyleneoxy group, an acylamino group, an alkoxycarbonylamino group, a sulfonylamino group, a sulfamoyl group, a carbamoyl group, an alkylthio group, a sulfonyl group, a sulfinyl group, or a ureido group.

Among these, from the viewpoint of adjusting the phase transition temperature and from the viewpoint of the solubility, a cyano group, an alkyl group, an alkoxy group, an oxycarbonyl group, an alkoxycarbonyl group, a (poly)alkyleneoxy group, or an alkylthio group is preferable, and an alkyl group, an alkoxy group, or a (poly)alkyleneoxy group is more preferable.

Further, among the examples as B, the alkyl group and the like other than the hydrogen atom, the halogen atom, and the cyano group has preferably 1 to 20 carbon atoms and more preferably 1 to 11 carbon atoms from the viewpoint of adjusting the phase transition temperature and from the viewpoint of the solubility.

A case where B in Formula (1) represents a crosslinkable group will be described.

Examples of the crosslinkable group include the polymerizable groups described in paragraphs [0040] to [0050] of JP2010-244038A. Among these, from the viewpoints of the reactivity and the synthetic suitability, a radically polymerizable groups is preferable, an acryloyl group, a methacryloyl group, an epoxy group, an oxetanyl group, or a styryl group is more preferable, and an acryloyl group or a methacryloyl group (hereinafter, also referred to as a "(meth)acryloyl group") is still more preferable.

The polymer liquid crystal compound may exhibit nematic or smectic crystallinity; but it is preferable that the polymer liquid crystal compound exhibits at least the nematic liquid crystallinity.

The temperature at which the nematic phase is exhibited is preferably in a range of room temperature (23° C.) to 300° C., and more preferably in a range of 50° C. to 200° C. from the viewpoints of handleability and manufacturing suitability.

Further, in the present invention, the weight-average-molecular weight (Mw) of the polymer liquid crystal compound is preferably in a range of 1000 to 100000 and more preferably in a range of 2000 to 60000. Further, the number average molecular weight (Mn) thereof is preferably in a range of 500 to 80000 and more preferably in a range of 1000 to 30000.

Here, the weight-average molecular weight and the number average molecular weight in the present invention are values measured according to gel permeation chromatography (GPC).

Solvent (eluent): tetrahydrofuran

Equipment name: TOSOH HLC-8220GPC

Column: Connect and use three of TOSOH TSKgel Super HZM-H (4.6 mm×15 cm)

Column temperature: 25° C.

Sample concentration: 0.1% by mass

Flow rate: 0.35 ml/min

Calibration curve: TSK standard polystyrene (manufactured by TOSOH Corporation), calibration curves of 7 samples with Mw of 2800000 to 1050 (Mw/Mn=1.03 to 1.06) are used.

In the present invention, from the viewpoint that the absorption in a visible light region is small and the alignment of the dichroic material in the visible light region is more likely to be maintained, the maximum absorption wavelength of the polymer liquid crystal compound is preferably 380 nm or less.

Further, in the present invention, from the viewpoint of further improving the dichroic ratio of the specific polarizer layer, the number of benzene rings contained in the mesogen group of the polymer liquid crystal compound is preferably 3 or more.

Specific examples of the polymer liquid crystal compound having a repeating unit represented by Formula (1) include a polymer liquid crystal compound represented by any of the following structural formulae. In the following structural formulae, R represents a hydrogen atom or a methyl group.

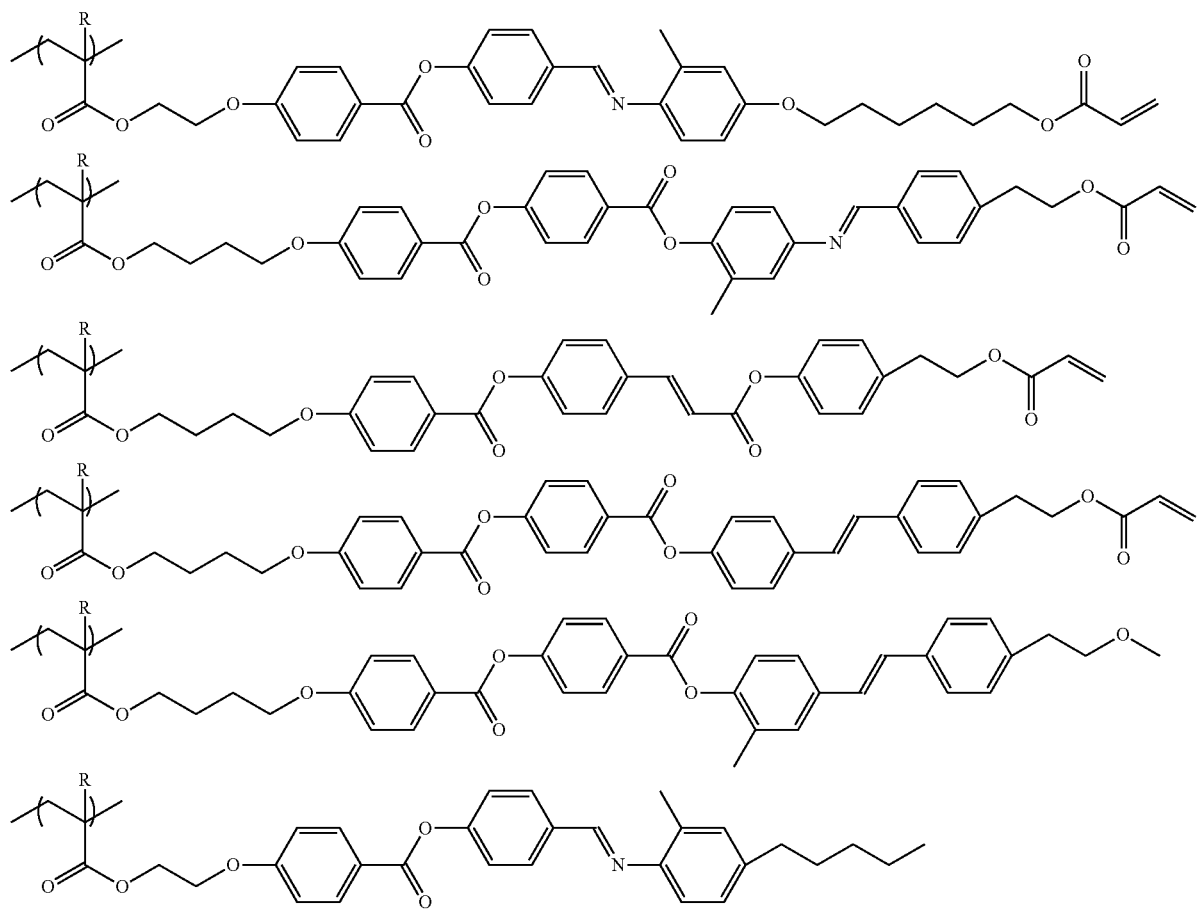

(Repeating Unit Represented by Formula (2))

As a more preferable polymer liquid crystal compound in the present invention, it is preferable that the liquid crystal composition contains a polymer liquid crystal compound having a repeating unit represented by Formula (2). In Formula (2), a difference between the log P value of P1 (hereinafter, also referred to as a "main chain"), L1, and SP1 (hereinafter, also referred to as a "spacer group") and the log P value of M1 (hereinafter, also referred to as a "mesogen group") is 4 or greater.

A specific polarizer layer with a high degree of alignment can be formed by using the above-described polymer liquid crystal compound. The details of the reason for this are not clear, but it is assumed as follows.

The log P value is an index expressing the hydrophilicity and the hydrophobicity of a chemical structure. The repeating unit represented by Formula. (2) is in a state in which the compatibility between the mesogen group and the structure from the main chain to the spacer group is low because the log P value of the main chain, L1, and the spacer group and the log value of the mesogen group are separated by a predetermined value or greater. In this manner, it is assumed that since the crystallinity of the polymer liquid crystal compound increases, the degree of alignment of the polymer liquid crystal compound increases. As described above, it is assumed that in a case where the degree of alignment of the polymer liquid crystal compound is high, the compatibility between the polymer liquid crystal compound and the dichroic material is decreased (that is, the crystallinity of the dichroic material is improved), and thus the degree of alignment of the dichroic material is improved. As a result, the degree of alignment of the specific polarizer layer to be obtained is considered to increase.

The preferable polymer liquid crystal compound in the present invention has a repeating unit represented by Formula (2) (in the present specification, also referred to as a "repeating unit (2)"). Further, in the repeating unit (2), the difference between the log P value of P1, L1, and SP1 and the log P value of M1 is 4 or greater.

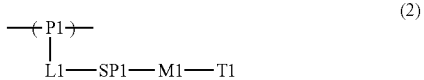

(2)

In Formula (2), P1 represents the main chain of the repeating unit, L1 represents a single bond or a divalent linking group, SP1 represents a spacer group, M1 represents a mesogen group, and T1 represents a terminal group.

Here, in a case where M1 contains a linking group, M1 does not contain an azo group as the linking group.

Specific examples of the main chain of the repeating unit represented by P1 include groups represented by Formulae (P1-A) to (P1-D). Among these, from the viewpoints of diversity and handleability of a monomer serving as a raw material, a group represented by Formula (P1-A) is preferable.

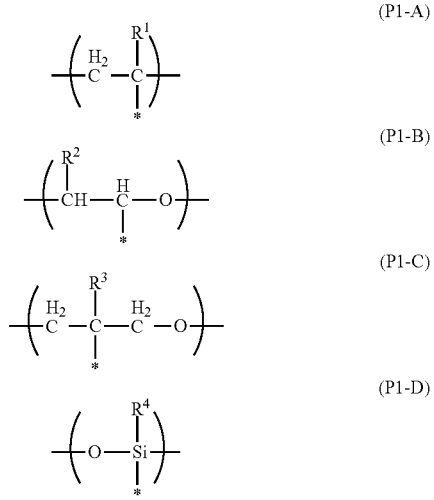

in Formulae (P1-A) to (P1-D), "*" represents a bonding position with respect to L1 in Formula (2).

In Formulae (P1-A) to (P1-D), $R^1$, $R^2$, $R^3$, and $R^4$ each independently represent a hydrogen atom, a halogen atom, an alkyl group having 1 to 10 carbon atoms, or an alkoxy group having 1 to 10 carbon atoms. The alkyl group may be a linear or branched alkyl group or an alkyl group having a cyclic structure (cycloalkyl group). Further, the number of carbon atoms of the alkyl group is preferably in a range of 1 to 5.

It is preferable that the group represented by Formula (P1-A) is a unit of a partial structure of poly(meth)acrylic acid ester obtained by polymerization of (meth)acrylic acid ester.

It is preferable that the group represented by Formula (P1-B) is an ethylene glycol unit formed by ring-opening polymerization of an epoxy group of a compound containing the epoxy group.

It is preferable that the group represented by Formula (P1-C) is a propylene glycol unit formed by ring-opening polymerization of an oxetane group of a compound containing the oxetane group.

It is preferable that the group represented by Formula, (P1-D) is a siloxane unit of a polysiloxane obtained by polycondensation of a compound containing at least one of an alkoxysilyl group or a silanol group. Here, examples of the compound containing at least one of an alkoxysilyl group or a silanol group include a compound containing a group represented by Formula $SiR^4(OR^5)_2$—. In the formula, $R^4$ has the same definition as that for $R^4$ in (P1-D), and a plurality of $R^5$'s each independently represent a hydrogen atom or an alkyl group having 1 to 10 carbon atoms.

$L^1$ represents a single bond or a divalent linking group.

Examples of the divalent linking group represented by L1 include —C(O)O—, —OC(O)—, —O—, —S—, —C(O)NR³—, —NR³C(O)—, —SO₂—, and —NR³R⁴—. In the formulae, $R^3$ and $R^4$ each independently represent a hydrogen atom or an alkyl group having 1 to 6 carbon atoms which may have a substituent.

In a case where P1 represents a group represented by Formula (P1-A), it is preferable that L1 represents a group represented by —C(O)O—.

In a case where P1 represents a group represented by any of Formulae (P1-B) to (P1-1)), it is preferable that L1 represents a single bond.

From the viewpoints of easily exhibiting liquid crystallinity and the availability of raw materials, it is preferable that the spacer group represented by SP1 has at least one structure selected from the group consisting of an oxyethylene structure, an oxypropylene structure, a polysiloxane structure, and an alkylene fluoride structure.

Here, as the oxyethylene structure represented by SP1, a group represented by *—$(CH_2—CH_2O)_{n1}$—* is preferable. In the formula, n1 represents an integer of 1 to 20, and "*" represents a bonding position with respect to L1 or M1.

Here, a group represented by *—$(CH(CH_3)—CH_2O)_{n2}$—* is preferable as the oxypropylene structure represented by SP1. In the formula, n2 represents an integer of 1 to 3, and "*" represents a bonding position with respect to L1 or M1.

Further, a group represented by *—$(Si(CH_3)_2—O)_{n3}$—* is preferable as the polysiloxane structure represented by SP1 the formula, n3 represents an integer of 6 to 10, and "*" represents a bonding position with respect to L1 or M1.

Further, a group represented by *—$(CF_2—CF_2)_{n4}$—* is preferable as the alkylene fluoride structure represented by SP1. In the formula, n4 represents an integer of 6 to 10, and "*" represents a bonding position with respect to L1 or M1.

The mesogen group represented by M1 is a group showing a main skeleton of a liquid crystal molecule that contributes to liquid crystal formation. A liquid crystal molecule exhibits liquid crystallinity which is in an intermediate state (mesophase) between a crystal state and an isotropic liquid state. The mesogen group is not particularly limited and for example, particularly description on pages 7 to 16 of "FlussigeKristalle in Tabellen II" (VEB Deutsche Verlag fur Grundstoff Industrie, Leipzig, 1984) and particularly the description in Chapter 3 of "Liquid Crystal Handbook" (Maruzen, 2000) edited by Liquid Crystals Handbook Editing Committee can be referred to.

As the mesogen group, for example, a group having at least one cyclic structure selected from the group consisting of an aromatic hydrocarbon group, a heterocyclic group, and an alicyclic group is preferable.

As the mesogen group, a group represented by Formula (M1-A) or Formula (M1-B) is preferable from the viewpoints of exhibiting the liquid crystallinity, adjusting the liquid crystal phase transition temperature, and the availability of raw materials and synthetic suitability.

(M1-A)

(M1-B)

hi Formula (M1-A), A1 represents a divalent group selected from the group consisting of an aromatic hydrocarbon group, a heterocyclic group, and an alicyclic group. These groups may be substituted with a substituent such as an alkyl group, a fluorinated alkyl group, or an alkoxy group.

It is preferable that the divalent group represented by A1 is a 4- to 6-membered ring. Further, the divalent group represented by A1 may be a monocycle or a fused ring.

Further, "*" represents a bonding position with respect to SP1 or T1.

Examples of the divalent aromatic hydrocarbon group represented by A1 include a phenylene group, a naphthylene group, a fluorene-diyl group, an anthracene-diyl group, and a tetracene-diyl group. From the viewpoints of design diversity of a mesogenic skeleton and the availability of raw materials, a phenylene group or a naphthylene group is preferable, and a phenylene group is more preferable.

The divalent heterocyclic group represented by A1 may be any of aromatic or non-aromatic, but a divalent aromatic heterocyclic group is preferable as the divalent heterocyclic group from the viewpoint of further improving the degree of alignment.

The atoms other than carbon constituting the divalent aromatic heterocyclic group include a nitrogen atom, a sulfur atom, and an oxygen atom. In a case where the aromatic heterocyclic group has a plurality of atoms constituting a ring other than carbon, these may be the same as or different from each other.

Specific examples of the divalent aromatic heterocyclic group include a pyridylene group (pyridine-diyl group), a pyridazine-diyl group, an imidazole-diyl group, a thienylene group (thiophene-diyl group), a quinolylene group (quinoline-diyl group), an isoquinolylene group (isoquinoline-diyl group), an oxazole-diyl group, a thiazole-diyl group, an oxadiazole-diyl group, a benzothiazole-diyl group, a benzothiadiazole-diyl group, a phthalimido-diyl group, a thienothiazole-diyl group, a thiazolothiazole-diyl group, a thienothiophene-diyl group, and a thienooxazole-diyl group.

Specific examples of the divalent alicyclic group represented by A1 include a cyclopentylene group and a cyclohexylene group.

In Formula (M1-A), a1 represents an integer of 1 to 10. In a ease where a1 represents 2 or greater, a plurality of A1's may be the same as or different from each other.

In Formula (M1-B), A2 and A3 each independently represent a divalent group selected from the group consisting of an aromatic hydrocarbon group, a heterocyclic group, and an alicyclic group. Specific examples and preferred embodiments of A2 and A3 are the same as those for A1 in Formula (M1-A), and thus description thereof will not be repeated.

In Formula (M1-B), a2 represents an integer of 1 to 10. In a case where a2 represents 2 or greater, a plurality of A2's may be the same as or different from each other, a plurality of A3's may be the same as or different from each other, and a plurality of LA1's may be the same as or different from each other.

In Formula (M1-B), in a case where a2 represents 1, LA1 represents a divalent liming group. In a case where a2 represents 2 or greater, a plurality of LA1's each independently represent a single bond or a divalent linking group, and at least one of the plurality of LA1's is a divalent linking group.

In Formula (M1-B), examples of the divalent linking group represented by LA1 include —O—, —(CH$_2$)$_g$—, —(CF$_2$)$_g$—, —Si(CH$_3$)$_2$—, —(Si(CH$_3$)$_2$O)$_g$—, —(OSi(CH$_3$)$_2$)$_g$— (g represents an integer of 1 to 10), —N(Z)—, —C(Z)=C(Z')—, —C(Z)=N—, —N=C(Z)—, —C(Z)$_2$—C(Z')$_2$—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)=C(Z')—, —C(Z)=C(Z$^2$)—C(O)—S—, —S—C(O)—C(Z)=C(Z')— (Z, Z', and Z" each independently represent a hydrogen atom, an alkyl group having 1 to 4 carbon atoms, a cycloalkyl group, an aryl group, a cyano group, or a halogen atom), —C≡C—, —S—, —S(O)—, —S(O)(O)—, —(O)S(O)O—, —O(O)S(O)O—, —SC(O)—, and —C(O)S—. LA1 may represent a group obtained by combining two or more of these groups.

Further, in a case where the divalent linking group represented by LA1 contains an azo group, the absorption in the visible light region is high, which is not preferable.

Specific examples of M1 include the following structures. In the following specific examples, "Ac" represents an acetyl group.

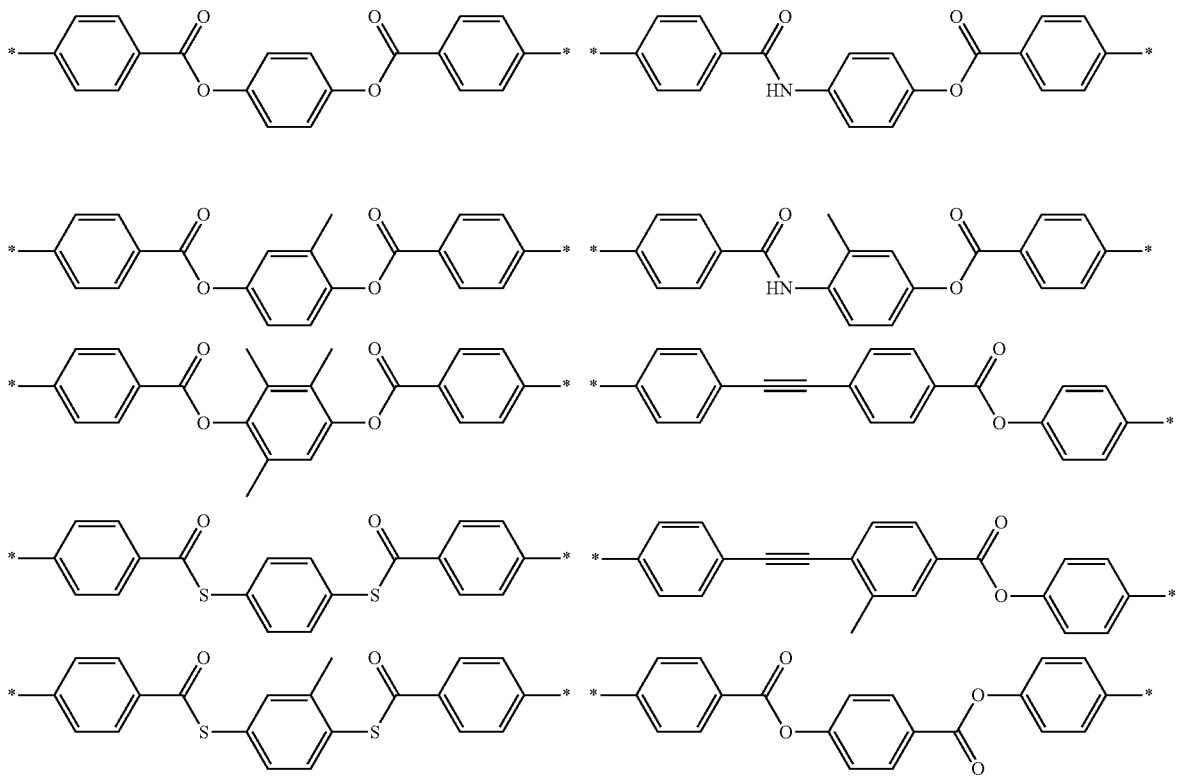

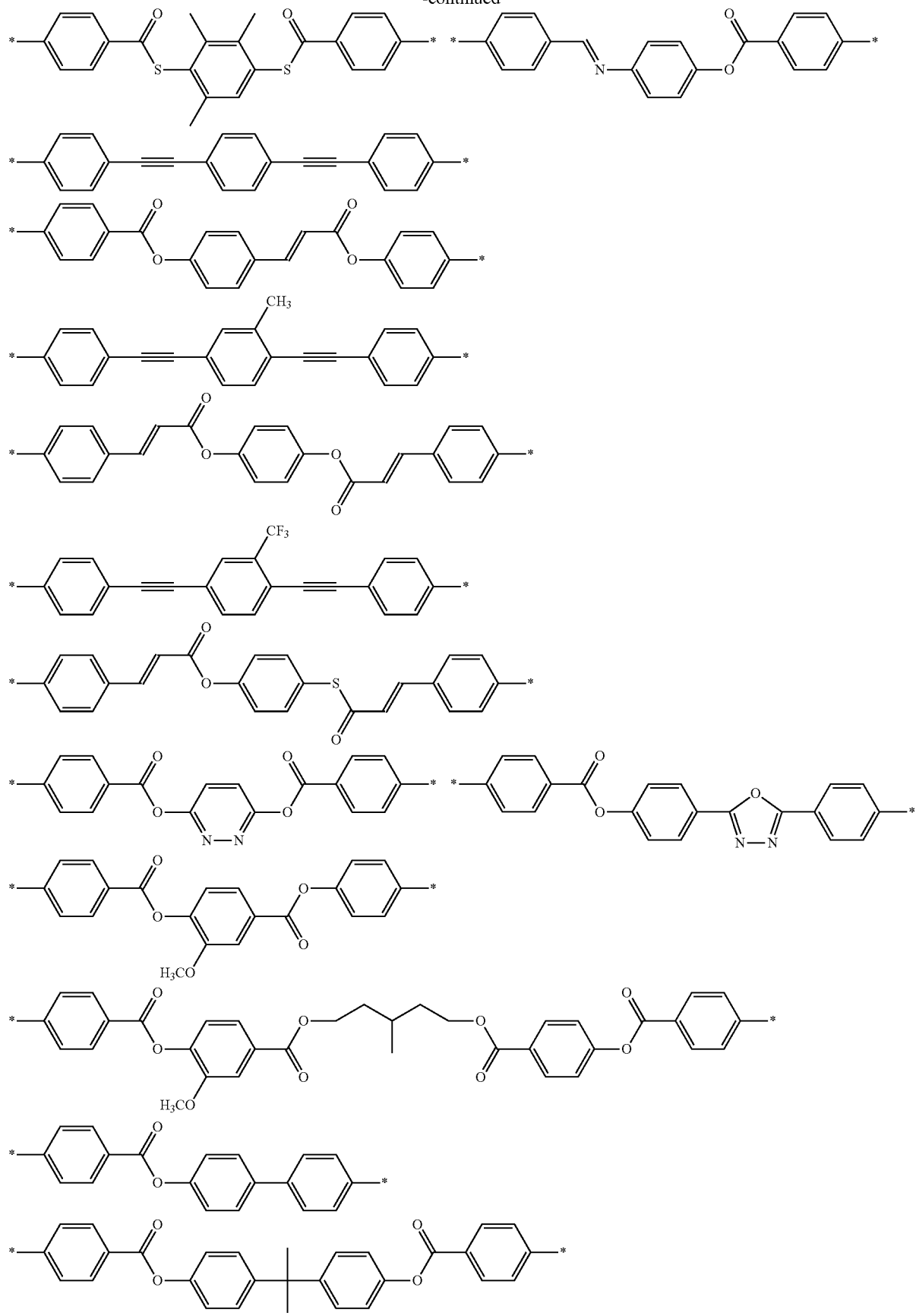
-continued

-continued
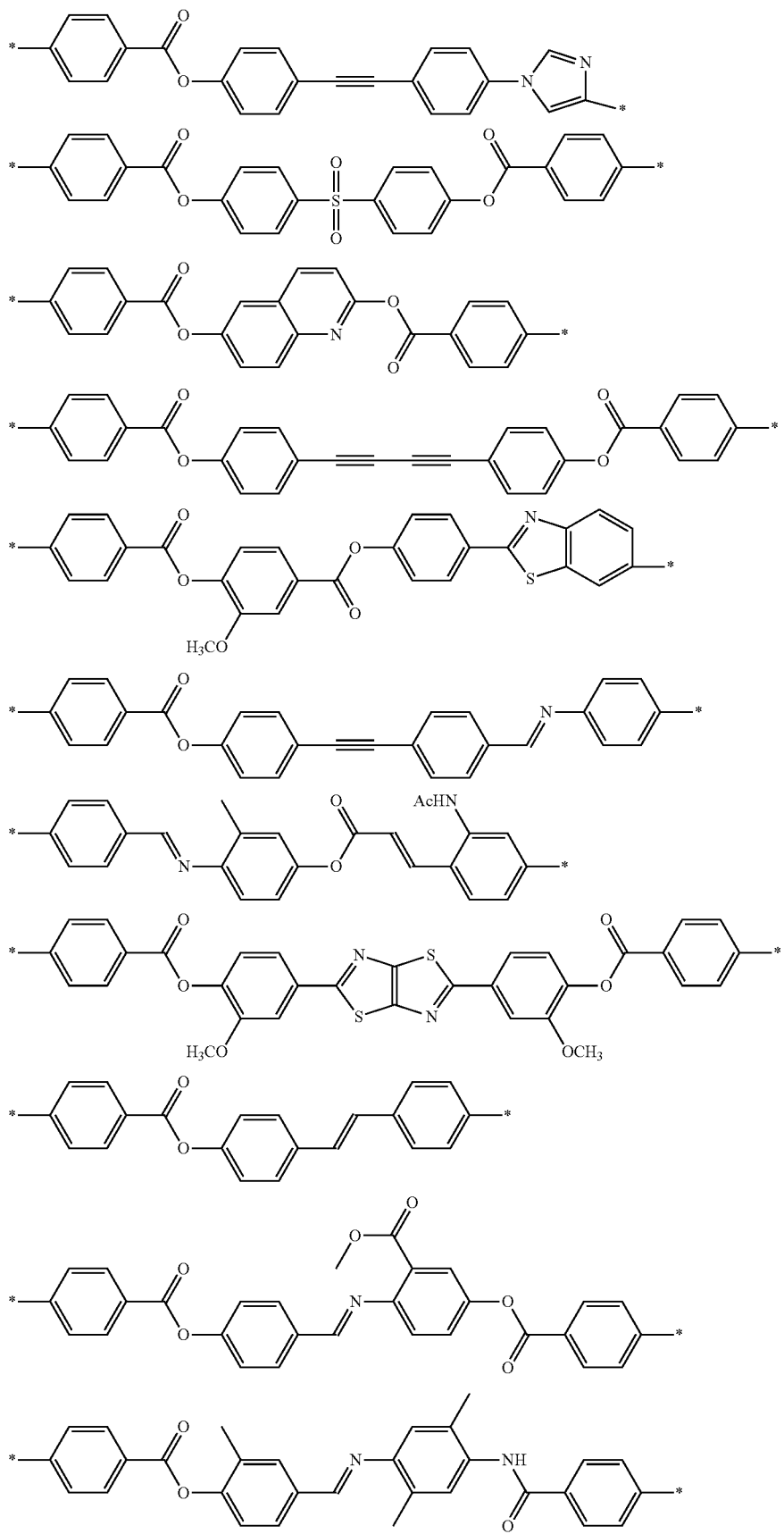

-continued

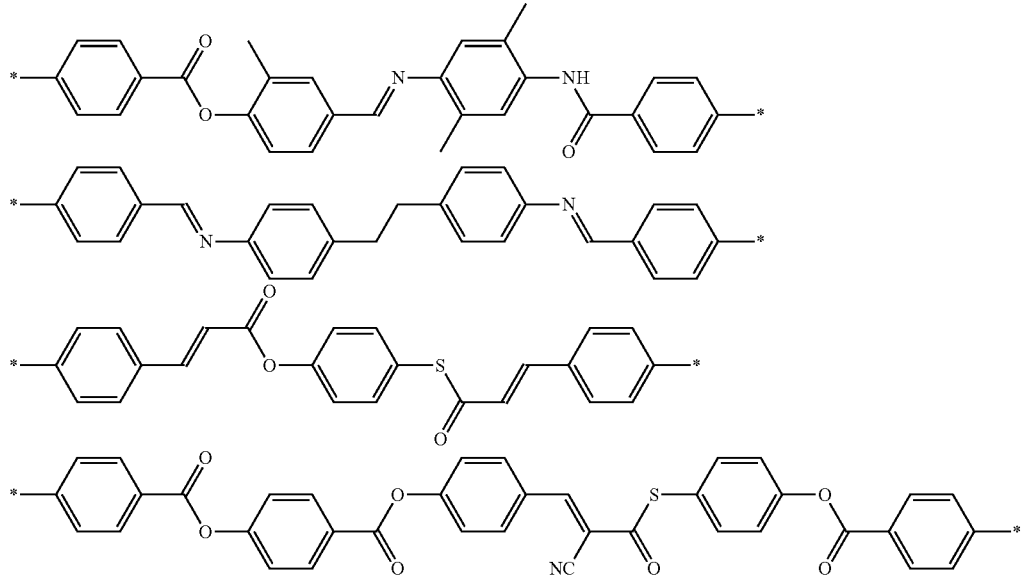

Examples of the terminal group represented by T1 include a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an oxycarbonyl group having 1 to 10 carbon atoms, an acyloxy group having 1 to 10 carbon atoms, an acylamino group having 1 to 10 carbon atoms, an alkoxycarbonyl group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, and a ureido group having 1 to 10 carbon atoms. These terminal groups may be further substituted with these groups or the polymerizable groups described in JP2010-244038A.

The number of atoms in the main chain of T1 is preferably in a range of 1 to 20, more preferably in a range of 1 to 15, still more preferably in a range of 1 to 10, and particularly preferably in a range of 1 to 7. In a case where the number of atoms in the main chain of T1 is 20 or less, the degree of alignment of the specific polarizer layer is further improved. Here, the "main chain" in T1 indicates the longest molecular chain bonded to M1, and the number of hydrogen atoms is not included in the number of atoms in the main chain of T1. For example, the number of atoms in the main chain is 4 in a case where T1 represents an n-butyl group, the number of atoms in the main chain is 3 in a case where T1 represents a sec-butyl group.

The content of the repeating unit (2) is preferably in a range of 20% to 100% by mass, more preferably in a range of 30% to 99.9% by mass, and still more preferably in a range of 40% to 99.0% by mass with respect to 100% by mass of all the repeating units of the polymer liquid crystal compound.

In the present invention, the content of each repeating unit contained in the polymer liquid crystal compound is calculated based on the charged amount (mass) of each monomer used for obtaining each repeating unit.

The polymer liquid crystal compound may have only one or two or more kinds of repeating units (2). In a case where the polymer liquid crystal compound has two or more kinds of repeating units (2), there is an advantage in that the solubility of the polymer liquid crystal compound in a solvent is improved and the liquid crystal phase transition temperature is easily adjusted. In a case where the polymer liquid crystal compound has two or more kinds of repeating units (2), it is preferable that the total amount thereof is in the above-described range.

In the case where the polymer liquid crystal compound has two or more kinds of repeating units (2), a repeating unit (2) that does not contain a polymerizable group in T1 and a repeating unit (2) that contains a polymerizable group in T1 may be used in combination. In this manner, the curability of the specific polarizer layer is further improved.

In this case, the ratio (repeating unit (2) containing polymerizable group in T1/repeating unit (2) containing no polymerizable group in T1) of the repeating unit (2) containing a polymerizable group in T1 to the repeating unit (2) containing no polymerizable group in T1 in the polymer liquid crystal compound is preferably in a range of 0.005 to 4 and more preferably in a range of 0.01 to 2.4 in terms of mass ratio. In a case where the mass ratio thereof is 4 or less, there is an advantage that the degree of alignment is excellent. In a case where the mass ratio thereof is 0.05 or greater, the curability of the specific polarizer layer is further improved.

In Formula (2), a difference ($|\log P_1 - \log P_2|$) between the log P value of P1, L1, and SP1 (hereinafter, also referred to as "log $P_1$") and the log P value of M1 (hereinafter, also referred to as "log $P_2$") is 4 or greater. Further, from the viewpoint of further improving the degree of alignment of the specific polarizer layer, the difference thereof is preferably 4.25 or greater and more preferably 4.5 or greater.

Further, from the viewpoints of adjusting the liquid crystal phase transition temperature and the synthetic suitability, the upper limit of the difference is preferably 15 or less, more preferably 12 or less, and still more preferably 10 or less.

Here, the log P value is an index for expressing the properties of the hydrophilicity and hydrophobicity of a chemical structure and is also referred to as a hydrophilichydrophobic parameter. The log P value can be calculated using software such as ChemBioDrawUltra or HSPiP (Ver. 4.1.07). Further, the logP value can be acquired experimentally by the method of the OECD Guidelines for the Testing of Chemicals, Sections 1, Test No. 117 or the like. In the present invention, a value calculated by inputting the structural formula of a compound to HSPiP (Ver. 4.1.07) is employed as the log P value unless otherwise specified.

The log $P_1$ indicates the log P value of P1, L1, and SP1 as described above. The "log P value of P1, L1, and SP1" indicates the log P value of a structure in which P1, L1, and SP1 are integrated and is not the sum of the log P values of P1, L1, and SP1. Specifically, the log $P_1$ is calculated by inputting a series of structural formulae of P1 to SP1 in Formula (1) into the above-described software.

In the calculation of the log $P_1$, in regard to the part of the group represented by P1 in the series of structural formulae of P1 to SP1, the structure of the group itself represented by P1 (for example, Formulae (P1-A) to (P1-D) described above) may be used or a structure of a group that can be P1 after polymerization of a monomer used to obtain the repeating unit represented by Formula (2) may be used.

Here, specific examples of the latter (the group that can be P1) are as follows. In a case where P1 is obtained by polymerization of (meth)acrylic acid ester, P1 represents a group represented by $CH_2=C(R^1)-$ ($R^1$ represents a hydrogen atom or a methyl group). Further, P1 represents ethylene glycol in a case where P1 is obtained by polymerization of ethylene glycol, and P1 represents propylene glycol in a case where P1 is obtained by polymerization of propylene glycol. Further, in a case where P1 is obtained by polycondensation silanol, P1 represents silanol (a compound represented by Formula $Si(R^2)_3(OH)$, and a plurality of $R^2$'s each independently represent a hydrogen atom or an alkyl group, where at least one of the plurality of $R^2$'s represents an alkyl group).

The log $P_1$ may be smaller than the log $P_2$ or greater than the log $P_2$ in a case where the difference between log $P_1$ and log P2 described above is 4 or greater.

Here, the log P value of a general mesogen group (the log $P_2$ described above) tends to be in a range of 4 to 6. In a case where the log $P_1$ is smaller than the log $P_2$, the value of log $P_1$ is preferably 1 or less and more preferably 0 or less. Further, in a case where the log $P_1$ is greater than the log $P_2$, the value of log $P_1$ is preferably 8 or greater and more preferably 9 or greater.

In a case where P1 in Formula (2) is obtained by polymerization of (meth)acrylic acid ester and the log $P_1$ is smaller than the log $P_2$, the log P value of SP1 in Formula (2) is preferably 0.7 or less and more preferably 0.5 or less. Further, in a case where P1 in Formula (2) is obtained by polymerization of (meth)acrylic acid ester and the log $P_1$ is greater than the log $P_2$, the log P value of SP1 in Formula (2) is preferably 3.7 or greater and more preferably 4.2 or greater.

Further, examples of the structure having a log P value of 1 or less include an oxyethylene structure and an oxypropylene structure. Examples of the structure having a log P value of 6 or greater include a polysiloxane structure and an alkylene fluoride structure.

(Repeating Unit Represented by Formula (3))

From the viewpoint of improving the film hardness of the specific polarizer layer and strengthening adhesion between the specific polarizer layer and the photo-alignment layer, it is preferable that the polymer liquid crystal compound used in the present invention has a repeating unit (3) represented by Formula (3) in addition to the repeating unit (2) represented by Formula (2).

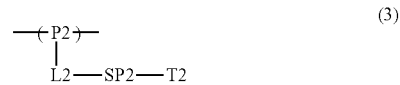

(3)

In Formula (3), P2 represents the main chain of the repeating unit.

In Formula (3), L2 represents a single bond, a divalent alicyclic group which may have a substituent, or a divalent aromatic group which may have a substituent.

In Formula (3), SP2 represents an alkylene group having 10 or more atoms in the main chain. Here, one or more of $-CH_2-$ constituting the alkylene group represented by SP2 may be substituted with at least one group (hereinafter, also referred to as a "group 2C") selected from the group consisting of $-O-$, $-S-$, $-N(R^{21})-$, $-C(=O)-$, $-C(=S)-$, $-C(R^{22})=C(R^{23})-$, an alkynylene group, $-Si(R^{24})(R^{25})-$, $-N=N-$, $-C(R^{26})=N-N=C(R^{27})-$, $-C(R^{28})=N-$, and $-S(=O)_2-$, and $R^{21}$ to $R^{28}$ each independently represent a hydrogen atom, a halogen atom, a cyano group, a nitro group, or a linear or branched alkyl group having 1 to 10 carbon atoms. Further, the hydrogen atoms contained in one or more of constituting the alkylene group represented by SP2 may be substituted with at least one group (hereinafter, also referred to as a "group 2H") selected from the group consisting of a halogen atom, a cyano group, a nitro group, a hydroxyl group, a linear alkyl group having 1 to 10 carbon atoms, and a branched alkyl group having 1 to 10 carbon atoms.

In Formula (3), T2 represents a hydrogen atom, a methyl group, a hydroxyl group, a carboxy group, a sulfonic acid group, a phosphoric acid group, a boronic acid group, an amino group, a cyano group, a nitro group, a vinyl group, an acryloyloxy group, a methacryloyloxy group, an epoxy group, an oxetanyl group which may have a substituent, a phenyl group which may have a substituent, or a maleimide group which may have a substituent.

Specific examples and preferred embodiments of P2 are the same as those for P1 in Formula (2), and thus description thereof will not be repeated.

Specific examples of the divalent alicyclic group which may have a substituent represented by L2 are the same as those for the divalent alicyclic group described in the section of A1 in Formula (M1-A), and thus the description thereof will not be repeated. Further, examples of the substituent include the substituent. W described below. Among the examples, a fluorine atom, a chlorine atom, an alkyl group, a cyano group, a hydroxy group, a carboxy group, an alkoxy group, a nitro group, an acyloxy group, an amino group, a mercapto group, an alkylthio group, an alkylsulfonyl group, an alkylsulfonylamino group, a satin) group, an alkylsulfinyl group, an epoxycycloalkyl group, or an alkoxycarbonyl group is preferable.

Examples of the divalent aromatic group which may have a substituent represented by L2 include a divalent aromatic hydrocarbon group and a divalent aromatic heterocyclic group. Specific examples and preferred embodiments of the divalent aromatic hydrocarbon group are the same as those for the divalent aromatic hydrocarbon group described in the section of A1 in Formula (M1-A), and thus the description thereof will not be repeated. Further, specific examples and preferred embodiments of the divalent aromatic heterocyclic group are the same as those for the divalent aromatic heterocyclic group described in the section of A1 in Formula (M1-A), and thus the description thereof will not be repeated. Further, examples of the substituent include the substituent W described below. Among the examples, a fluorine atom, a chlorine atom, an alkyl group, a cyano group, a hydroxy group, a carboxy group, an alkoxy group, a nitro group, an acyloxy group, an amino group, a mercapto group, an alkylthio group, an alkylsulfonyl group, an alkylsulfonylamino group, a sulfo group, an alkylsulfinyl group, or an alkoxycarbonyl group is preferable.

From the viewpoint of further exhibiting the effects of the present invention, it is preferable that L2 represents a single bond.

SP2 represents an alkylene group having 10 or more atoms in the main chain, one or more of —$CH_2$— constituting the alkylene group may be substituted with the "group 2C" described above, and the hydrogen atoms contained in one or more of —$CH_2$— constituting the alkylene group may be substituted with the "group 2H" described above.

The number of atoms in the main chain of SP2 is 10 or greater, and from the viewpoint of obtaining a specific polarizer layer with more excellent adhesiveness and planar uniformity, the number thereof is preferably 15 or greater and more preferably 19 or greater. Further, from the viewpoint of obtaining a specific polarizer layer with a more excellent degree of alignment, the upper limit of the number of atoms in the main chain of SP2 is preferably 70 or less, more preferably 60 or less, and particularly preferably 50 or less.

Here, the "main chain" in SP2 indicates a partial structure required for directly linking L2 and T2 to each other, and the "number of atoms in the main chain" indicates the number of atoms constituting the partial structure. In other words, the "main chain" in SP2 is a partial structure in which the number of atoms linking L2 and T2 to each other is the smallest. For example, the number of atoms in the main chain in a case where SP2 represents a 3,7-dimethyldecanal group is 10, and the number of atoms in the main chain in a case where SP2 represents a 4,6-dimethyldodecanyl group is 12. Further, in Formula (24), the inside of the frame shown by the dotted quadrangle corresponds to SP2, and the number of atoms in the main chain of SP2 (corresponding to the total number of atoms circled by the dotted line) 11.

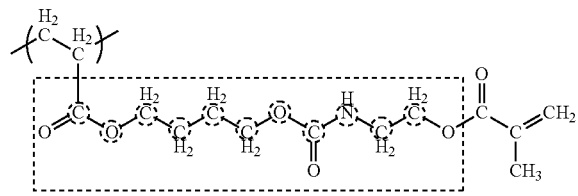

The alkylene group represented by SP2 may be linear or branched.

From the viewpoint of obtaining a specific polarizer layer with a more excellent degree of alignment, the number of carbon atoms of the alkylene group represented by SP2 is preferably in a range of 8 to 80, more preferably in a range of 15 to 80, still more preferably in a range of 25 to 70, and particularly preferably in a range of 25 to 60.

From the viewpoint of obtaining a specific polarizer layer with more excellent adhesiveness and planar uniformity; it is preferable that one or more of —$CH_2$— constituting the alkylene group represented by SP2 are substituted with the "group 2C" described above.

Further, in a case where a plurality of —$CH_2$— constituting the alkylene group represented by SP2 are present, it is more preferable that only some of the plurality of —$CH_2$— are substituted with the "group 2C" described above from the viewpoint of obtaining a specific polarizer layer with more excellent adhesiveness and planar uniformity.

As described above, the group 2C is at least one group selected from the group consisting of —O—, —S—, —N($R^{21}$)—, —C(=O)—, —C($R^{22}$)=C($R^{23}$)—, an alkynylene group, —Si($R^{24}$)($R^{25}$)—, —N=N—, —C($R^{26}$)=N—N=C($R^{27}$)—, —C($R^{28}$)=N—, and —S(=O)$_2$—, and from the viewpoint of obtaining a specific polarizer layer with more excellent adhesiveness and planar uniformity, at least one group selected from the group consisting of —O—, —N($R^{21}$)—, —C(=O)—, and —S(=O)$_2$— is preferable, and at least one group selected from the group consisting of —O—, —N($R^{21}$)—, and —C(=O)— is more preferable.

Particularly, it is preferable that SP2 represents a group having at least one selected from the group consisting of an oxyalkylene structure in which one or more of —$CH_2$— constituting an alkylene group are substituted with —O—, an ester structure in which one or more of —$CH_2$—$CH_2$— constituting an alkylene group are substituted with —O— and —C(=O)—, and a urethane bond in which one or more of —$CH_2$—$CH_2$—$CH_2$— constituting an alkylene group are substituted with —O—, —C(=O)—, and —NH—.

The hydrogen atoms contained in one or more of —$CH_2$— constituting the alkylene group represented by SP2 may be substituted with the "group 2H" described above. In this case, one or more hydrogen atoms contained in —$CH_2$— may be substituted with the "group 2H". That is, only one hydrogen atom contained in —$CH_2$— may be substituted with the "group 2H" or all (two) hydrogen atoms contained in —$CH_2$— may be substituted with the "group 2H".

As described above, the "group 2H" is at least one group selected from the group consisting of a halogen atom, a cyano group, a nitro group, a hydroxyl group, a linear alkyl group having 1 to 10 carbon atoms, and a branched alkyl group having 1 to 10 carbon atoms, preferably at least one group selected from the group consisting of a hydroxyl group, a linear alkyl group having 1 to 10 carbon atoms, and a branched alkyl group having 1 to 10 carbon atoms, and more preferably a hydroxyl group.

As described above, T2 represents a hydrogen atom, a methyl group, a hydroxyl group, a carboxy group, a sulfonic acid group, a phosphoric acid group, a boronic acid group, an amino group, a cyano group, a nitro group, a vinyl group, an acryloyloxy group, a methacryloyloxy group, an epoxy group, an oxetanyl group, or a maleimide group.

Among these, T2 represents preferably a hydroxyl group, a carboxy group, a sulfonic acid group, a phosphoric acid group, a boronic acid group, an amino group, a cyano group, a nitro group, a vinyl group, an acryloyloxy group, a methacryloyloxy group, an epoxy group, an oxetanyl group, or a maleimide group from the viewpoint of improving the adhesiveness by crosslinking and/or the interaction with the base layer (for example, the base material or the alignment layer) and and more preferably a vinyl group, an acryloyloxy group, a methacryloyloxy group, an epoxy group, an oxetanyl group, or a maleimide group from the viewpoint of further improving the adhesiveness as a result of further suppression of the aggregation failure of the specific polarizer layer due to the crosslinking of the specific polarizer layer itself.

In a case where the repeating unit (3) contains a crosslinkable group as described above, the ratio of the mass of the repeating unit (3) to the total mass of the polymer liquid crystals is preferably in a range of 5% to 30% and more preferably in a range of 8% to 20%.

Specific examples of the repeating unit (3) include the following structures. Further, in the following specific examples, n1 represents an integer of 2 or greater, and n2 represents an integer of 1 or greater.

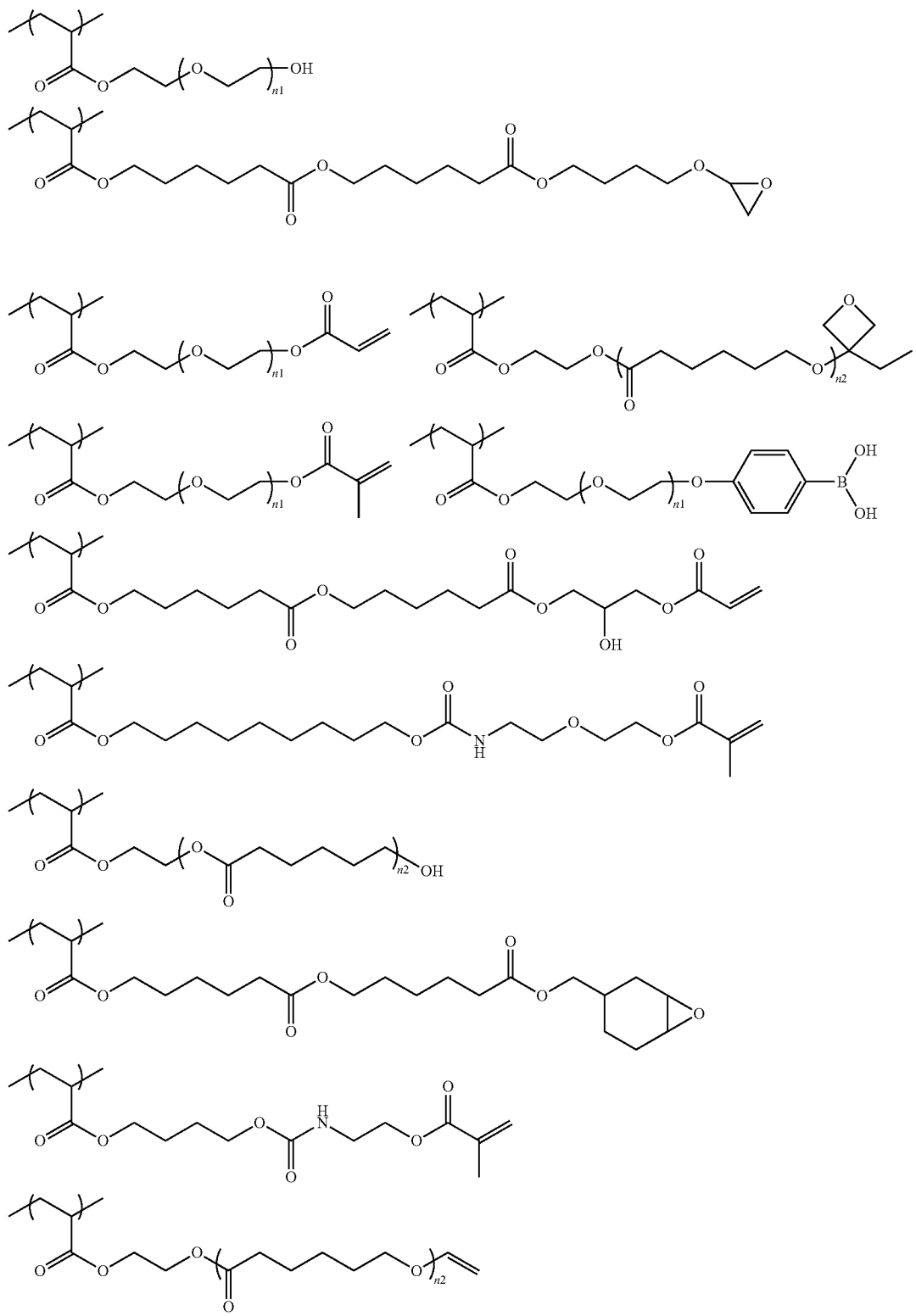

-continued

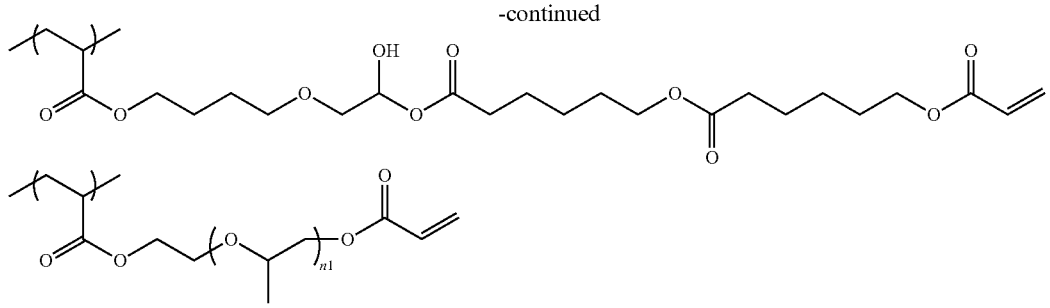

<Dichroic Material>

The liquid crystal composition used for forming the specific polarizer layer contains a dichroic material.

The dichroic material is not particularly limited, and examples thereof include a visible light absorbing material (dichroic dye), a light emitting material (such as a fluorescent material or a phosphorescent material), an ultraviolet absorbing material, an infrared absorbing material, a non-linear optical material, a carbon nanotube, and an inorganic material (for example, a quantum rod). Further, known dichroic materials (dichroic dyes) of the related art can be used.

Specific examples thereof include those described in paragraphs [0067] to [0071] of JP2.013-228706A, paragraphs [0008] to [0026] of JP2013-227532A, paragraphs [0008] to of JP2013-209367A, paragraphs [0045] to [0058] of JP2013-14883A, paragraphs to [0029] of 22013-109090A, paragraphs [0009] to [0017] of JP2013-101328A, paragraphs [0051] to [0065] of JP2013-37353A, paragraphs [0049] to [0073] of JP2012-63387A, paragraphs [0016] to [0018] of JP1999-305036A (JP-1111-305036A), paragraphs [0009] to [0011] of JP2001-133630A, paragraphs [0030] to [0169] of JP2011-215337A, paragraphs [0021] to [0075] of JP2010-106242A, paragraphs [0011] to [0025] of JP2010-215846A, paragraphs [0017] to [0069] of JP2011-048311A, paragraphs [0013] to [0133] of JP2011-213610A, paragraphs [0074] to [0246] of JP2011-237513A, paragraphs [0005] to [0051] of JP2016-006502, paragraphs [0005] to [0041] of WO2016/060173A, paragraphs [0008] to [0062] of WO2016/136561A, paragraphs [0014] to [0033] of WO2017/154835A, paragraphs [0014] to [0033] of WO2017/154695A, paragraphs [0013] to [0037] of WO2017/195833A, and paragraphs [0014] to [0034] of WO2018/164252A.

In the present invention, two or more kinds of dichroic materials may be used in combination. For example, from the viewpoint of making the color of the specific polarizer layer closer to black, it is preferable that at least one dye compound (first dichroic material) having a maximal absorption wavelength in a wavelength range of 370 to 550 run and at least one dye compound (second dichroic material) having a maximal absorption wavelength in a wavelength range of 500 to 700 nm are used in combination.

In the present invention, from the viewpoint of further enhancing pressing resistance, it is preferable that the dichroic material contains a crosslinkable group.

Specific examples of the crosslinkable group include a (meth)acryloyl group, an epoxy group, an oxetanyl group, and a styryl group. Among these, a (meth)acryloyl group is preferable.

In the present invention, from the viewpoint of enhancing the balance between the degree of alignment and the uniformity of the specific polarizer layer, the content of the dichroic material contained in the liquid crystal Composition is preferably in a range of 2% to 35% by mass, more preferably in a range of 5% to 25% by mass, still more preferably in a range of 5% to 20% by mass, and particularly preferably in a range of 10% to 15% by mass in terms of the solid content ratio.

(Specific Dichroic Dye Compound)

It is preferable that the liquid crystal composition contains a dichroic material represented by Formula (4) (hereinafter, also referred to as a "specific dichroic dye compound").

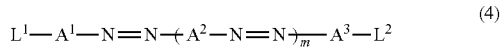

Here, in Formula (4), $A^1$, $A^2$, and $A^3$ each independently represent a divalent aromatic group which may have a substituent.

Further, in Formula (4), $L^1$ and $L^2$ each independently represent a substituent.

Further, in Formula (4), m represents an integer of 1 to 4, and in a case where in represents an integer of 2 to 4, a plurality of $A^2$'s may be the same as or different from each other. Further, it is preferable that m represents 1 or 2.

The "divalent aromatic group which may have a substituent" represented by $A^1$, $A^2$, and $A^3$ in Formula (4) will be described.

Examples of the substituent include a substituent group G described in paragraphs [0237] to [0240] of JP2011-237513A. Among these, a halogen atom, an alkyl group, an alkoxy group, an alkoxycarbonyl group (such as methoxycarbonyl or ethoxycarbonyl), and an aryloxycarbonyl group (such as phenoxycarbonyl, 4-methylphenoxycarbonyl, or 4-methoxyphenylcarbonyl) are suitable, an alkyl group is more suitable, and an alkyl group having 1 to 5 carbon atoms is still more suitable.

In addition, examples of the divalent aromatic group include a divalent aromatic hydrocarbon group and a divalent aromatic heterocyclic group.

Examples of the divalent aromatic hydrocarbon group include an arylene group having 6 to 12 carbon atoms, and specific examples thereof include a phenylene group, a cumenylene group, a mesitylene group, a tolylene group, and a xylylene group. Among these, a phenylene group is preferable.

Further, as the divalent aromatic heterocyclic group, a group derived from a monocyclic or bicyclic heterocycle is preferable. The atoms other than carbon constituting the aromatic heterocyclic group include a nitrogen atom, a sulfur atom, and an oxygen atom. In a case where the aromatic heterocyclic group has a plurality of atoms constituting a ring other than carbon, these may be the same as or different from each other. Specific examples of the aromatic heterocyclic group include a pyridylene group (pyridine-diyl group), a quinolylene group (quinoline-diyl group), an isoquinolylene group (isoquinoline-diyl group), a benzothiadiazole-diyl group, a phthalimido-diyl group, and a thienothiazole-diyl group (hereinafter, also referred to as a "thienothiazole group").

Among the above-described divalent aromatic groups, a divalent aromatic hydrocarbon group is preferable.

Here, it is also preferable that any one of $A^1$, $A^2$, or $A^3$ represents a divalent thienothiazole group which may have a substituent. Further, specific examples of the substituent of the divalent thienothiazole group are the same as the substituents of the "divalent aromatic group which may have a substituent" described above, and the preferred embodiments are also the same as described above.

Further, it is more preferable that $A^2$ among $A^1$, $A^2$, and $A^3$ represents a divalent thienothiazole group. In this case, $A^1$ and $A^2$ represent a divalent aromatic group which may have a substituent.

In a case where $A^1$ represents a divalent thienothiazole group, it is preferable that at least one of $A^1$ or $A^2$ represents a divalent aromatic hydrocarbon group which may have a substituent and more preferable that both $A^1$ and $A^2$ represent a divalent aromatic hydrocarbon group which may have a substituent.

The "substituent" represented by $L^1$ and $L^2$ in Formula (4) will be described.

As the substituent, a group to be introduced to increase the solubility or the nematic liquid crystallinity, a group having an electron-donating property or an electron-withdrawing property which is to be introduced to adjust the color tone of a coloring agent, or a group containing a crosslinkable group (polymerizable group) to be introduced to fix the alignment is preferable.

Examples of the substituent include an alkyl group (preferably an alkyl group having 1 to 20 carbon atoms, more preferably an alkyl group having 1 to 12 carbon atoms, and particularly preferably an alkyl group having 1 to 8 carbon atoms, and examples thereof a methyl group, an ethyl group, an isopropyl group, a tert-butyl group, an n-octyl group, an n-decyl group, an n-hexadecyl group, a cyclopropyl group, a cyclopentyl group, and a cyclohexyl group), an alkenyl group (preferably an alkenyl group having 2 to 20 carbon atoms, more preferably an alkenyl group having 2 to 12 carbon atoms, and particularly preferably an alkenyl group having 2 to 8 carbon atoms, and examples thereof include a vinyl group, an aryl group, a 2-butenyl group, and a 3-pentenyl group), an alkynyl group (preferably an alkynyl group having 2 to 2.0 carbon atoms, more preferably an alkynyl group 2 to 12 carbon atoms, and particularly preferably an alkynyl group having 2 to 8 carbon atoms, and examples thereof include a propargyl group and a 3-pentynyl group), an aryl group (preferably an aryl group having 6 to 30 carbon atoms, more preferably an aryl group having 6 to 20 carbon atoms, and particularly preferably an aryl group having 6 to 12 carbon atoms, and examples thereof include a phenyl group, a 2,6-diethylphenyl group, a 3,5-ditrifluoromethylphenyl group, a styryl group, a naphthyl group, and a biphenyl group), a substituted or unsubstituted amino group (preferably an amino group having 0 to 20 carbon atoms, more preferably an amino group having 0 to 10 carbon atoms, and particularly preferably an amino group having 0 to 6 carbon atoms, and examples thereof include an unsubstituted amino group, a methylamino group, a dimethylamino group, a diethylamino group, and an anilino group), an alkoxy group (preferably an alkoxy group having 1 to 20 carbon atoms and more preferably an alkoxy group having 1 to 15 carbon atoms, and examples thereof include a methoxy group, an ethoxy group, and a butoxy group), an oxycarbonyl group (preferably an oxycarbonyl group having 2 to 20 carbon atoms, more preferably an oxycarbonyl group having 2 to 15 carbon atoms, and particularly preferably an oxycarbonyl group having 2 to 10 carbon atoms, and examples thereof include a methoxycarbonyl group, an ethoxycarbonyl group, and a phenoxycarbonyl group), an acyloxy group (preferably an acyloxy group having 2 to 20 carbon atoms, more preferably an acyloxy group having 2 to 10 carbon atoms, and particularly preferably an acyloxy group having 2 to 6 carbon atoms, and examples thereof include an acetoxy group, a benzoyloxy group, an acryoyl group, and a methacryloyl group), an acylamino group (preferably an acylamino group having 2 to 20 carbon atoms, more preferably an acylamino group having 2 to 10 carbon atoms, and particularly preferably an acylamino group having 2 to 6 carbon atoms, and examples thereof include an acetylamino group and a benzoylamino group), an alkoxycarbonylamino group (preferably an alkoxycarbonylamino group having 2 to 20 carbon atoms, more preferably an alkoxycarbonylamino group having 2 to 10 carbon atoms, and particularly preferably an alkoxycarbonylamino group having 2 to 6 carbon atoms, and examples thereof include a methoxycarbonylamino group), an aryloxycarbonylamino group (preferably an aryloxycarbonylamino group having 7 to 20 carbon atoms, more preferably an aryloxycarbonylamino group having 7 to 16 carbon atoms, and particularly preferably an aryloxycarbonylamino group having 7 to 12 carbon atoms, and examples thereof include a phenyloxycarbonylamino group), a sulfonylamino group (Preferably a sulfonylamino group having 1 to 20 carbon atoms, more preferably a sulfonylamino group having 1 to 10 carbon atoms, and particularly preferably a sulfonylamino group having 1 to 6 carbon atoms, and examples thereof include a methanesulfonylamino group and a benzenesulfonylamino group), a sulfamoyl group (preferably a sulfamoyl group having 0 to 20 carbon atoms, more preferably a sulfamoyl group having 0 to 10 carbon atoms, and particularly preferably a sulfamoyl group having 0 to 6 carbon atoms, and examples thereof include an unsubstituted sulfamoyl group, a methylsulfamoyl group, a dimethylsulfamoyl group, and a phenylsulfamoyl group), a carbamoyl group (preferably a carbamoyl group having 1 to 20 carbon atoms, more preferably a carbamoyl group having 1 to 10 carbon atoms, and particularly preferably a carbamoyl group having 1 to 6 carbon atoms, and examples thereof include an unsubstituted carbamoyl group, a methylcarbamoyl group, a diethylcarbamoyl group, and a phenylcarbamoyl group), an alkylthio group (preferably an alkylthio group having 1 to 20 carbon atoms, more preferably an alkylthio group having 1 to 10 carbon atoms, and particularly preferably an alkylthio group having 1 to 6 carbon atoms, and examples thereof include a methylthio group and an ethylthio group), an arylthio group (preferably an arylthio group having 6 to 20 carbon atoms, more preferably an arylthio group having 6 to 16 carbon atoms, and particularly preferably an arylthio group having 6 to 12 carbon atoms, and examples thereof include a phenylthio group), a sulfonyl group (preferably a sulfonyl group having 1 to 20 carbon atoms, more preferably a sulfonyl group having 1 to 10 carbon atoms, and particularly preferably a sulfonyl group having 1 to 6 carbon atoms, and examples thereof include a mesyl group and a tosyl group), a sulfinyl group (preferably a sulfinyl group having 1 to 20 carbon atoms, more preferably a sulfinyl group having 1 to 10 carbon atoms, and particularly preferably a sulfinyl group having 1 to 6 carbon atoms, and examples thereof include a methanesulfinyl group and a benzenesulfinyl group), a ureido group (preferably a ureido group having 1 to 20 carbon atoms, more preferably a ureido group having 1 to 10 carbon atoms, and particularly preferably a ureido group having 1 to 6 carbon atoms, and examples thereof include an unsubstituted ureido group, a methylureido group, and a phenylureido group), a phosphoric acid amide group (preferably a phosphoric acid amide group having 1 to 20 carbon atoms, more preferably a phosphoric acid amide group having 1 to 10 carbon atoms, and particularly preferably a phosphoric acid amide group having 1 to 6 carbon atoms, and examples thereof include a diethylphosphoric acid amide group and a phenylphosphoric acid amide group), a hydroxy group, a mercapto group, a halogen atom (such as a fluorine atom, a chlorine atom, a bromine atom, and an iodine atom), a cyano group, a nitro group, a hydroxamic acid group, a sulfinol group, a hydrazino group, an imino group, an azo group, a heterocyclic group (preferably a heterocyclic group having 1 to 30 carbon atoms and more preferably a heterocyclic group having 1 to 12 carbon atoms, and examples thereof include a heterocyclic group having a heteroatom such as a nitrogen atom, an oxygen atom, or a sulfur atom, and examples of the heterocyclic group having a heteroatom include an epoxy group, an oxetanyl group, an imidazolyl group, a pyridyl group, a quinolyl group, a furyl group, a piperidyl group, a morpholino group, a maleimide group, a benzoxazolyl group, a benzoimidazolyl group, and a benzothiazolyl group), and a silyl group (preferably a silyl group having 3 to 40 carbon atoms, more preferably a silyl group having 3 to 30 carbon atoms, and particularly preferably a silyl group having 3 to 24 carbon atoms, and examples thereof include a trimethylsilyl group and a triphenylsilyl group).

These substituents may be further substituted with these substituents. Further, in a case where two or more substituents are present, these may be the same as or different from each other. Further, these may be bonded to each other to form a ring where possible.

Among these, as the substituent represented by $L^1$ and $L^2$, an alkyl group which may have a substituent, an alkenyl group which may have a substituent, an alkynyl group which may have a substituent, an aryl group which may have a substituent, an alkoxy group which may have a substituent, an oxycarbonyl group which may have a substituent, an acyloxy group which may have a substituent, an acylamino group which may have a substituent, an amino group which may have a substituent, an alkoxycarbonylamino group which may have a substituent, a sulfonylamino group which may have a substituent, a sulfamoyl group which may have a substituent, a carbamoyl group which may have a substituent, an alkylthio group which may have a substituent, a sulfonyl group which may have a substituent, a ureido group which may have a substituent, a nitro group, a hydroxy group, a cyano group, an imino group, azo group, a halogen atom, and a heterocyclic group are preferable, and an alkyl group which may have a substituent, an alkenyl group which may have a substituent, an aryl group which may have a substituent, an alkoxy group which may have a substituent, an oxycarbonyl group which may have a substituent, an acyloxy group which may have a substituent, an amino group which may have a substituent, a nitro group, an imino group, and an azo group are more preferable.

It is preferable that at least one of $L^1$ or $L^2$ contains a crosslinkable group (polymerizable group) and more preferable that both $L^1$ and $L^2$ contain a crosslinkable group.

Specific examples of the crosslinkable group include the polymerizable groups described in paragraphs [0040] to [0050] of JP2010-244038A. Among these, from the viewpoint of improving the reactivity and the synthetic suitability, an acryloyl group, a methacryloyl group, an epoxy group, an oxetanyl group, and a styryl group are preferable, and art acryloyl group and a methacryloyl group are more preferable.

Suitable embodiments of $L^1$ and $L^2$ include an alkyl group substituted with the above-described crosslinkable group, a dialkyl amino group substituted with the above-described crosslinkable group, and an alkoxy group substituted with the above-described crosslinkable group.

(Second Dichroic Dye)

From the viewpoint of achieving a high degree of alignment on a long wavelength side, it is preferable that the liquid crystal composition contains a dichroic azo dye represented by Formula (5).

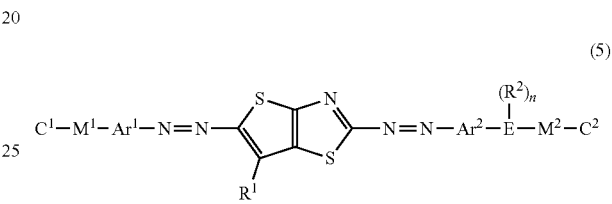

(5)

In Formula (5), $C^1$ and $C^2$ each independently represent a monovalent substituent. Here, at least one of $C^1$ or $C^2$ represents a crosslinkable group.

In Formula (5), $M^1$ and $M^2$ each independently represent a divalent linking group. Here, the number of atoms in the main chain of at least one of $M^1$ or $M^2$ is 4 or greater.

Formula (5), $Ar^1$ and $Ar^2$ each independently represent any of a phenylene group which may have a substituent, a naphthylene group which may have a substituent, or a biphenylene group which may have a substituent.

In Formula (5), E represents any of a nitrogen atom, an oxygen atom, or a sulfur atom.

In Formula (5), $R^1$ represents a hydrogen atom or a substituent.

In Formula (5), $R^2$ represents a hydrogen atom or an alkyl group which may have a substituent.

In Formula (5), n represents 0 or 1. Here, n is 1 in a case where E represents a nitrogen atom, and n is 0 in a case where E represents an oxygen atom or a sulfur atom.

In Formula (5), the monovalent substituent represented by $C^1$ and $C^2$ will be described.

As the monovalent substituent represented by $C^1$ and $C^2$, a group to be introduced to increase the solubility or the nematic liquid crystallinity of the azo compound, a group having an electron-donating property or an electron-withdrawing property which is to be introduced to adjust the color tone of a coloring agent, or a crosslinkable group (polymerizable group) to be introduced to fix, the alignment is preferable.

Examples of the substituent include an alkyl group (preferably an alkyl group having 1 to 20 carbon atoms, more preferably an alkyl group having 1 to 12 carbon atoms, and particularly preferably an alkyl group having 1 to 8 carbon atoms, and examples thereof a methyl group, an ethyl group, an isopropyl group, a tert-butyl group, an n-octyl group, an n-decyl group, an n-hexadecyl group, a cyclopropyl group, a cyclopentyl group, and a cyclohexyl group), an alkenyl group (preferably an alkenyl group having 2 to 20 carbon atoms, more preferably an alkenyl group having 2 to 12 carbon atoms, and particularly preferably an alkenyl group having 2 to 8 carbon atoms, and examples thereof include a vinyl group, an aryl group, a 2-butenyl group, and a 3-pentenyl group), an alkynyl group (preferably an alkynyl group having 2 to 20 carbon atoms, more preferably an alkynyl group 2 to 12 carbon atoms, and particularly preferably an alkynyl group having 2 to 8 carbon atoms, and examples thereof include a propargyl group and a 3-pentynyl group), an aryl group (preferably an aryl group having 6 to 30 carbon atoms, more preferably an aryl group having 6 to 20 carbon atoms, and particularly preferably an aryl group having 6 to 12 carbon atoms, and examples thereof include a phenyl group, a 2,6-diethylphenyl group, a 3,5-ditrifluoromethylphenyl group, a styryl group, a naphthyl group, and a biphenyl group), a substituted or unsubstituted amino group (preferably an amino group having 0 to 20 carbon atoms, more preferably an amino group having 0 to 10 carbon atoms, and particularly preferably an amino group having 0 to 6 carbon atoms, and examples thereof include an unsubstituted amino group, a methylamino group, a dimethylamino group, a diethylamino group, and an anilino group), an alkoxy group (preferably an alkoxy group having 1 to 20 carbon atoms and more preferably an alkoxy group having 1 to 15 carbon atoms, and examples thereof include a methoxy group, an ethoxy group, and a butoxy group), an oxycarbonyl group (preferably an oxycarbonyl group having 2 to 20 carbon atoms, more preferably an oxycarbonyl group having 2 to 15 carbon atoms, and particularly preferably an oxycarbonyl group having 2 to 10 carbon atoms, and examples thereof include a methoxycarbonyl group, an ethoxycarbonyl group, and a phenoxycarbonyl group), an acyloxy group (preferably an acyloxy group having 2 to 20 carbon atoms, more preferably an acyloxy group having 2 to 10 carbon atoms, and particularly preferably an acyloxy group having 2 to 6 carbon atoms, and examples thereof include an acetoxy group, a benzoyloxy group, an acryloyl group, and a methacryloyl group), an acylamino group (preferably an acylamino group having 2, to 20 carbon atoms, more preferably an acylamino group having 2 to 10 carbon atoms, and particularly preferably an acylamino group having 2 to 6 carbon atoms, and examples thereof include an acetylamino group and a benzoylamino group), an alkoxycarbonylamino group (preferably an alkoxycarbonylamino group having 2 to 20 carbon atoms, more preferably an alkoxycarbonylamino group having 2 to 10 carbon atoms, and particularly preferably an alkoxycarbonylamino group having 2 to 6 carbon atoms, and examples thereof include a methoxycarbonylamino group), an aryloxycarbonylamino group (preferably an aryloxycarbonylamino group having 7 to 20 carbon atoms, more preferably an aryloxycarbonylamino group having 7 to 16 carbon atoms, and particularly preferably an aryloxycarbonylamino group having 7 to 12 carbon atoms, and examples thereof include a phenyloxycarbonylamino group), a sulfonylamino group (preferably a sulfonylamino group having 1 to 20 carbon atoms, more preferably a sulfonylamino group having 1 to 10 carbon atoms, and particularly preferably a sulfonylamino group having 1 to 6 carbon atoms, and examples thereof include a methanesulfonylamino group and a benzenesulfonylamino group), a sulfamoyl group (preferably a sulfamoyl group having 0 to 20 carbon atoms, more preferably a sulfamoyl group having 0 to 10 carbon atoms, and particularly preferably a sulfamoyl group having to 6 carbon atoms, and examples thereof include an unsubstituted sulfamoyl group, a methylsulfamoyl group, a dimethylsulfamoyl group, and a phenylsulfamoyl group), a carbamoyl group (preferably a carbamoyl group having 1 to 20 carbon atoms, more preferably a carbamoyl group having 1 to 10 carbon atoms, and particularly preferably a carbamoyl group having 1 to 6 carbon atoms, and examples thereof include an unsubstituted carbamoyl group, a methylcarbamoyl group, a diethylcarbamoyl group, and a phenylcarbamoyl group), an alkylthio group (preferably an alkylthio group having 1 to 20 carbon atoms, more preferably an alkylthio group having 1 to 10 carbon atoms, and particularly preferably an alkylthio group having 1 to 6 carbon atoms, and examples thereof include a methylthio group and an ethylthio group), an arylthio group (preferably an arylthio group having 6 to 20 carbon atoms, more preferably an arylthio group having 6 to 16 carbon atoms, and particularly preferably an arylthio group having 6 to 12 carbon atoms, and examples thereof include a phenylthio group), a sulfonyl group (preferably a sulfonyl group having 1 to 20 carbon atoms, more preferably a sulfonyl group having 1 to 10 carbon atoms, and particularly preferably a sulfonyl group having 1 to 6 carbon atoms, and examples thereof include a mesyl group and a tosyl group), a sulfinyl group (preferably a sulfinyl group having 1 to 20 carbon atoms, more preferably a sulfinyl group having 1 to 10 carbon atoms, and particularly preferably a sulfinyl group having 1 to 6 carbon atoms, and examples thereof include a methanesulfinyl group and a benzenesulfinyl group), a ureido group (preferably a ureido group having 1 to 20 carbon atoms, more preferably a ureido group having 1 to 10 carbon atoms, and particularly preferably a ureido group having 1 to 6 carbon atoms, and examples thereof include an unsubstituted ureido group, a methylureido group, and a phenylureido group), a phosphoric acid amide group (preferably a phosphoric acid amide group, having 1 to 20 carbon atoms, more preferably a phosphoric acid amide group having 1 to 10 carbon atoms, and particularly preferably a phosphoric acid amide group having 1 to 6 carbon atoms, and examples thereof include a diethylphosphoric acid amide group and a phenylphosphoric acid amide group), a hydroxy group, a mercapto group, a halogen atom (such as a fluorine atom, a chlorine atom, a bromine atom, and an iodine atom), a cyano group, a nitro group, a hydroxamic acid group, a sulfino group, a hydrazine group, an imino group, an azo group, a heterocyclic group (preferably a heterocyclic group having 1 to 30 carbon atoms and more preferably a heterocyclic group having 1 to 12 carbon atoms, and examples thereof include a heterocyclic group having a heteroatom such as a nitrogen atom, an oxygen atom, or a sulfur atom, and examples of the heterocyclic group having a heteroatom include an epoxy group, an oxetanyl group, an imidazolyl group, a pyridyl group, a quinolyl group, a furyl group, a piperidyl group, a morpholine group, a maleimide group, a benzoxazolyl group, a benzoimidazolyl group, and a benzothiazolyl group), and a silyl group (preferably a silyl group having 3 to 40 carbon atoms, more preferably a silyl group having 3 to 30 carbon atoms, and particularly preferably a silyl group having 3 to 24 carbon atoms, and examples thereof include a trimethylsilyl group and a triphenylsilyl group).

These substituents may be further substituted with these substituents. Further, in a case where two or more substituents are present, these may be the same as or different from each other. Further, these may be bonded to each other to form a ring where possible.

In Formula (5), at least one of $C^1$ or $C^2$ represents a crosslinkable group, and from the viewpoint that the durability of the specific polarizer layer is more excellent, both $C^1$ and $C^2$ represent a crosslinkable group.

Specific examples of the crosslinkable group include the polymerizable groups described in paragraphs [0040] to

[0050] of JP2010-244038A. Among these, from the viewpoint of improving the reactivity and the synthetic suitability, an acryloyl group, a methacryloyl group, an epoxy group, an oxetanyl group, and a styryl group are preferable, and an acryloyl group and a methacryloyl group are more preferable.

In Formula (5), the divalent linking group represented by $M^1$ and $M^2$ will be described.

Examples of the divalent linking group include —O—, —S—, —CO—, —COO—, —OCO—, —O—NR$^N$—, —CO—NR$^N$—, —O—CO—NR$^N$—, —SO$_2$—, —SO$_2$—, —SO—, an alkylene group, a cycloalkylene group, an alkenylene group, and a group obtained by combining two or more of these groups.

Among these, a group obtained by combining an alkylene group with one or more groups selected from the group consisting of —O—, —S—, —CO—, —COO—, —OCO—, —O—CO—O—, —CO—NR$^N$—, —SO$_2$—, and —SO— is preferable. Further, R$^N$ represents a hydrogen atom or an alkyl group.

Further, the number of atoms in the main chain of at least one of $M^1$ or $M^2$ is 4 or greater, preferably 7 or greater, and more preferably 10 or greater. The upper limit of the number of atoms in the main chain is preferably 20 or less and more preferably 15 or less.

Here, the "main chain" in $M^1$ indicates a portion required for directly linking "$C^1$" with "$Ar^1$" in Formula (5), and the "number of atoms in the main chain" indicates the number of atoms constituting the above-described portion. Similarly, the "main chain" in $M^2$ indicates a portion required for directly linking "$C^2$" with "E" in Formula (5), and the "number of atoms in the main chain" indicates the number of atoms constituting the above-described portion. Further, the "number of atoms in the main chain" does not include the number of atoms in a branched chain described below.

Specifically, in Formula (D7), the number of atoms in the main chain of M1 is 6 (the number of atoms in the dotted frame on the left side of Formula (D7)), and the number of atoms in the main chain of M2 is 7 (the number of atoms in the dotted frame on the right side of Formula (D7)).

In the present invention, at least one of $M^1$ or $M^2$ may represent a group having four or more atoms in the main chain, and in a case where the number of atoms in the main chain of one of $M^1$ and $M^2$ is 4 or greater, the number of atoms of the other main chain may be 3 or less.

The total number of atoms in the main chains of $M^1$ or $M^2$ is preferably in a range of 5 to 30 and more preferably in a range of 7 to 27. In a case where the total number of atoms in the main chains is 5 or greater, the dichroic material is more likely to be polymerized, and in a case where the total number of atoms in the main chains is 30 or less, a specific polarizer layer with an excellent degree of alignment or a specific polarizer layer with excellent heat resistance due to an increased melting temperature of the dichroic material is obtained.

$M^1$ and $M^2$ may have a branched chain. Here, the "branched chain" of $M^1$ indicates a portion other than a portion required for directly linking $C^1$ with $Ar^1$ in Formula (5). Similarly, the "branched chain" of $M^2$ indicates a portion other than a portion required for directly linking $C^2$ with E in Formula (5).

The number of atoms in the branched chain is preferably 3 or less. In a case where the number of atoms in the branched chain is 3 or less, there is an advantage that the degree of alignment of the specific polarizer layer is further improved. Further, the number of atoms in the branched chain does not include the number of hydrogen atoms.

Hereinafter, preferable structures of $M^1$ and $M^2$ will be described, but the present invention is not limited thereto. In the following structures, "*" represents a linking part between $C^1$ and $Ar^1$ or a linking part between $C^2$ and E.

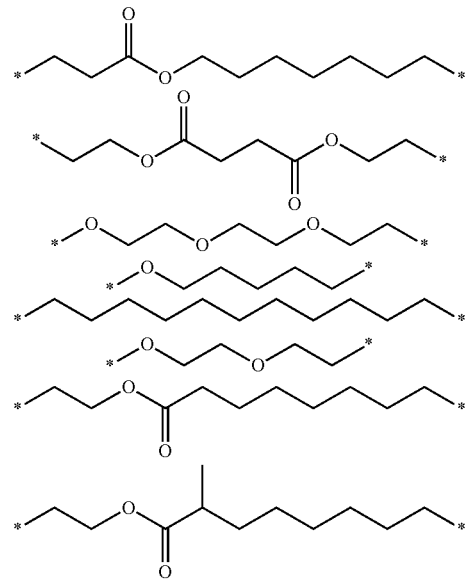

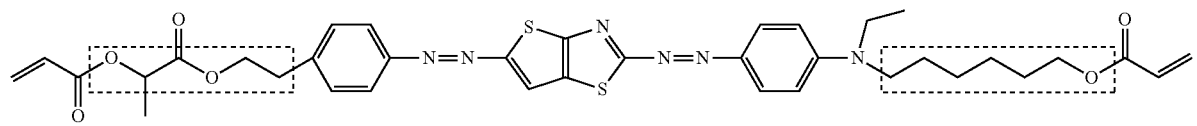

D7

-continued

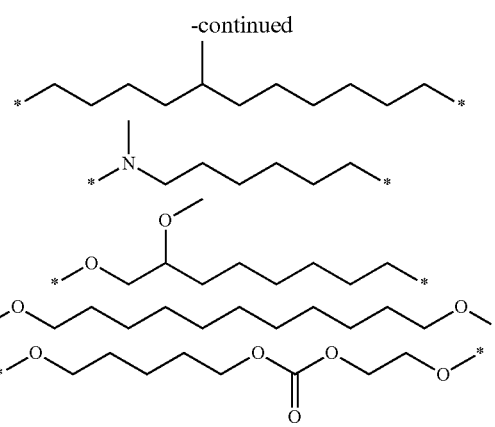

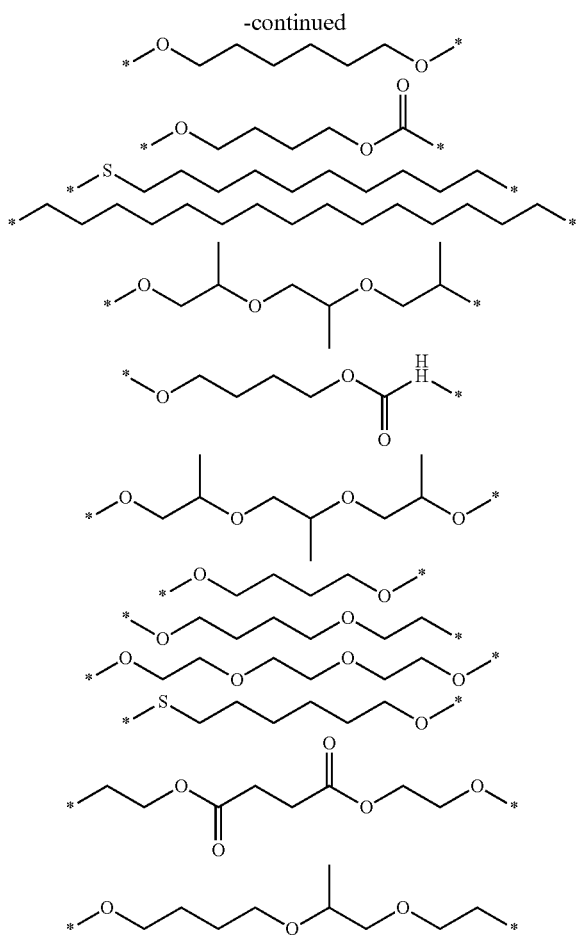

The "phenylene group which may have a substituent", the "naphthylene group which may have a substituent", and the "biphenylene group which may have a substituent" represented by $Ar^1$ and $Ar^2$ in Formula (5) will be described.

The substituent is not particularly limited, and examples thereof include a halogen atom, an alkyl group, an alkyloxy group, are alkylthio group, an oxycarbonyl group, a thioalkyl group, an acyloxy group, an acylamino group, an alkoxycarbonylamino group, a sulfonylamino group, a sulfamoyl group, a carbamoyl group, a sulfinyl group, and a ureido group. These substituents may be farther substituted with these substituents. Among these, an alkyl group is preferable, an alkyl group having 1 to 5 carbon atoms is more preferable, and a methyl group or an ethyl group is preferable from the viewpoints of the availability of raw materials and the degree of alignment.

$Ar^1$ and $Ar^2$ represent a phenylene group which may have a substituent, a naphthylene group which may have a substituent, or a biphenylene group which may have a substituent, but from the viewpoints of the availability of raw materials which may have a substituent and the degree of alignment, a phenylene group is preferable.

In Formula (5), it is preferable that "$M^1$" and "N" linked to $Ar^1$ are positioned at the para position in $Ar'$. Further, it is preferable that "E" and "N" linked to $Ar^2$ are positioned at the para position in $Ar^2$.

In Formula (5), E represents any of a nitrogen atom, an oxygen atom, or a sulfur atom. Among these, from the viewpoint of the synthetic suitability, a nitrogen atom is preferable.

Further, from the viewpoint that it is easy to make the dichroic material have absorption on a short wavelength side (for example, a dichroic material that has a maximum absorption wavelength in a range of approximately 500 to 530 nm), it is preferable that E in Formula (5) represents an oxygen atom.

In addition, from the viewpoint that it is easy to make the dichroic material have absorption on a long wavelength side (for example, a dichroic material that has a maximum absorption wavelength at approximately 600 mu), it is preferable that E in Formula (5) represents a nitrogen atom.

In Formula (5), $R^1$ represents a hydrogen atom or a substituent.

The specific examples and preferred embodiments of the "substituent" represented by $R^1$ are the same as those for the substituents as $Ar^1$ and $Ar^2$ described above, the preferred embodiments are also the same as described above, and thus the description thereof will not be repeated.

In Formula. (5), $R^2$ represents a hydrogen atom or an alkyl group which may have a substituent and preferably an alkyl group which may have a substituent.

Examples of the substituent include a halogen atom, a hydroxyl group, an ester group, an ether group, and a thioether group.

Examples of the alkyl group include a linear, branched, or cyclic alkyl group having 1 to 8 carbon atoms. Among these, a linear alkyl group having 1 to 6 carbon atoms is preferable, a linear alkyl group having 1 to 3 carbon atoms is more preferable, and a methyl group or an ethyl group is still more preferable.

Further, $R^2$ represents a group that is present in Formula (5) in a case where E represents a nitrogen atom (that is, a case where n represents 1). Further, $R^2$ represents a group that is not present in Formula (5) in a case where E represents an oxygen atom or a sulfur atom (that is, a case where n represents 0).

In Formula (5), n represents 0 or 1. Were, n is 1 in a case where E represents a nitrogen atom, and n is 0 in a case where B represents an oxygen atom or a sulfur atom.

Specific examples of the dichroic material will be described below, but the present invention is not limited thereto.

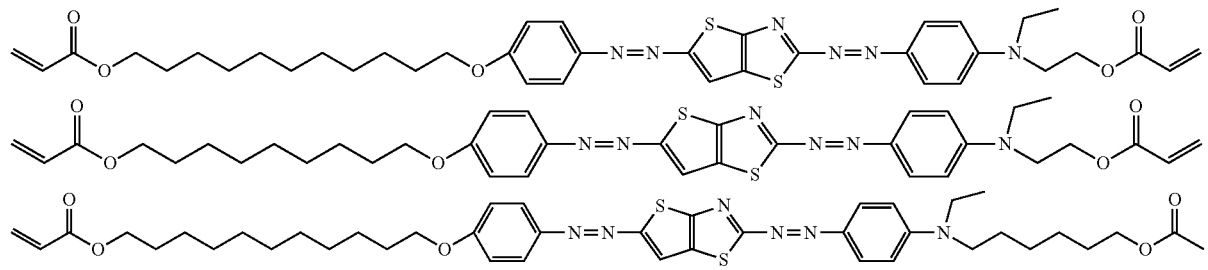

-continued
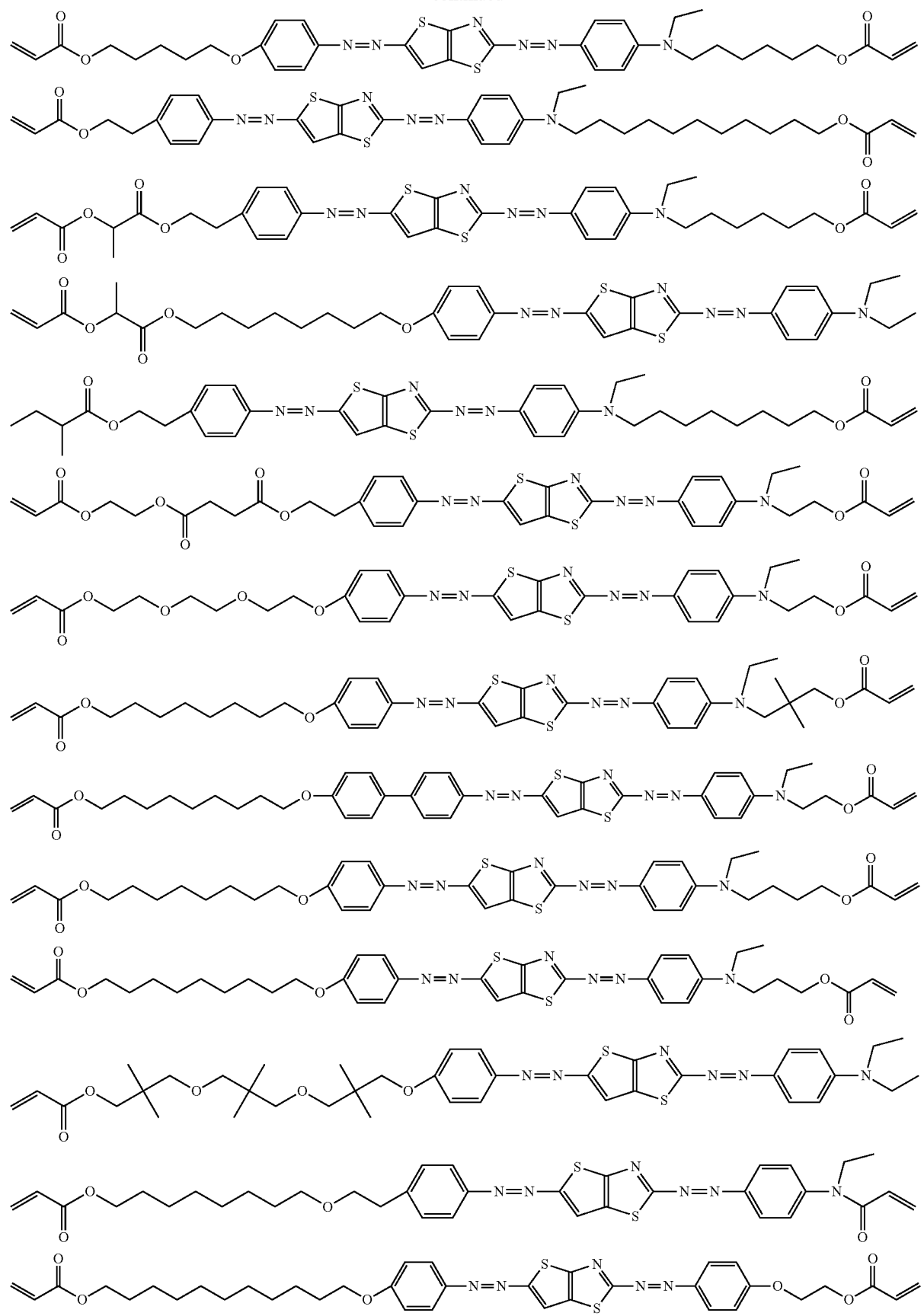

-continued

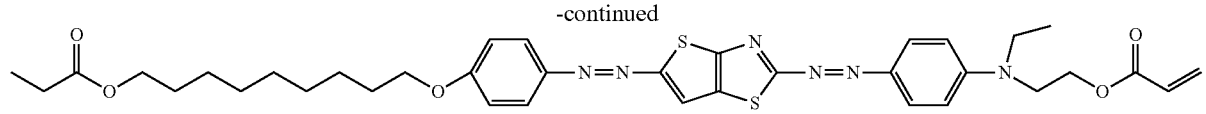

(First Dichroic Dye)

From the viewpoint of achieving a high degree of alignment on a short wavelength side, it is preferable that the liquid crystal composition contains a dichroic azo dye represented by Formula (6).

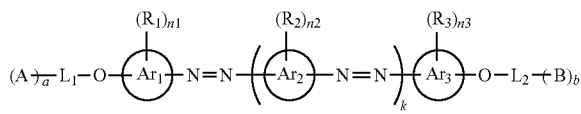

In Formula (6), A and B each independently represent a crosslinkable group.

In Formula (6), a and b each independently represent 0 or 1. Here, an expression of "a+b≥1" is satisfied.

In Formula (6), $L_1$ represents a monovalent substituent in a case where a represents 0, and $L_1$ represents a single bond or a divalent linking group in a case where a represents 1. Further, $L_2$ represents a monovalent substituent in a case wherebh represents 0, and $L_2$ represents a single bond or a divalent linking group in a case where b represents 1.

In Formula (6), $Ar_1$ represents a (n1+2)-valent aromatic hydrocarbon group or a heterocyclic group, $Ar^2$ represents a (n2+2)-valent aromatic hydrocarbon group or a heterocyclic group, and $Ar^3$ represents a (n3+2)-valent aromatic hydrocarbon group or a heterocyclic group.

In Formula (6), $R_1$, $R_2$, and $R_3$ each independently represent a monovalent substituent a plurality of $R_1$'s may be the same as or different from each other in a case of "n1≥2", a plurality of $R_2$'s may be the same as or different from each other in a case of "n2≥2", and a plurality of $R_3$'s may be the same as or different from each other in a case of "n3≥2", in Formula (6), k represents an integer of 1 to 4. In a case of "k=2", a plurality of $Ar_2$'s may be the same as or different from each other and a plurality of $R_2$'s may be the same as or different from each other.

In Formula (6), n1, n2, and n3 each independently represent an integer of 0 to 4. Here, an expression of "n1+n2+n3≥0" is satisfied in a case of "k=1", and an expression of "n1+n2+n3≥1" is satisfied in a case of "k=2".

In Formula (6), examples of the crosslinkable group represented by A and B include the polymerizable groups described in paragraphs [0040] to [0050] of JP2010-244038A. Among these, an acryloyl group, a methacryloyl group, an epoxy group, an oxetanyl group, and a styryl group are preferable from the viewpoint of improving the reactivity and the synthetic suitability, and an acryloyl group and a methacryloyl group are preferable from the viewpoint of further improving the solubility.

In Formula (6), a and b each independently represent 0 or 1, and an expression of "a+b≥1" is satisfied. That is, the dichroic material contains at least one crosslinkable group at the terminal.

Here, it is preferable that both a and b represent 1, that is, the crosslinkable group is introduced into both terminals of the dichroic material. In this manner, there is an advantage that the solubility of the dichroic material is further improved and the durability of the specific polarizer layer is further improved.

In Formula (6), $L_1$ represents a monovalent substituent in a case where a represents 0, and $L_1$ represents a single bond or a divalent linking group in a case where a represents 1. Further, $L_1$ represents a monovalent substituent in a case where b represents 0, and L2 represents a single bond or a divalent linking group in a case where b represents 1.

It is preferable that both $L_1$ and $L_2$ represent a single bond or a divalent linking group and more preferable that both represent a divalent linking group. In this manner, the solubility of the dichroic material is further improved.

As the monovalent substituent represented by $L_1$ and $L_2$, a group to be introduced to increase the solubility of the dichroic material or a group having an electron-donating property or an electron-withdrawing property which is to be introduced to adjust the color tone of the dye is preferable.

Examples of the substituent include an alkyl group (preferably an alkyl group having 1 to 20 carbon atoms, more preferably an alkyl group having 1 to 12 carbon atoms, and particularly preferably an alkyl group having 1 to 8 carbon atoms, and examples thereof a methyl group, an ethyl group, an isopropyl group, a tort-butyl group, an n-octyl group, an n-decyl group, an n-hexadecyl group, a cyclopropyl group, a cyclopentyl group, and a cyclohexyl group), an alkenyl group (preferably an alkenyl group having 2 to 20 carbon atoms, more preferably an alkenyl group having 2 to 12 carbon atoms, and particularly preferably an alkenyl group having 2 to 8 carbon atoms, and examples thereof include a vinyl group, an allyl group, a 2-butenyl group, and a 3-pentenyl group), an alkynyl group (preferably an alkynyl group having 2 to 20 carbon atoms, more preferably an alkynyl group 2 to 12 carbon atoms, and particularly preferably an alkynyl group having 2 to 8 carbon atoms, and examples thereof include a propargyl group and a 3-pentynyl group), an aryl group (preferably an aryl group having 6 to 30 carbon atoms, more preferably an aryl group having 6 to 20 carbon atoms, and particularly preferably an aryl group having 6 to 12 carbon atoms, and examples thereof include a phenyl group, a 2,6-diethylphenyl group, a 3,5-ditrifluoromethylphenyl group, a naphthyl group, and a biphenyl group), a substituted or unsubstituted amino group (preferably an amino group having 0 to 20 carbon atoms, more preferably an amino group having 0 to 10 carbon atoms, and particularly preferably an amino group having 0 to 6 carbon atoms, and examples thereof include an unsubstituted amino group, a methylamino group, a dimethylamino group, a diethylamino group, and an anilino group), an alkoxy group (preferably an alkoxy group having 1 to 20 carbon atoms and more preferably an alkoxy group having 1 to 15 carbon atoms, and examples thereof include a methoxy group, an ethoxy group, and a butoxy group), an oxycarbonyl group (preferably an oxycarbonyl group having 2 to 20 carbon atoms, more preferably an oxycarbonyl group having 2 to 15 carbon atoms, and particularly preferably an oxycarbonyl group having 2 to 10 carbon atoms, and examples thereof include a methoxycarbonyl group, an ethoxycarbonyl group, and a phenoxycarbonyl group), an acyloxy group (preferably an acyloxy group having 2 to 20 carbon atoms, more preferably an acyloxy group having 2 to 10 carbon atoms, and particularly preferably an acyloxy group having 2 to 6 carbon atoms, and examples thereof include an acetoxy group and a benzoyloxy group), an acylamino group (preferably an acylamino group having 2 to 20 carbon atoms, more preferably an acylamino group having 2 to 10 carbon atoms, and particularly preferably an acylamino group having 2 to 6 carbon atoms, and examples thereof include an acetylamino group and a benzoylamino group), an alkoxycarbonylamino group (preferably an alkoxycarbonylamino group having 2 to 20 carbon atoms, more preferably an alkoxycarbonylamino group having 2 to 10 carbon atoms, and particularly preferably an alkoxycarbonylamino group having 2 to 6 carbon atoms, and examples thereof include a methoxycarbonylamino group), an aryloxycarbonylamino group (preferably an aryloxycarbonylamino group having 7 to 20 carbon atoms, more preferably an aryloxycarbonylamino group having 7 to 16 carbon atoms, and particularly preferably an aryloxycarbonylamino group having 7 to 12 carbon atoms, and examples thereof include a phenyloxycarbonylamino group), a sulfonylamino group (preferably a sulfonylamino group having 1 to 20 carbon atoms, more preferably a sulfonylamino group having 1 to 10 carbon atoms, and particularly preferably a sulfonylamino group having 1 to 6 carbon atoms, and examples thereof include a methanesulfonylamino group and a benzenesulfonylamino group), a sulfamoyl group (preferably a sulfamoyl group having 0 to 20 carbon atoms, more preferably a sulfamoyl group having 0 to 10 carbon atoms, and particularly preferably a sulfamoyl group having 0 to 6 carbon atoms, and examples thereof include an unsubstituted sulfamoyl group, a methylsulfamoyl group, a dimethylsulfamoyl group, and a phenylsulfamoyl group), a carbamoyl group (preferably a carbamoyl group having 1 to 20 carbon atoms, more preferably a carbamoyl group having 1 to 10 carbon atoms, and particularly preferably a carbamoyl group having 1 to 6 carbon atoms, and examples thereof include an unsubstituted carbamoyl group, a methylcarbamoyl group, a diethylcarbamoyl group, and a phenylcarbamoyl group), an alkylthio group (preferably an alkylthio group having 1 to 20 carbon atoms, more preferably an alkylthio, group having 1 to 10 carbon atoms, and particularly preferably an alkylthio group having 1 to 6 carbon atoms, and examples thereof include a methylthio group and an ethylthio group), an arylthio group (preferably an arylthio group having 6 to 20 carbon atoms, more preferably an arylthio group having 6 to 16 carbon atoms, and particularly preferably an arylthio group having 6 to 12 carbon atoms, and examples thereof include a phenylthio group), a sulfonyl group (preferably a sulfonyl group having 1 to 20 carbon atoms, more preferably a sulfonyl group having 1 to 10 carbon atoms, and particularly preferably a sulfonyl group having 1 to 6 carbon atoms, and examples thereof include a mesyl group and a tosyl group), a sulfonyl group (preferably a sulfinyl group having 1 to 20 carbon atoms, more preferably a sulfonyl group having 1 to 10 carbon atoms, and particularly preferably a sulfonyl group having 1 to 6 carbon atoms, and examples thereof include a methanesulfinyl group and a benzenesulfinyl group), a ureido group (preferably a ureido group having 1 to 20 carbon atoms, more preferably a ureido group having 1 to 10 carbon atoms, and particularly preferably a ureido group having 1 to 6 carbon atoms, and examples thereof include an unsubstituted ureido group, a methylureido group, and a phenylureido group), a phosphoric acid amide group (preferably a phosphoric acid amide group having 1 to 20 carbon atoms, more preferably a phosphoric acid amide group having 1 to 10 carbon atoms, and particularly preferably a phosphoric acid amide group having 1 to 6 carbon atoms, and examples thereof include a diethylphosphoric acid amide group and a phenylphosphoric acid amide group), a heterocyclic group (preferably a heterocyclic group having 1 to 30 carbon atoms and more preferably a heterocyclic group having 1 to 12 carbon atoms, and examples thereof include a heterocyclic group having a heteroatom such as a nitrogen atom, an oxygen atom, or a sulfur atom, and examples of the heterocyclic group having a heteroatom include an imidazolyl group, a pyridyl group, a quinolyl group, a furyl group, a piperidyl group, a morpholine group, a benzoxazolyl group, a benzoimidazolyl group, and a benzothiazolyl group), a silyl group (preferably a silyl group having 3 to 40 carbon atoms, more preferably a silyl group having 3 to 30 carbon atoms, and particularly preferably a silyl group having 3 to 24 carbon atoms, and examples thereof include a trimethylsilyl group and a triphenylsilyl group), a halogen atom (such as a fluorine atom, a chlorine atom, a bromine atom, and an iodine atom), a hydroxy group, a mercapto group, a cyano group, a nitro group, a hydroxamic acid group, a sulfino group, a hydrazino group, an imino group, and an azo group.

These substituents may be further substituted with these substituents. Further, in a case where two or more substituents are present, these may be the same as or different from each other. Further, these may be bonded to each other to form a ring where possible.

As the group in which the above-described substituent is further substituted with the above-described substituent, an $R_B-(O-R_A)_{na}-$ group which is a group in which an alkoxy group is substituted with an alkyl group is exemplified. Here, in the formula, $R_A$ represents an alkylene group having 1 to 5 carbon atoms, $R_B$ represents an alkyl group having 1 to 5 carbon atoms, and na represents an integer of 1 to 10 (preferably an integer of 1 to 5 and more preferably an integer of 1 to 3).

Among these, as the monovalent substituent represented by $L_1$ and $L_2$, an alkyl group, an alkenyl group, an alkoxy group, and groups in which these groups are further substituted with these groups (for example, $R_B-(O-R_A)_{na}-$ group) are preferable, an alkyl group, an alkoxy group, and groups in which these groups are further substituted with these groups (for example, an $R_B-(O-R_A)_{na}-$ group) are more preferable.

Examples of the divalent linking group represented by $L_1$ and $L_2$ include —O—, —S—, —CO—, —COO—, —OCO—, —O—CO—O—, —CO—NR$_N$—, —O—CO—NR$_N$—, —NR$_N$—CO—NR$_N$—, —SO$_2$—, —SO—, an alkylene group, a cycloalkylene group, an alkenylene group, and a group obtained by combining two or more of these groups.

Among these, a group obtained by combining an alkylene group with one or more groups selected from the group consisting of —O—, —COO—, —OCO— and —O—CO—O— is preferable.

Here, $R_N$ represents a hydrogen atom or an alkyl group. In a case where a plurality of $R_N$'s are present, the plurality of $R_N$'s may be the same as or different from each other.

From the viewpoint of further improving the solubility of the dichroic material, the number of atoms in the main chain of at least one of $L_1$ or $L_2$ is preferably 3 or greater, more preferably 5 or greater, still more preferably 7 or greater, and particularly preferably 10 or greater. Further, the upper limit of the number of atoms in the main chain is preferably 20 or less and more preferably 12 or less.

In addition, from the viewpoint of further improving the degree of alignment of the specific polarizer layer, the number of atoms of the main chain of at least one of $L_1$ or $L_2$ is preferably in a range of 1 to 5.

Here, in a case where A is present in Formula (6), the "main chain" of $L_1$ indicates a portion required for directly linking "A" with the "O" atom linked to $L_1$, and the "number of atoms in the main chain" indicates the number of atoms constituting the above-described portion. Similarly, in a case where B is present in Formula (6), the "main chain" of $L_2$ indicates a portion required for directly linking "B" with the "O" atom linked to $L_2$, and the "number of atoms in the main chain" indicates the number of atoms constituting the above-described portion. Further, the "number of atoms in the main chain" does not include the number of atoms in a branched chain described below.

Further, in a case Where A is not present, the "number of the main chain of atoms" in $L_1$ indicates the number of atoms in $L_1$ that does not have a branched chain. In a case where B is not present, the "number of the main chain of atoms" in $L_2$ indicates the number of atoms in $L_2$ that does not have a branched chain.

Specifically, in Formula (D1), the number of atoms in the main chain of $L_1$ is 5 (the number of atoms in the dotted frame on the left side of Formula (D1)), and the number of atoms in the main chain of $L_2$ is 5 (the number of atoms in the dotted frame on the right side of Formula (D1)). Further, in Formula (D10), the number of atoms in the main chain of $L_1$ is 7 (the number of atoms in the dotted frame on the left side of Formula (D10)), and the number of atoms in the main chain of $L_2$ is 5 (the number of atoms in the dotted frame on the right side of Formula (D10)).

$L_1$ and $L_2$ may have a branched chain.

Here, in a case where A is present in Formula (6), the "branched chain" of $L_1$ indicates a portion other than a portion required for directly linking "A" with the "O" atom linked to $L_1$ in Formula (6). Similarly, in a case where B is present in Formula (6), the "branched chain" of $L_2$ indicates a portion other than a portion required for directly linking "B" with the "O" atom linked to $L_2$ in Formula (6).

Further, in a case where A is not present in Formula (6), the "branched chain" of $L_1$ indicates a portion other than the longest atomic chain (that is, the main chain) extending from the "O" atom linked to $L_1$ in Formula (6) which is the starting point. Similarly, in a case where B is not present in Formula (6), the "branched chain" of $L_2$ indicates a portion other than the longest atomic chain (that is, the main chain) extending from the "O" atom linked to $L_2$ in Formula (6) which is a starting point.

The number of atoms in the branched chain is preferably 3 or less. Ina case where the number of atoms in the branched chain is set to 3 or less, there is an advantage that the degree of alignment of the specific polarizer layer is further improved. Further, the number of atoms in the branched chain does not include the number of hydrogen atoms.

In Formula (6), $Ar_1$ represents an (n1+2)-valent (for example, trivalent in a case where n1 represents 1) aromatic hydrocarbon group or heterocyclic group, $Ar_2$ represents an (n2+2)-valent (for example, trivalent in a case where n2 represents 1) aromatic hydrocarbon group or heterocyclic group, and $Ar_3$ represents an (n3+2)-valent (for example, trivalent in a case where n3 represents 1) aromatic hydrocarbon group or heterocyclic group. Here, $Ar_1$ to $Ar_3$ can be respectively rephrased as a divalent aromatic hydrocarbon group or a divalent heterocyclic group substituted with n1 to n3 substituents ($R_1$ to $R_3$ described below).

The divalent aromatic hydrocarbon group represented by $Ar_1$ to $Ar_3$ may be monocyclic or may have a bicyclic or higher cyclic fused ring structure. From the viewpoint of further improving the solubility, the number of rings of the divalent aromatic hydrocarbon group is preferably 1 to 4, more preferably 1 or 2, and still more preferably 1 (that is, a phenylene group).

Specific examples of the divalent aromatic hydrocarbon group include a phenylene group, an azulene-diyl group, a naphthylene group, a fluorene-diyl group, an anthracene-diyl group, and a tetracene-diyl group. From the viewpoints of further improving the solubility, a phenylene group or a naphthylene group is preferable, and a phenylene group is more preferable.

The divalent heterocyclic group may be any of aromatic or non-aromatic, but a divalent aromatic heterocyclic group is preferable as the divalent heterocyclic group from the viewpoint of further improving the degree of alignment.

The divalent aromatic heterocyclic group may be monocyclic or may have a bicyclic or higher cyclic fused ring structure. The atoms other than carbon constituting the aromatic heterocyclic group include a nitrogen atom, a sulfur atom, and an oxygen atom. In a case where the aromatic heterocyclic group has a plurality of atoms constituting a ring other than carbon, these may be the same as or different from each other.

Specific examples of the aromatic heterocyclic group include a pyridylene group (pyridine-diyl group), thienylene

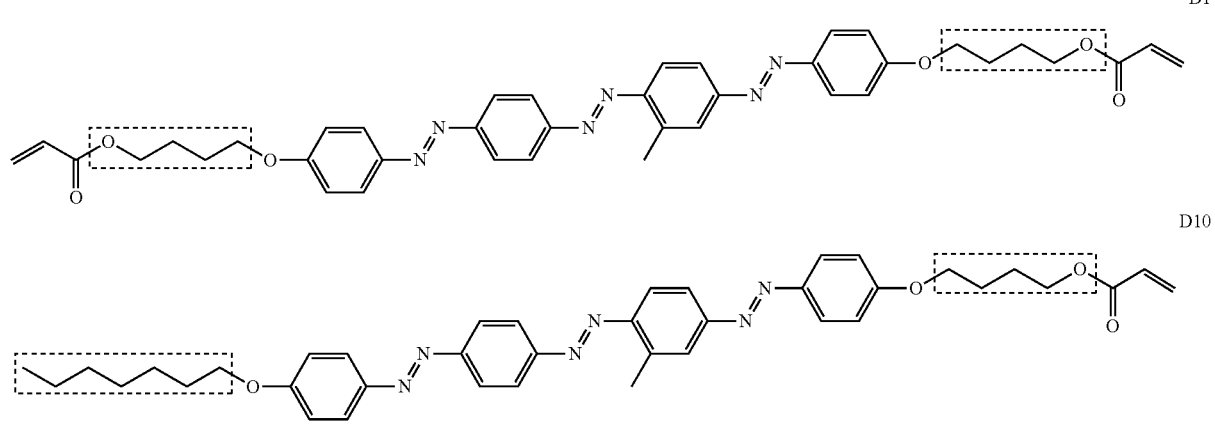

(thiophene-diyl group), a quinolylene group (quinoline-diyl group), an isoquinolylene group (isoquinolin-diyl group), a thiazole-diyl group, benzothiadiazole-diyl group, a phthalimide-diyl group, a thienothiazole-diyl group (in the present invention, referred to as a "thienothiazole group"), a thienothiophene-diyl group, and a thienooxazole-diyl group.

Among these, as the divalent aromatic heterocyclic group, a group having a monocycle or a bicyclic fused ring structure represented by the following structural formula can be preferably used. Further, in the following structural formulae below, "*" represents a bonding position with respect to an azo group or an oxygen atom in Formula (6).

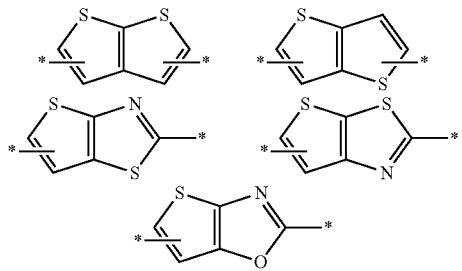

in Formula (6), $Ar_1$ to $Ar_3$ represent preferably a divalent aromatic hydrocarbon group and more preferably a phenylene group.

Here, in a case where $Ar_1$ represents a phenylene group, the azo group and the oxygen atom bonded to $Ar_1$ are positioned preferably in the meta or para position and more preferably in the para position. In this manner, the degree of alignment of the specific polarizer layer is further improved. From the same viewpoint as described above, in a case where $Ar_2$ represents a phenylene group, two azo groups bonded to $Ar_2$ are positioned preferably in the meta position or para position and more preferably in the para position. Similarly, in a case where $Ar_3$ represents a phenylene group, the azo group and the oxygen atom bonded to $Ar_3$ are positioned preferably in the meta position or para position and more preferably in the para position.

In Formula (6), in a case where $Ar_1$, $Ar_2$, and $Ar_3$ each have a fused ring structure, it is preferable that all the plurality of rings constituting the fused ring structure are linked to each other in the longitudinal direction of the structure represented by Formula (6). In this manner, it possible to suppress the molecules of the dichroic material from being bulky in a direction (short direction) intersecting, with the longitudinal direction, and thus the aligning properties of the molecules are enhanced so that the degree of alignment of the specific polarizer layer is further improved.

Here, the longitudinal direction of the structure represented by Formula (6) indicates an extending direction of the structure represented by Formula (6). Specifically, the longitudinal direction indicates an extending direction of the bonding site of the azo group bonded to $Ar_1$, $Ar_2$, and $Ar_3$ and the bonding site of the ether bond (oxygen atom) bonded thereto.

As a specific example of an embodiment in which all the plurality of rings constituting the fused ring structure are linked to each other in the longitudinal direction of the structure represented by Formula (6), a fused ring structure represented by Formula (Ar-1) is shown below. That is, in a case where $Ar_1$, $Ar_2$, and $Ar_3$ have a fused ring structure, it is preferable that $Ar_1$, $Ar_2$, and $Ar_3$ have a fused ring structure represented by Formula (Ar-1),

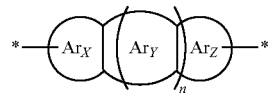

(Ar-1)

In Formula (Ar-1), $Ar_X$, $Ar_Y$, and $Ar_Z$ each independently represent a benzene ring or a monocyclic heterocycle a represents an integer of 0 or greater. Further, "*" represents a bonding position with respect to an azo group or an oxygen atom in Formula (6).

As the monocyclic heterocycle in Formula (Ar-1), a monocyclic aromatic heterocycle is preferable. The atoms other than carbon constituting the monovalent aromatic heterocyclic group include a nitrogen atom, a sulfur atom, and an oxygen atom. Specific examples of the monocyclic aromatic heterocycle include a pyridine ring, a thiophene ring, a thiazole ring, and an oxazole ring.

Further, $Ar_X$, $Ar_Y$, and $Ar_Z$ may have a substituent. Examples of such a substituent include monovalent substituents for $R_1$ to $R_3$ described below.

n represents an integer of 0 or greater, preferably 0 to 2, more preferably 0 or 1, and still more preferably 0.

In Formula (6), $R_1$, $R_2$, and $R_3$ each independently represent a monovalent substituent.

As the monovalent substituent represented by $R_1$, $R_2$, and $R_3$, a halogen atom, a cyano group, a hydroxy group, an alkyl group, an alkoxy group, a fluorinated alkyl group, —O—$(C_2H_4O)$m-R', —O—$(C_3H_6O)$m-R', an alkylthio group, an oxycarbonyl group, a thioalkyl group, an acyloxy group, an acylamino group, an alkoxycarbonylamino group, a sulfonylamino group, a sulfamoyl group, a carbamoyl group, a sulfinyl group, or a ureido group is preferable. Here, R' represents a hydrogen atom, a methyl group, or an ethyl group, and in represents an integer of 1 to 6. These substituents may be further substituted with these substituents.

Among these, from the viewpoint of further improving the solubility of the dichroic material, a fluorine atom, a chlorine atom, a methyl group, an ethyl group, a propyl group, a methoxy group, an ethoxy group, a propoxy group, a hydroxy group, a trifluoromethyl group, O—$(C_2H_4O)$m-R', or —O—$(C_3H_6O)$m-R' is preferable, and a trifluoromethyl group, a methoxy group, a hydroxy group, —O—$(C_2H_4O)$m-R', or —O—$(C_3H_6O)$m-R' is more preferable as the monovalent substituent represented by $R_1$, $R_2$, and $R_3$.

In the monovalent substituent represented by $R_1$, $R_2$, and $R_3$, the number of atoms in the main chain is preferably in a range of 1 to 15 and more preferably in a range of 1 to 12 from the viewpoint of the balance between the solubility of the dichroic material and the aligning properties of the specific polarizer layer. Here, in the monovalent substituent represented by $R_1$, $R_2$, and $R_3$, "the number of atoms in the main chain" indicates the number of atoms of $R_1$, $R_2$, or $R_3$ which does not have a branched chain. Further, the "branched chain" indicates a portion other than the longest atomic chain (that is, the main chain) extending from any of $Ar_1$ to $Ar_2$ in Formula (6) which is a starting point.

In a case where Formula (6) has at least one substituent selected from $R_1$, $R_2$, and $R_3$, it is preferable that at least one condition selected from the following conditions (R1) to (R3) is satisfied. In this manner, the solubility of the dichroic material is further improved.

Condition (R1): In $Ar_1$, at least one $R_1$ and an azo group are positioned to be adjacent to each other Condition (R2): In $Ar_2$, at least one $R_2$ and at least one azo group are positioned to be adjacent to each other Condition (R3): In $Ar_3$, at least one $R_3$ and an azo group are positioned to be adjacent to each other As a specific example of the condition (R1), in a case where $Ar_1$ represents a phenylene group, an embodiment in which $R_1$ is positioned in the ortho position with respect to the azo group bonded to $Ar_1$ is exemplified. As a specific example of the condition (R2), in a case where $Ar_2$ represents a phenylene group, an embodiment in which $R_2$ is positioned in the ortho position with respect to at least one azo group is exemplified. As a specific example of the condition (R3), in a case where $Ar_3$ represents a phenylene group, an embodiment in which $R_3$ is positioned in the ortho position with respect to the azo group bonded to $Ar_3$ is exemplified.

In Formula (6), k represents an integer of 1 to 4. Here, from the viewpoints of excellent light resistance while ensuring excellent solubility, it is preferable that 1K represents 2 or greater. Meanwhile, from the viewpoint of more excellent solubility of the dichroic material, it is preferable that k represents 1.

In Formula (6), n1, n2, and n3 each independently represent an integer of 0 to 4 and preferably an integer of 0 to 3.

Here, an expression of "n1+n2+n3≥0" is satisfied in a case where k represents 1. That is, in a case where Formula (6) has a bisazo structure, sufficient solubility is obtained regardless of the presence or absence of the substituents ($R_1$ to $R_3$ in Formula (6)), but it is preferable that the structure has the substituents from the viewpoint of further improving the solubility.

In a case where k represents 1, n1+n2+n3 is preferably in a range of 0 to 9, more preferably in a range of 1 to 9, and still more preferably in a range of 1 to 5.

Meanwhile, in a case where k is greater than or equal to 2, an expression of "n1+n2+n3≥1" is satisfied. That is, in a case where Formula (6) has a trisazo structure, a tetrakisazo structure, or a pentakisazo structure, at least one substituent ($R_1$ to $R_3$ in Formula (6)) is present.

In a case of "k≥2", n1+n2+n3 is preferably in a range of 1 to 9 and more preferably in a range of 1 to 5.

Specific examples of the dichroic material represented by Formula (6) will be described below, but the present invention is not limited thereto. In the following specific examples, n represents an integer of 1 to 10.

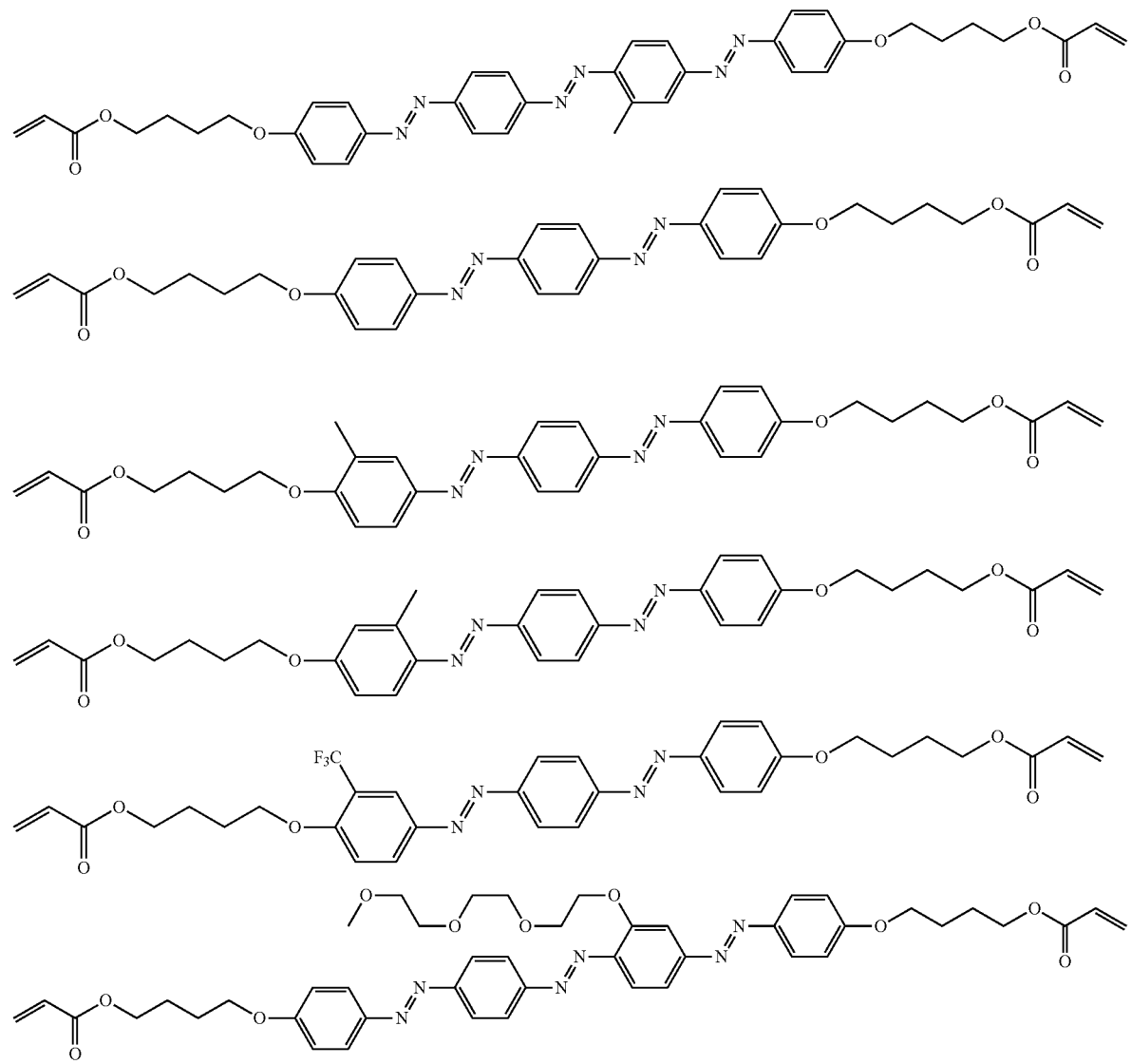

-continued
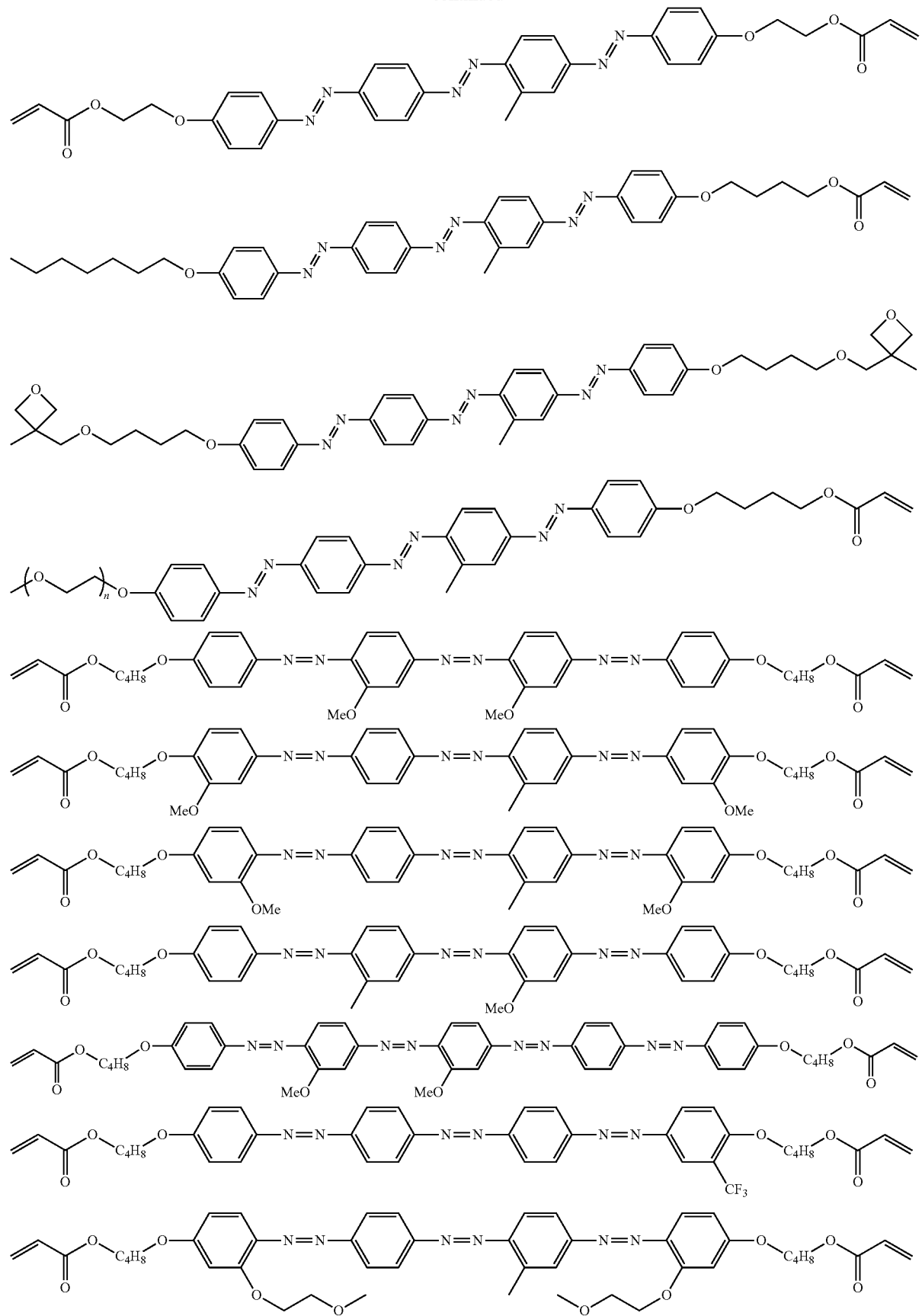

-continued

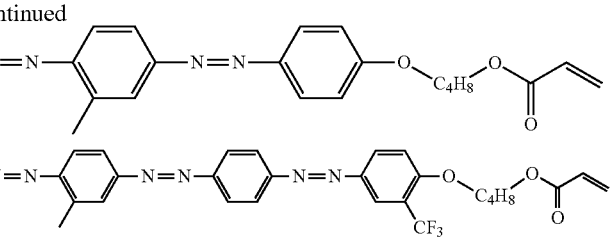

In the present invention, the dichroic material indicates a material having different absorbances depending on the direction.

The dichroic material may or may not exhibit liquid crystallinity.

In a case where the dichroic material exhibits liquid crystallinity, the dichroic material may exhibit any of nematic or nematic liquid crystallinity. The temperature at which the liquid crystal phase is exhibited is preferably in a range of room temperature (approximately 20° C. to 28° C.) 300° C. and from the viewpoints of handleability and manufacturing suitability, more preferably in a range of 50° C. to 200° C.

The liquid crystal composition may contain only one or two or more kinds of dichroic materials.

<Low-Molecular-Weight Liquid Crystal Compound>

From the viewpoint of the adhesion between the photo-alignment layer and the specific polarizer layer, it is preferable that the liquid crystal composition used for forming the specific polarizer layer contains a low-molecular-weight liquid crystal compound in addition to a polymer liquid crystal compound. Here, the "low-molecular-weight liquid crystal compound" indicates a liquid crystal compound having no repeating units in the chemical structure.

Examples of the low-molecular-weight liquid crystal compound include the liquid crystal compound described in JP201.3-228706A, the compounds represented by Formulae (M1), (M2), and (M3) described in paragraphs [0030] to [0033] of JP2014-077068A, and the low-molecular-weight compounds described in paragraphs [0043] to [0050] of WO2018/199096A.

Among these, from the viewpoints of the reactivity and the synthetic suitability, a radically polymerizable group is preferable, an acryloyl group, a methacryloyl group, an epoxy group, an oxetanyl group, or a styryl group is more preferable, and an acryloyl group or a methacryloyl group is still more preferable.

(Molecular Weight)

The molecular weight of the low-molecular-weight liquid crystal compound is preferably less than 5000, more preferably in a range of 200 to 2000, and still more preferably 200 or greater and less than 1500, (Content)

In a case where the liquid crystal composition contains a low-molecular-weight liquid crystal compound, the content of the low-molecular-weight liquid crystal compound is preferably in a range of 3 to 30 parts by mass and more preferably in a range of 5 to 20 parts by mass with respect to 100 parts by mass of the polymer liquid crystal compound, <Interface Improver> it is preferable that the liquid crystal composition used for forming the specific polarizer layer contains an interface improver. In a case where the liquid crystal composition contains an interface improver, the smoothness of the coated surface is improved, the degree of alignment is improved, and cissing and unevenness are suppressed so that the in-plane uniformity is expected to be improved.

As the interface improver, interface improvers that allow liquid crystal compounds to be horizontally aligned on the coated surface side are preferable, the compounds described in paragraphs [0155] to [0170] of WO2016/009648A, and the compounds (horizontal alignment agents) described in paragraphs [0253] to [0293] of JP2011-237513A can be used.

In a case where the liquid crystal composition contains an interface improver, the content of the interface improver is preferably in a range of 0.001 to 5 parts by mass and more preferably in a range of 0.01 to 3 parts by mass with respect to 100 parts by mass which is the total amount of the dichroic material and the polymer liquid crystal compound in the liquid crystal composition.

<Polymerization Initiator>

The liquid crystal composition used for forming the specific polarizer layer may contain a polymerization initiator.

The polymerization initiator is not particularly limited, but a compound having photosensitivity, that is, a photopolymerization initiator is preferable.

As the photopolymerization initiator, various compounds can be used without any particular limitation. Examples of the photopolymerization initiator include α-carbonyl compounds (US2367661A and U.S. Pat. No. 2,367,670A), acyloin ether (U.S. Pat. No. 2,448,828A), α-hydrocarbon-substituted aromatic acyloin compounds (U.S. Pat. No. 2,722,512A), polynuclear quinone compounds (U.S. Pat. Nos. 3,046,127A and 2,951,758A), a combination of a triarylimidazole dimer and a p-aminophenyl ketone (U.S. Pat. No. 3,549,367A), acridine and phenazine compounds (JP1985-105667A (JP-S60-105667A) and U.S. Pat. No. 4,239,850A), oxadiazole compounds (U.S. Pat. No. 4,212,970A), o-acyloxime compounds (paragraph [0065] of JP2016-27384A), and acylphosphine oxide compounds (JP1988-40799B (JP-S63-40799B), JP 1993-29234B (JP-1105-29234B), JP1998-95788A (JP-H10-95788A), and JP1998-29997A (JP-H10-29997A)).

Commercially available products can also be used as such a photopolymerization initiator, and examples thereof include IRGACURE 184, IRGACURE 907, IRGACURE 369, IRGACURE 651, IRGACURE 819, and IRGACURE OXE-01 (all manufactured by BASF SE).

In a case where the liquid crystal composition contains a polymerization initiator, the content of the polymerization initiator is preferably in a range of 0.01 to 30 parts by mass and more preferably in a range of 0.1 to 15 parts by mass with respect to 100 parts by mass which is the total amount of the dichroic material and the liquid crystal compound in the present composition. The curability of the specific polarizer layer is enhanced in a case where the content of the polymerization initiator is 0.01 parts by mass or greater, and the alignment of the specific polarizer layer is enhanced in a ease where the content thereof is 30 parts by mass or less.
<Solvent>

From the viewpoints of the workability and the like, it is preferable that the liquid crystal composition used for forming the specific polarizer layer contains a solvent.

Examples of the solvent include organic solvents such as ketones (such as acetone, 2-butanone, methyl isobutyl ketone, cyclopentanone, and cyclohexanone), ethers (such as dioxane, tetrahydrofuran, 2-methyltetrahydrofbran, cyclopentyl methyl ether, tertrahydropyran, and dioxolanes), aliphatic hydrocarbons (such as hexane), alicyclic hydrocarbons (such as cyclohexane), aromatic hydrocarbons (such as benzene, toluene, xylene, and trimethylbenzene), carbon halides (such as dichloromethane, trichloromethane, dichloroethane, dichlorobenzene, and chlorotoluene), esters (such as methyl acetate, ethyl acetate, butyl acetate, and ethyl lactate), alcohols (such as ethanol, isopropanol, butanol, cyclohexanol, isopentyl alcohol, neopentyl alcohol, diacetone alcohol, and benzyl alcohol), cellosolves (such as methyl cellosolve, ethyl cellosolve, and 1,2-dimethoxyethane), cellosolve acetates, sulfoxides (such as dimethyl sulfoxide), amides (such as dimethylformamide, dimethylacetamide, N-methylpyrrolidone, and N-ethylpyrrolidone), and heterocyclic compounds (such as pyridine), and water. These solvents may be used alone or in combination of two or more kinds thereof.

Among these solvents, from the viewpoint of exhibiting the effect of the excellent solubility, ketones (particularly cyclopentanone and cyclohexanone), ethers (particularly tetrahydrofuran, cyclopentyl methyl ether, tetrahydropyran, and dioxolan), and amides (particularly dimethylformamide, dimethylacetamide, N-methylpyrrolidone, and N-ethylpyrrolidone) are preferable.

In a case where the colored composition contains a solvent, the content of the solvent is preferably in a range of 60% to 99% by mass, more preferably in a range of 70% to 95% by mass, and still more preferably in a range of 70% to 90% by mass with respect to the total mass of the colored composition. Further, the content thereof is preferably in a range of 80% to 99% by mass, more preferably in a range of 83% to 97% by mass, and still more preferably in a range of 85% to 95% by mass,

[Forming Method]

A method of forming the specific polarizer layer using the above-described liquid crystal composition is not particularly limited, and examples thereof include a method of sequentially performing a step of coating a photo-alignment layer (for example, the photo-alignment layer described below) with the liquid crystal composition to form a coating film (hereinafter, also referred to as a "coating film thrilling step") and a step of aligning a liquid crystal component contained in the coating film (hereinafter, also referred to as an "aligning step").

<Coating Film Forming Step>

The coating film forming step is a step of coating a photo-alignment layer with the liquid crystal composition to form a coating film.

The photo-alignment layer is easily coated with the liquid crystal composition by using the liquid crystal composition containing the above-described solvent or using a liquid such as a melt obtained by heating the liquid crystal composition.

Examples of the method of coating the photo-alignment layer with the liquid crystal composition include known methods such as a roll coating method, a gravure printing method, a spin coating method, a wire bar coating method, an extrusion coating method, a direct gravure coating method, a reverse gravure coating method, a die coating method, a spraying method, and an ink jet method.

<Aligning Step>

The aligning step is a step of aligning the liquid crystal component contained in the coating film. As a result, a specific polarizer layer is obtained.

Further, the liquid crystal component is a component that also includes a dichroic material having liquid crystallinity in a case where the above-described dichroic material has liquid crystallinity, in addition to the above-described liquid crystal compound.

The aligning step may include a drying treatment. Components such as a solvent can be removed from the coating film by performing the drying treatment. The drying treatment may be performed according to a method of allowing the coating film to stand at room temperature for a predetermined time (for example, natural drying) or a method of heating the coating film and/or blowing air to the coating film.

Here, the liquid crystal component contained in the liquid crystal composition may be aligned by performing the above-described coating film following step or drying treatment. For example, in an embodiment in which the liquid crystal composition is prepared as a coating solution containing a solvent, a coating film having light absorption anisotropy (that is, a specific polarizer layer) is obtained by drying the coating film and removing the solvent from the coating film.

In a case where the drying treatment is performed at a temperature higher than or equal to the transition temperature of the liquid crystal component contained in the coating film to the liquid crystal phase, the heat treatment described below may not be performed.

The transition temperature of the liquid crystal component contained in the coating film to the liquid crystal phase is preferably in a range of 10° C. to 250° C. and more preferably in a range of 25° C. to 190° C. from the viewpoint of the manufacturing suitability or the like. It is preferable that the transition temperature is 10° C. or higher from the viewpoint that a cooling treatment or the like for lowering the temperature to a temperature range in which a liquid crystal phase is exhibited is not necessary. Further, it is preferable that the transition temperature is 250° C. or lower from the viewpoint that a high temperature is not required even in a case of setting an isotropic liquid state at a temperature higher than the temperature range in which a liquid crystal phase is temporarily exhibited, and waste of thermal energy and deformation and deterioration of a substrate can be reduced.

It is preferable that the aligning step includes a heat treatment. In this manner, since the liquid crystal component contained in the coating film can be aligned, the coating film after being subjected to the heat treatment can be suitably used as the specific polarizer layer.

From the viewpoint of the manufacturing suitability, the heat treatment is performed at a temperature of preferably 10° C. to 250° C. and more preferably 25° C. to 190° C. Further, the heating time is preferably in a range of 1 to 300 seconds and more preferably in a range of 1 to 60 seconds.

The aligning step may include a cooling treatment performed after the heat treatment. The cooling treatment is a treatment of cooling the coating film after being heated to room temperature (20° C. to 25° C.). In this manner, the alignment of the liquid crystal component contained in the coating film can be fixed. The cooling means is not particularly limited and can be performed according to a known method.

The specific polarizer layer can be obtained by performing the above-described steps.

In the present embodiment, examples of the method of aligning the liquid crystal component contained in the coating film include a drying treatment and a heat treatment, but the method is not limited thereto, and the liquid crystal component can be aligned by a known alignment treatment.
<Other Steps>

The method of forming the specific polarizer layer may include a step of curing the specific polarizer layer after the aligning step (hereinafter, also referred to as a "curing step").

The curing step is performed by heating the specific polarizer layer and/or irradiating the layer with light (exposing the layer to light), for example, in a case where the specific polarizer layer contains a crosslinkable group (polymerizable group). Between these, it is preferable that the curing step is performed by irradiating the film with light.

In a case where the photo-alignment layer contains a compound containing a photoreactive radical polymerizable group, an unreacted radically polymerizable group can be allowed to remain on the surface of the photo-alignment layer using a method of allowing the photo-alignment layer not to contain a radical polymerization initiator or a method of exposing the photo-alignment layer in an environment with a high oxygen concentration. By reacting the unreacted radically polymerizable group present on the surface of the photo-alignment layer with the radically polymerizable group of the specific polarizer layer by performing the "curing step", the adhesiveness between the photo-alignment layer and the specific polarizer layer can be improved.

Various light sources such as infrared rays, visible light, and ultraviolet rays can be used as the light source for curing, but ultraviolet rays are preferable. In addition, ultraviolet rays may be applied while the film is heated during curing, or ultraviolet rays may be applied through a filter that transmits only a specific wavelength.

In a case where the exposure is performed while the film is heated, the heating temperature during the exposure depends on the transition temperature of the liquid crystal component contained in the specific polarizer layer to the liquid crystal phase, but is preferably in a range of 25° to 140° C.

Further, the exposure may be performed under a nitrogen atmosphere. In a case where the curing of the specific polarizer layer proceeds by radical polymerization, since the inhibition of polymerization by oxygen is reduced, it is preferable that exposure is performed in a nitrogen atmosphere.
[Thickness of Polarizer Layer]

In the laminate according to the embodiment of the present invention, the thickness of the polarizer layer is not particularly limited, but is preferably 10 μm or less, more preferably in a range of 0.1 to 5.0 μm, and still more preferably in a range of 0.3 to 1.5 μm from the viewpoint that the effects of the present invention are more excellent.
[4] Second Pressure-Sensitive Adhesive Layer As described above, the laminate according to the embodiment of the present invention includes a second pressure-sensitive adhesive layer.

Further, in a case where two or more pressure-sensitive adhesive layers are provided between the specific polarizer layer described above and the optically anisotropic layer described below, the second pressure-sensitive adhesive layer is a pressure-sensitive adhesive layer closest to the specific polarizer layer among the two or more pressure-sensitive adhesive layers.

From the viewpoint that the effects of the present invention are more excellent, it is preferable that the second pressure-sensitive adhesive layer is an adhesive layer.

The adhesive used for the adhesive layer is not particularly limited, but from the viewpoint that the effects of the present invention are more excellent, a polyvinyl alcohol (PVA)-based adhesive or a curable adhesive is preferable, a curable adhesive is more preferable, and a ultraviolet (UV) adhesive is still more preferable.

Specific examples of the curable adhesive include an active energy ray-curable adhesive (particularly a UV adhesive) such as a (meth)acrylate-based adhesive and a cationic polymerization curable adhesive. Further, the (meth)acrylate indicates acrylate and/or methacrylate. Examples of the curable component in the (meth)acrylate-based adhesive include a compound containing a meth)acryloyl group and a compound containing a vinyl group.

Further, as the cationic polymerization curable adhesive, a compound containing an epoxy group or an oxetanyl group can also be used. The compound containing an epoxy group is not particularly limited as long as the compound contains at least two epoxy groups in a molecule, and various generally known curable epoxy compounds can be used. Preferred examples of the epoxy compound include a compound (aromatic epoxy compound) containing at least two epoxy groups and at least one aromatic ring in a molecule and a compound (alicyclic epoxy compound) containing at least two epoxy groups in a molecule, in which at least one of the epoxy groups is formed between two adjacent carbon atoms constituting an alicyclic ring.
[Thickness of the Second Pressure-Sensitive Adhesive Layer]

The thickness of the second pressure-sensitive adhesive layer is not particularly limited, but is preferably in a range of 0.1 to 10 μm, more preferably in a range of 0.3 to 3 μm, and still more preferably in a range of 0.5 to 1.5 μm from the viewpoint that the effects of the present invention are more excellent,
[5] Optically Anisotropic Layer As described above, the laminate according to the embodiment of the present invention includes an optically anisotropic layer.

The optically anisotropic layer is not particularly limited as long as the layer has optical anisotropy, but from the viewpoint that the effects of the present invention are more excellent, a phase difference layer is preferable, and a λ/4 plate is more preferable.

Here, the "λ/4 plate" is a plate having a λ/4 function, specifically, a plate having a function of converting linearly polarized light having a specific wavelength into circularly polarized light (or converting circularly polarized light into linearly polarized light).

Specific examples of the λ/4 plate include those described in US2015/0277006A. For example, specific examples of a form in which the λ/4 plate has a single-layer structure include a stretched polymer film and a phase difference film in which an optically anisotropic layer having a λ/4 function is provided on a support. Further, specific examples of a form in which the λ/4 plate has a multilayer structure include a broadband λ/4 plate obtained by laminating a λ/4 plate and a λ/4 plate.

From the viewpoint that the effects of the present invention are more excellent, it is preferable that the λ/4 plate is formed by being coated with a liquid crystal composition.

It is more preferable that the phase difference film provided with the optically anisotropic layer having a λ/4 function is a phase difference film formed of one or more layers containing at least one liquid crystal compound (such as a disk-like liquid crystal compound or a rod-like liquid crystal compound) formed by polymerizing a liquid crystal monomer exhibiting a nematic liquid crystal layer or a smectic liquid crystal layer.

Further, it is still more preferable to use a liquid crystal compound having reciprocal wavelength dispersibility as the λ/4 plate having excellent optical performance. Specifically, the liquid crystal compound represented by Formula (II) described in WO2017/043438A is preferably used. In regard to a method of preparing the λ/4 plate formed of a liquid crystal compound having reciprocal wavelength dispersibility, the description of Examples 1 to 10 of WO2017/043438A and Example 1 of JP2016-91022A can be referred to.

[Thickness of Optically Anisotropic Layer]

The thickness of the optically anisotropic layer (particularly, the λ/4 plate) is not particularly limited, but is preferably in a range of 0.1 to 100 μm and more preferably in a range of 0.5 to 5 μm from the viewpoint that the effects of the present invention are more excellent.

[6] Distance A

The distance A between the first pressure-sensitive adhesive layer and the specific polarizer layer is 10 μm or less.

From the viewpoint that the effects of the present invention are more excellent, the distance A is preferably 5 μm or less and more preferably 3 μm or less. The lower limit of the distance A is not particularly limited and is 0 μm.

[7] Distance B

The distance B between the specific polarizer layer and the second pressure-sensitive adhesive layer is 10 μm or less.

From the viewpoint that the effects of the present invention are more excellent, the distance B is preferably 5 μm or less and more preferably 3 μm or less. The lower limit of the distance B is not particularly limited and is 0 μm.

[8] Functional Layer

The laminate according to the of the present invention may include layers other than the above-described layers. Examples of such layers include functional layers such as an alignment layer (particularly a photo-alignment layer), a cured layer, an oxygen blocking layer, and a UV absorbing layer.

From the viewpoint that the effects of the present invention are more excellent, it is preferable that the laminate according to the embodiment of the present invention includes a functional layer in at least one of between the first pressure-sensitive adhesive layer and the specific polarizer layer or between the specific polarizer layer and the second pressure-sensitive adhesive layer.

From the viewpoint that the effects of the present invention are more excellent, it is preferable that the laminate according to the embodiment of the present invention includes a cured layer and an oxygen blocking layer between the first pressure-sensitive adhesive layer and the specific polarizer layer.

From the viewpoint that the effects of the present invention are more excellent, it is preferable that the laminate according to the embodiment of the present invention includes an alignment layer (particularly a photo-alignment layer) between the specific polarizer layer and the second pressure-sensitive adhesive layer.

From the viewpoint that the effects of the present invention are more excellent, it is preferable that the laminate according to the embodiment of the present invention does not include a cellulose acylate film (particularly a cellulose triacetate (TAC)

[Alignment Layer]

Examples of the kind of the alignment layer include a photo-alignment layer and a rubbing treatment alignment layer. Among these, from the viewpoint that the effects of the present invention are more excellent, a photo-alignment layer is preferable.

[Photo-Alignment Layer]

The photo-alignment layer is a layer to which an alignment regulation force is applied by light.

From the viewpoint that the effects of the present invention are more excellent, it is preferable that the photo-alignment layer contains a cinnamoyl group.

From the viewpoint that the effects of the present invention are more excellent, it is preferable that the photo-alignment layer is an alignment layer to which an alignment regulation force is applied, which is obtained by performing a step (coating film forming step) of coating a polymer film with a composition (hereinafter, also referred to as a "composition for forming a photo-alignment layer") that contains a compound (photoactive compound) containing a photoreactive group, a step (drying step) of heating the coating film so that the coating film is dried, and a step (light irradiation step) of irradiating the dried coating film with polarized light or nonpolarized light in a direction oblique to the surface of the coating film.

Hereinafter, "the effects of the present invention from the optical laminate to be obtained are more excellent" is also simply referred to as "the effects of the present invention are more excellent".

<Coating Film Forming Step>

As described above, the coating film forming step is a step of coating a polymer film with the composition for forming a photo-alignment layer to form a coating film.

(Polymer Film)

The polymer film is not particularly limited, and a polymer film that is commonly used (for example, a polarizer protective film) can be used.

Specific examples of the polymer constituting the polymer film include a cellulose-based polymer, an acrylic polymer containing an acrylic acid ester polymer such as polymethyl methacrylate or a lactone ring-containing polymer, a thermoplastic norbornene-based polymer, a polycarbonate-based polymer, a polyester-based polymer such as polyethylene terephthalate or polyethylene naphthalate, a styrene-based polymer such as polystyrene or an acrylonitrile-styrene copolymer (AS resin), a polyolefin-based polymer such as polyethylene, polypropylene, or an ethylene-propylene copolymer, a vinyl chloride-based polymer, an amide-based polymer such as nylon or aromatic polyamide, an imide-based polymer, a sulfone-based polymer, a polyether sulfone-based polymer, a polyether ether ketone-based polymer, a polyphenylene sulfide-based polymer, a vinylidene chloride-based polymer, a vinyl alcohol-based polymer, a vinyl butyral-based polymer, an arylate-based polymer, a polyoxymethylene-based polymer, an epoxy-based polymer, and a polymer obtained by mixing such polymers.

Among these, a cellulosic polymer represented by triacetyl cellulose (hereinafter, also referred to as "cellulose acylate") can be preferably used.

Further, from the viewpoint of processability and optical performance, an acrylic polymer is also preferably used.

Examples of the acrylic polymer include polymethyl methacrylate and the lactone ring-containing polymer and the like described in paragraphs [0017] to [0107] of JP2009-98605A.

In the present invention, a cellulose-based polymer or a polyester-based polymer can be preferably used in an aspect of using a polymer film that can be peeled off from the prepared optical laminate.

Further, in the present invention, it is preferable that the polymer film is transparent.

Here, the "transparent" in the present invention indicates that the transmittance of visible light is 60% or greater, preferably 80% or greater, and particularly preferably 90% or greater.

The thickness of the polymer film is not particularly limited, but is preferably 40 μm or less from the viewpoint that the thickness of the optical laminate can be reduced. The lower limit is not particularly limited, but is typically 5 μm or greater.

(Photoactive Compound)

As described above, the composition for forming a photo-alignment layer contains a compound containing a photo-reactive group (photoactive compound).

The photoreactive group denotes a group that produces a liquid crystal alignment ability by irradiating with light. Specifically, the photoreactive group causes the photoreaction that is the origin of the liquid crystal alignment ability such as alignment induction or isomerization reaction, dimerization reaction, photocrosslinking reaction, or photo-degradation reaction of molecules (also referred to as photoactive compounds) generated by irradiation with light.

As the photoreactive group, from the viewpoint that the effects of the present invention are more excellent, those having an unsaturated bond and particularly a double bond are preferable, and examples thereof include a group containing at least one selected from the group consisting of a carbon-carbon double bond (C=C bond), a carbon-nitrogen double bond (C=N bond), a nitrogen-nitrogen double bond (N=N bond), and carbon-oxygen double bond (C=O bond).

Examples of the photoreactive group having a C=C bond include a vinyl group, a polyene group, a stilbene group, a stilbazole group, a stilbazolium group, a chalcone group, and a cinnamoyl group.

Examples of the photoreactive group having a C=N bond include groups having structures such as an aromatic Schiff base and an aromatic hydrazone.

Examples of the photoreactive group having a C=O bond include a benzophenone group, a coumarin group, an anthraquinone group, and a maleimide group.

Examples of the photoreactive group having an N=N bond (hereinafter, also referred to as an "azo group") include an azobenzene group, an azonaphthalene group, an aromatic heterocyclic azo group, a bisazo group, a formazan group, and a group having azoxybenzene as a basic structure.

These groups may have a substituent such as an alkyl group, an alkoxy group, an aryl group, an allyloxy group, a cyano group, an alkoxycarbonyl group, a hydroxyl group, a sulfonic acid group, and a halogenated alkyl group.

Among these groups, a cinnamoyl group or an azobenzene group is preferable from the viewpoint that the polarized light irradiation amount required for photo-alignment is relatively small, and a photo-alignment layer having excellent thermal stability and temporal stability is easily obtained.

(1) Preferred Embodiment 1: Photoactive Compound Containing Azobenzene Group

As the photoactive compound containing an azobenzene group, a photoactive compound represented by Formula (I) is particularly preferable.

Formula (I)

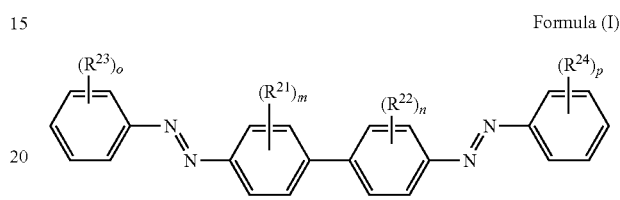

In the formula, $R^{21}$ to $R^{24}$ each independently represent a hydrogen atom or a substituent, where at least one of the groups represented by $R^{21}$ to $R^{24}$ is a carboxyl group or a sulfo group, m represents an integer of 1 to 4, n represents an integer of 1 to 4, o represents an integer of 1 to 5, p represents an integer of 1 to 5, and a plurality of $R^{21}$'s to $R^{24}$'s may be the same as or different from each other in a case where m, n, o, and p represent an integer of 2 or greater.

In Formula, examples of the substituent represented by $R^{21}$ to $R^{24}$ include the following groups.

Examples of the substituent include a carboxyl group (which may form a salt with an alkali metal, and a carboxyl group that does not form a salt or a carboxyl group that forms a sodium salt is preferable, and a carboxyl group that forms a sodium salt is more preferable), a sulfo group (which may form a salt with an alkali metal, and a sulfo group that does not limn a salt or a sulfo group that forms a sodium salt is preferable, and a sulfo group that forms a sodium salt is more preferable), an alkyl group (having preferably 1 to 20 carbon atoms, more preferably 1 to 12 carbon atoms, and particularly preferably 1 to 8 carbon atoms, and examples thereof include a methyl group, an ethyl group, an isopropyl group, a tort-butyl group, an n-octyl group, an n-decyl group, an n-hexadecyl group, a cyclopropyl group, a cyclopentyl group, and cyclohexyl group), alkenyl group (having preferably 2 to 20 carbon atoms, more preferably 2 to 12 carbon-atoms, and particularly preferably 2 to 8 carbon atoms, and examples thereof include a vinyl group, an aryl group, a 2-butenyl group, and a 3-pentenyl group), an alkynyl group (having preferably 2 to 20 carbon atoms, more preferably 2 to 12 carbon atoms, and particularly preferably 2 to 8 carbon atoms, and examples thereof include a propargyl group and a 3-pentynyl group), an aryl group (having preferably 6 to 30 carbon atoms, more preferably 6 to 20 carbon atoms, and particularly preferably 6 to 12 carbon atoms, and examples thereof include a phenyl group, a 2,6-diethylphenyl group, a 3,5-ditrifluoromethylphenyl group, a naphthyl group, and a biphenyl group), and a substituted or unsubstituted amino group (having preferably 0 to 20 carbon atoms, more preferably 0 to 10 carbon atoms, and particularly preferably 0 to 6 carbon atoms and examples thereof include an unsubstituted amino group, a methylamino group, a dimethylamino group, a diethylamino group, and an anilino group), an alkoxy group (having preferably 1 to 20 carbon atoms, more preferably 1 to 10 carbon atoms, and particularly preferably 1 to 6 carbon atoms, and examples thereof include a methoxy group, an ethoxy group, and a butoxy group), an alkoxycarbonyl group (having preferably 2 to 20 carbon atoms, more preferably 2 to 10 carbon atoms, and particularly preferably 2 to 6 carbon atoms, and examples thereof include a methoxycarbonyl group and an ethoxycarbonyl group), an acyloxy group (having preferably 2 to 20 carbon atoms, more preferably 2 to 10 carbon atoms, and particularly preferably 2 to 6 carbon atoms, and examples thereof include an acetoxy group and a benzoyloxy group), an acylamino group (having preferably 2 to 20 carbon atoms, more preferably 2 to 10 carbon atoms, and particularly preferably 2 to 6 carbon atoms, and examples thereof include an acetylamino group and a benzoylamino group), an alkoxycarbonylamino group (having preferably 2 to 20 carbon atoms, more preferably 2 to 10 carbon atoms, and particularly preferably 2 to 6 carbon atoms, and examples thereof include a methoxycarbonylamino group), an aryloxycarbonylamino group (having preferably 7 to 20 carbon atoms, more preferably 7 to 16 carbon atoms, and particularly preferably 7 to 12 carbon atoms, and examples thereof include a phenyloxycarbonylamino group), a sulfonylamino group (having preferably 1 to 20 carbon atoms, more preferably 1 to 10 carbon atoms, and particularly preferably 1 to 6 carbon atoms, and examples thereof include a methanesulfonylamino group and a benzenesulfonylamino group), a sulfamoyl group (having preferably 0 to 20, more preferably 0 to 10 carbon atoms, and particularly preferably 0 to 6 carbon atoms, and examples thereof include an unsubstituted sulfamoyl group, a methylsulfamoyl group, a dimethylsulfamoyl group, and a phenylsulfamoyl group), and a carbamoyl group (having preferably 1 to 20 carbon atoms, more preferably 1 to 10 carbon atoms, and particularly preferably 1 to 6 carbon atoms, and examples thereof include unsubstituted carbamoyl group, a methylcarbamoyl group, a diethylcarbamoyl group, and a phenylcarbamoyl group), an alkylthio group (having preferably 1 to 20 carbon atoms, more preferably 1 to 10 carbon atoms, and particularly preferably 1 to 6 carbon atoms, and examples thereof include a methylthio group and an ethylthio group), an arylthio group (having preferably 6 to 20 carbon atoms, more preferably 6 to 16 carbon atoms, and particularly preferably 6 to 12 carbon atoms, and examples thereof include a phenylthio group), a sulfonyl group (having preferably 1 to 20 carbon atoms, more preferably 1 to 10 carbon atoms, and particularly preferably 1 to 6 carbon atoms, and examples thereof include a mesyl group and a tosyl group), a sulfinyl group (having preferably 1 to 20 carbon atoms, more preferably 1 to 10 carbon atoms, and particularly 1 to 6 carbon atoms, and examples thereof include a methanesulfinyl group and a benzenesulfinyl group), a ureido group (having preferably 1 to 20 carbon atoms, more preferably 1 to 10 carbon atoms, and particularly preferably 1 to 6 carbon atoms, and examples thereof include an unsubstituted ureido group, a methyl ureido group, and a phenyl ureido group), a phosphoric acid amide group (having preferably 1 to 20 carbon atoms, more preferably 1 to 10 carbon atoms, and particularly preferably 1 to 6 carbon atoms, and examples thereof include a diethyl phosphoric acid amide group and a phenyl phosphoric acid amide group), a hydroxy group, a mercapto group, a halogen atom (such as a fluorine atom, a chlorine atom, a bromine atom, or an iodine atom), a cyano group, a nitro group, a hydroxamic acid group, a sulfino group, a hydrazino group, an imino group, a heterocyclic group (having preferably 1 to 30 carbon atoms and more preferably 1 to 12 carbon atoms, and examples thereof include a heterocyclic group having heteroatoms such as nitrogen atoms, oxygen atoms, and sulfur atoms, and specific examples thereof include an imidazolyl group, pyridyl group, a quinolyl group, a furyl group, a piperidyl group, a morpholino group, a benzoxazolyl group, a benzoimidazolyl group, and a benzothiazolyl group), and a silyl group (having preferably 3 to 40 carbon atoms, more preferably 3 to 30 carbon atoms, and particularly preferably 3 to 24 carbon atoms, and examples thereof include a trimethylsilyl group and a triphenylsilyl group).

These substituents may be further substituted with these substituents. Further, in a case where two or more substituents are present, these may be the same as or different from each other. Further, these may be bonded to each other to form a ring where possible. The group represented by any of $R^{21}$ to $R^{24}$ may be a polymerizable group or a substituent containing a polymerizable group.

In Formula (I), as the group represented by any of $R^{21}$ to $R^{24}$, from the viewpoint that the effects of the present invention are more excellent, a hydrogen atom, a carboxyl group, a sulfo group, a halogen atom, an alkyl group, an alkoxy group, a cyano group, a nitro group, an alkoxycarbonyl group, or a carbamoyl group is preferable, a hydrogen atom, a carboxyl group, a sulfo group, a halogen atom, a halogenated methyl group, a halogenated methoxy group, a cyano group, a nitro group, or a methoxycarbonyl group is more preferable, and a hydrogen atom, a carboxyl group, a sulfo group, a halogen atom, a cyano group, or a nitro group is particularly preferable.

At least one of the groups represented by $R^{21}$ to $R^{24}$ is a carboxyl group or a sulfo group. The substitution position of the carboxyl group or the sulfo group is not particularly limited, but from the viewpoint of photoactivation, it is preferable that at least one $R^{21}$ and/or at least one $R^{22}$ represent a sulfo group and more preferable that at least one $R^{21}$ and at least one $R^{22}$ represent a sulfo group. From the same viewpoint as described above, it is preferable that at least one $R^{23}$ and or at least one $R^{24}$ represent a carboxyl group and more preferable that at least one $R^{23}$ and at least one $R^{24}$ represent a carboxyl group. It is still more preferable that $R^{23}$ and $R^{24}$ substituted at the meta position with respect to an azo group represent a carboxyl group.

In Formula (I), m represents an integer of 1 to 4, n represents an integer of 1 to 4, o represents an integer of 1 to 5, and p represents an integer of 1 to 5. It is preferable that m represents an integer of 1 or 2, n represents an integer of 1 or 2, o represents an integer of 1 or 2, and p represents an integer of 1 or 2.

Hereinafter, specific examples of the compound represented by Formula (I) will be described below, but the present invention is not limited to the following specific examples.

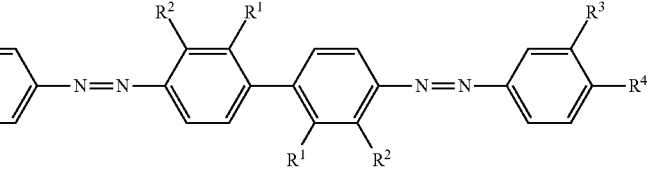

| No. | R¹ | R² | R³ | R⁴ |
|---|---|---|---|---|
| E-1 | —SO₃Na | —H | —COOH | —OH |
| E-2 | —H | —SO₃Na | —COOH | —OH |
| E-3 | —SO₃Na | —H | —COONa | —OH |
| E-4 | —H | —SO₃Na | —COONa | —OH |
| E-5 | —CH₃ | —H | —COONa | —OH |
| E-6 | —H | —CH₃ | —COONa | —OH |
| E-7 | —H | —OCH₃ | —COONa | —OH |
| E-8 | —H | —OCF₃ | —COONa | —OH |
| E-9 | —H | —Cl | —COONa | —OH |
| E-10 | —H | —CN | —COONa | —OH |
| E-11 | —H | —NO₂ | —COONa | —OH |
| E-12 | —COOCH₂ | —H | —COONa | —OH |
| E-13 | —CONH₂ | —H | —COONa | —OH |
| E-14 | —SO₂NH₂ | —H | —COONa | —OH |
| E-15 | —SO₃Na | —H | —COONa | —OH |
| E-16 | —SO₃Na | —H | —CH₂OH | —OH |
| E-17 | —H | —SO₃Na | —CH₂OH | —OH |
| E-18 | —SO₃Na | —H | —COOH | 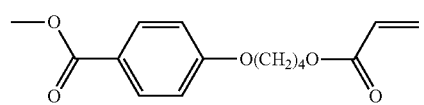 |
| E-19 | —H | —SO₃Na | —COOH | 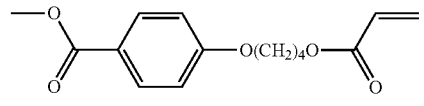 |
| E-20 | —CH₃ | —H | —COONa | 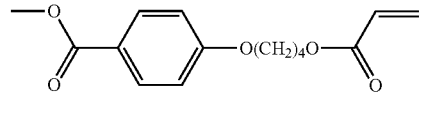 |
| E-21 | —H | —CH₃ | —COONa | 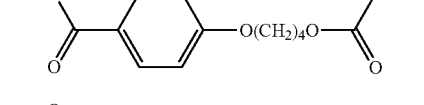 |
| E-22 | —SO₃Na | —H | —CF₃ | 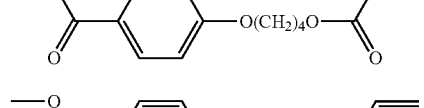 |
| E-23 | —H | —SO₃Na | —CF₃ | 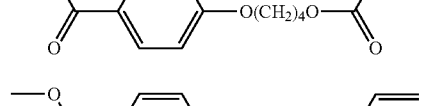 |
| E-24 | —SO₃Na | —H | —COOH | 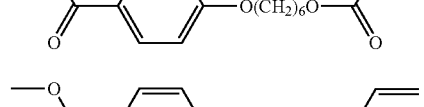 |
| E-25 | —CH₃ | —H | —COONa | 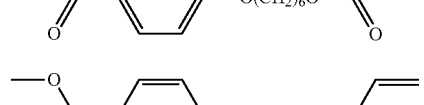 |
| E-26 | —SO₃Na | —H | —CF₃ | 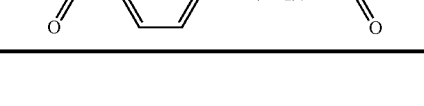 |

In the present invention, from the viewpoint that the degree of alignment is excellent, as the compound containing an azo group (particularly, an azobenzene group) having a nitrogen-nitrogen double bond (N=N bond), a low-molecular-weight compound represented by any of Formulae E-1 to E-17 and containing no polarizable group having a molecular weight of 1000 or less is preferable.

(2) Preferred Embodiment 2: Photoactive Compound Containing Cinnamoyl Group

As the photoactive compound containing a cinnamoyl group, a polymer is preferable from the viewpoint that the influence of contact with the photo-alignment layer is small.

Further, a polymer containing a cinnamoyl group and a crosslinkable group is preferable from the viewpoint that the influence of contact with the photo-alignment layer is further reduced.

The crosslinkable group may be a group that is crosslinked by causing a crosslinking reaction, and examples thereof include a cationically polymerizable group such as an epoxy group, and a radically polymerizable group such as an acrylate or a methacrylate.

Further, in order to improve the adhesiveness, it is still more preferable that the coating film of the photo-alignment layer contains both a cationically polymerizable group and a radically polymerizable group from the viewpoint of being functionally separated and used.

Suitable examples of the polymer containing a cinnamoyl group and a crosslinkable group include a photo-alignment copolymer having a repeating unit A containing a cinnamoyl group represented by Formula (A) and a repeating unit B containing a crosslinkable group represented by Formula (B).

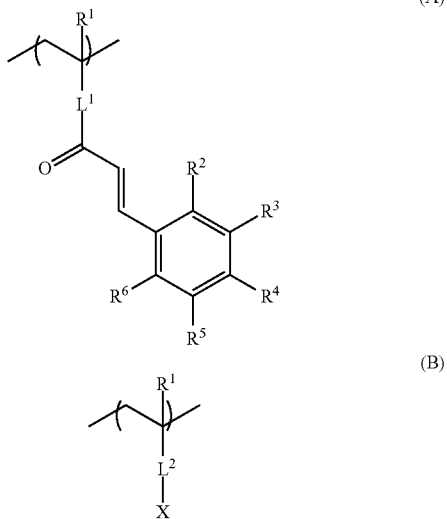

In Formula (A), $R^1$ represents a hydrogen atom or a methyl group. $L^1$ represents a divalent linking group having a nitrogen atom and a cycloalkane ring, and some carbon atoms constituting the cycloalkane ring may be substituted with heteroatoms selected from the group consisting of nitrogen, oxygen, and sulfur.

$R^2$, $R^3$, $R^4$, $R^5$, and $R^6$ each independently represent a hydrogen atom or a substituent, and two adjacent groups from among $R^2$, $R^3$, $R^4$, $R^5$, and $R^6$ may be bonded to each other to form a ring.

In Formula (B), $R^7$ represents a hydrogen atom or a methyl group, $L^2$ represents a divalent linking group, and X represents a crosslinkable, group.

In the present invention, the solvent resistance of the photo-alignment layer to be obtained and the aligning properties of the polymer liquid crystal compound (hereinafter, referred to as "liquid crystal aligning properties") during formation of the light absorption anisotropic layer are enhanced by using a photo-alignment copolymer having a repeating unit A containing a cinnamoyl group represented by Formula (A) and a repeating unit B containing a crosslinkable group represented by Formula (B).

The reason for this is not clear, but the present inventors presume as follows.

That is, it is considered that in a case where the divalent linking group represented by $L^1$ in Formula (A) has a nitrogen atom and a cycloalkane ring, the hydrogen bond properties and the molecular rigidity are enhanced so that molecular motion is suppressed, and thus the solvent resistance is improved.

Similarly, it is considered that in a case where the divalent linking group represented by $L^1$ in Formula (A) has a nitrogen atom and a cycloalkane ring, the glass transition temperature of the copolymer is increased, the temporal stability of the photo-alignment layer to be obtained is improved, and thus the liquid crystal aligning properties are enhanced regardless of the timing of formation of the optically anisotropic layer.

Next, the divalent linking group having a nitrogen atom and a cycloalkane ring which is represented by $L^1$ in Formula (A) will be described. In the present invention, as described above, some carbon atoms constituting the cycloalkane ring may be substituted with a heteroatom selected from the group consisting of nitrogen, oxygen, and sulfur. Further, in a case where some carbon atoms constituting the cycloalkane ring are substituted with nitrogen atoms, the divalent linking group may not have a nitrogen atom separately from the cycloalkane ring.

Further, as the cycloalkane ring contained in the divalent linking group represented by $L^1$ in Formula (A), a cycloalkane ring having 6 or more carbon atoms is preferable, and specific examples thereof is a cyclohexane ring, a cycloheptane ring, a cyclooctane ring, a cyclododecane ring, and a cyclodocosane ring.

In the present invention, from the viewpoint of further enhancing the liquid crystal aligning properties, it is preferable that $L^1$ in Formula (A) represents a divalent linking group represented by any of Formulae (1) to (10).

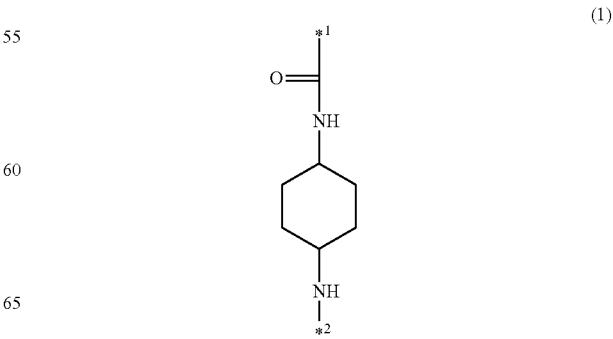

(2) 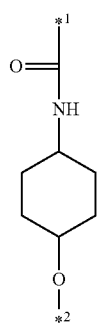

(3) 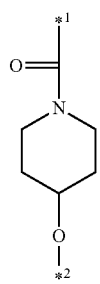

(4) 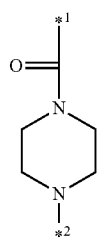

(5) 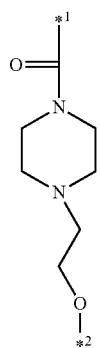

(6) 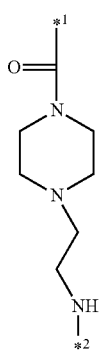

(7) 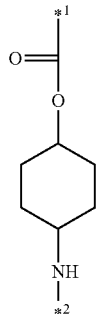

(8) 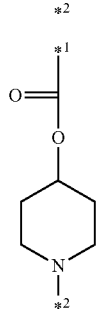

(9) 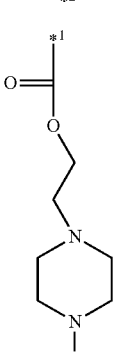

(10) 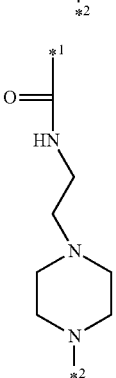

In Formulae (1) to (10), *1 represents a bonding position with respect to the carbon atom constituting the main chain in Formula (A), and *2 represents a bonding position with respect to the carbon atom constituting the carbonyl group in Formula (A).

Among the divalent linking groups represented by any of Formulae (1) to (10), from the viewpoint of enhancing the balance between the solubility in a solvent used for forming the photo-alignment layer and the solvent resistance of the photo-alignment layer to be obtained, a divalent linking group represented by any of Formulae (2), (3), (7), and (8) is preferable.

Next, the substituents represented by $R^2$, $R^3$, $R^4$, $R^5$, and R in Formula (A) will be described. Further, $R^2$, $R^3$, $R^4$, $R^5$, and $R^6$ in Formula (A) may represent a hydrogen atom in place of a substituent, as described above.

As the substituent represented by any one of $R^2$, $R^3$, $R^4$, $R^5$, and $R^6$ in Formula (A), from the viewpoint that the cinnamoyl group easily interacts with the liquid crystal compound and the liquid crystal aligning properties are further enhanced, a halogen atom, a linear, branched, or cyclic alkyl group having 1 to 20 carbon atoms, a linear halogenated alkyl group having 1 to 20 carbon atoms, an alkoxy group having 1 to 20 carbon atoms, an aryl group having 6 to 20 carbon atoms, an aryloxy group having 6 to 20 carbon atoms, a cyano group, an amino group, or a group represented by Formula (11) is preferable.

(11)

Here, in Formula (11), * represents a bonding position with respect to the benzene ring in Formula (A), and $R^9$ represents a monovalent organic group.

Examples of the halogen atom include a fluorine atom, a chlorine atom, a bromine atom, and an iodine atom. Among these, a fluorine atom and a chlorine atom are preferable.

In regard to the linear, branched, or cyclic alkyl group having 1 to 20 carbon atoms, an alkyl group having 1 to 6 carbon atoms is preferable as the linear alkyl group, and specific examples thereof include a methyl group, an ethyl group, and an n-propyl group.

An alkyl group having 3 to 6 carbon atoms is preferable as the branched alkyl group, and specific examples thereof include an isopropyl group and a tert-butyl group.

An alkyl group having 3 to 6 carbon atoms is preferable as the cyclic alkyl group, and specific examples thereof include a cyclopropyl group, a cyclopentyl group, and a cyclohexyl group.

As the linear halogenated alkyl group having 1 to 20 carbon atoms, a fluoroalkyl group having 1 to 4 carbon atoms is preferable, and specific examples thereof include a trifluoromethyl group, a perfluoroethyl group, a perfluoropropyl group, and a perfluorobutyl group. Among these, a trifluoromethyl group is preferable.

As the alkoxy group having 1 to 20 carbon atoms, an alkoxy group having 1 to 1.8 carbon atoms is preferable, an alkoxy group having 6 to 18 carbon atoms is more preferable, and an alkoxy group having 6 to 14 carbon atoms is still more preferable. Specific suitable examples thereof include a methoxy group, an ethoxy group, an n-butoxy group, a methoxyethoxy group, an n-hexyloxy group, an n-octyloxy group, an n-decyloxy group, an n-dodecyloxy group, and an n-tetradecyloxy group. Among these, an n-hexyloxy group, an n-octyloxy group, an n-decyloxy group, an n-dodecyloxy group, and an n-tetradecyloxy group are more preferable.

An aryl group having 6 to 20 carbon atoms is preferable as the aryl group having 6 to 12 carbon atoms, and specific examples thereof include a phenyl group, an α-methylphenyl group, and a naphthyl group. Among these, a phenyl group is preferable.

An aryloxy group having 6 to 12 carbon atoms is preferable as the aryloxy group having 6 to 20 carbon atoms, and specific examples thereof include a phenyloxy group and a 2-naphthyloxy group. Among these, a phenyloxy group is preferable.

Examples of the amino group include a primary amino group (—$NH_2$), a secondary amino group such as a methylamino group, and a tertiary amino group such as a dimethylamino group, a diethylamine group, a dibenzylamino group, or a group having a nitrogen atom of a nitrogen-containing heterocyclic compound (for example, pyrrolidine, piperidine, or piperazine) as a bonding site.

In regard to the group represented by Formula (11), examples of the monovalent organic group represented by $R^9$ in Formula (11) include a linear or cyclic alkyl group having 1 to 20 carbon atoms.

As the linear alkyl group, an alkyl group having 1 to 6 carbon atoms is preferable, and specific examples thereof include a methyl group, an ethyl group, and an n-propyl group. Among these, a methyl group or an ethyl group is preferable.

As the cyclic alkyl group, an alkyl group having 3 to 6 carbon atoms is preferable, and specific examples thereof include a cyclopropyl group, a cyclopentyl group, and a cyclohexyl group.

Among these, a cyclohexyl group is preferable.

As the monovalent organic group represented by $R^9$ in Formula (11), a combination of a plurality of the linear alkyl groups and a plurality of the cyclic alkyl groups described above directly or via a single bond may be used.

In the present invention, it is preferable that at least $R^4$ among $R^2$, $R^3$, $R^4$, $R^5$, and $R^6$ in Formula (A) represents the above-described substituent from the viewpoint that the cinnamoyl group easily interacts with the liquid crystal compound and the liquid crystal aligning properties are further enhanced and more preferable that all $R^2$, $R^3$, $R^5$, and $R^6$ represent a hydrogen atom from the viewpoint that the linearity of the photo-alignment copolymer to be obtained is improved, the cinnamoyl group easily interacts with the liquid crystal compound, and the liquid crystal aligning properties are further enhanced.

In the present invention, from the viewpoint of improving the reaction efficiency in a case of irradiating the photo-alignment layer to be obtained with light, it is preferable that $R^4$ in Formula (A) represents an electron-donating substituent.

Here, the electron-donating substituent (electron-donating group) is a substituent having a Hammett's value (Hammett's substituent constant σp value) of 0 or less, and among the above-described substituents, an alkyl group, a halogenated alkyl group, and an alkoxy group are exemplified.

Among these, an alkoxy group is preferable, an alkoxy group having 6 to 16 carbon atoms is more preferable from the viewpoint that the liquid crystal aligning properties are further enhanced, and an alkoxy group having 7 to 10 carbon atoms is still more preferable.

Next, the divalent linking group represented by $L^2$ in Formula (B) will be described.

From the viewpoint that the cinnamoyl group easily interacts with the liquid crystal compound and the liquid crystal aligning properties are further enhanced, as the divalent linking group, a divalent linking group obtained by combining at least two or more groups selected from the group consisting of a linear, branched, or cyclic alkylene group having 1 to 18 carbon atoms which may have a substituent, an arylene group having 6 to 12 carbon atoms which may have a substituent, an ether group (—O—) a carbonyl group (—C(=O)—), and an imino group (—NH—) which may have a substituent is preferable.

Here, examples of the substituent that the alkylene group, the amylene group, and the imino group may have include a halogen atom, an alkyl group, an alkoxy group, an aryl group, an aryloxy group, a cyano group, a carboxy group, an alkoxycarbonyl group, and a hydroxyl group.

Examples of the halogen atom include a fluorine atom, a chlorine atom, a bromine atom, and an iodine atom. Among these, a fluorine atom and a chlorine atom are preferable.

As the alkyl group, for example, a linear, branched, or cyclic alkyl group having 1 to 18 carbon atoms is preferable, an alkyl group having 1 to 8 carbon atoms (such as a methyl group, an ethyl group, a propyl group, an isopropyl group, an n-butyl group, an isobutyl group, a sec-butyl group, a t-butyl group, or a cyclohexyl group) is more preferable, an alkyl group having 1 to 4 carbon atoms is still more preferable, and a methyl group or an ethyl group is particularly preferable.

As the alkoxy group, for example, an alkoxy group having 1 to 18 carbon atoms is preferable, an alkoxy group having 1 to 8 carbon atoms (such as a methoxy group, an ethoxy group, an n-butoxy group, or a methoxyethoxy group) is more preferable, an alkoxy group having 1 to 4 carbon atoms is still more preferable, and a method group or an ethoxy group is particularly preferable.

Examples of the aryl group include an aryl group having 6 to 12 carbon atoms, and specific examples thereof include a phenyl group, an α-methylphenyl group, and a naphthyl group. Among these, a phenyl group is preferable.

Examples of the aryloxy group include phenoxy, naphthoxy, imidazolyloxy, benzimidazolyloxy, pyridine-4-yloxy, pyrimidinyloxy, quinazolinyloxy, purinyloxy, and thiophene-3-yloxy.

Examples of the alkoxycarbonyl group include methoxycarbonyl and ethoxycarbonyl.

In regard to the linear, branched, or cyclic alkylene group having 1 to 18 carbon atoms, specific examples of the linear alkylene group includes a methylene group, an ethylene group, a propylene group, a butylene group, a pentylene group, a hexylene group, a decylene group, an undecylene group, a dodecylene group, a tridecylene group, a tetradecylene group, a pentadecylene group, a hexadecylene group, a heptadecylene group, and an octadecylene group.

Further, specific examples of the branched alkylene group include a dimethylmethylene group, a methylethylene group, a 2,2-dimethylpropylene group, and a 2-ethyl-2-methylpropylene group.

Further, specific examples of the cyclic alkylene group include a cyclopropylene group, a cyclobutylene group, a cyclopentylene group, a cyclohexylene group, a cyclooctylene group, a cyclodecylene group, an adamantane-diyl group, a norbornane-diyl group, and an exo-tetrahydrodicyclopentadiene-diyl group. Among these, a cyclohexylene group is preferable.

Specific examples of the arylene group having 6 to 12 carbon atoms include a phenylene group, a xylylene group, a biphenylene group, a naphthylene group, and a 2,2'-methylenebisphenyl group. Among these, a phenylene group is preferable.

Next, the crosslinkable group represented by X in Formula (B) will be described.

Specific examples of X (crosslinkable group) in Formula (B) include an epoxy group, an epoxycyclohexyl group, an oxetanyl group, and a functional group having an ethylenically unsaturated double bond. Among these, at least one crosslinkable group selected from the group consisting of crosslinkable groups represented by Formulae (X1) to (X4) is preferable.

(X1)

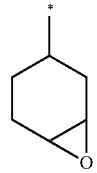

(X2)

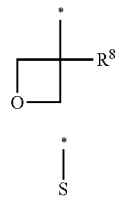

(X3)

(X4)

In Formulae (X1) to (X4), * represents a bonding position with respect to $L^2$ in Formula (B), and $R^8$ represents any of a hydrogen atom, a methyl group, or an ethyl group in Formula (X4), S represents a functional group having an ethylenically unsaturated double bond.

Here, specific examples of the functional group having an ethylenically unsaturated double bond include a vinyl group, an allyl group, a styryl group, acryloyl group, and a methacryloyl group. Among these, an acryloyl group or a methacryloyl group is preferable.

In the present invention, from the viewpoint of increasing the strength of the optical laminate to be obtained and enhancing the handleability in a case of forming other layers using the optical laminate to be obtained, it is preferable that the repeating unit B includes a repeating unit in which X in Formula (B) represents a crosslinkable group represented by any one of Formulae (X1) to (X3) (hereinafter, also referred to as a "repeating unit B1") and a repeating unit in which X in Formula (B) represents a crosslinkable group represented by Formula (X4) (hereinafter, also referred to as a "repeating unit B2").

Specific examples of the repeating unit A containing a cinnamoyl group represented by Formula (A) include the following repeating units A-1 to A-44. In the following formulae, Me represents a methyl group, and Et represents an ethyl group. In the following specific examples, the "1,4-cyclohexyl group" contained in the divalent linking group of each of the repeating units A-1 to A-10 may be any of a cis form or a transformer form and is preferably a transformer form.

A-1
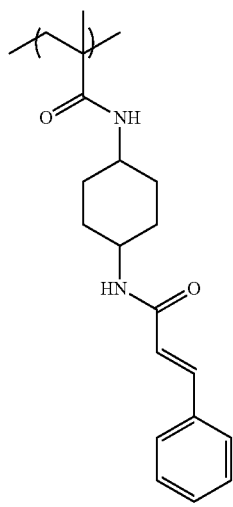
A-4
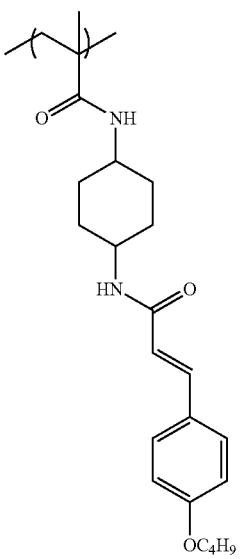
A-2
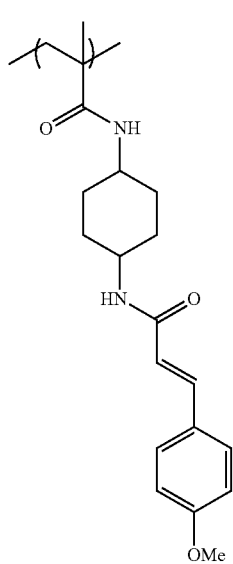
A-5
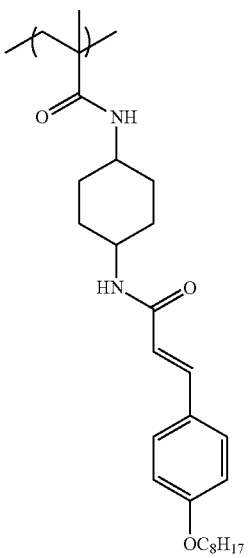
A-3
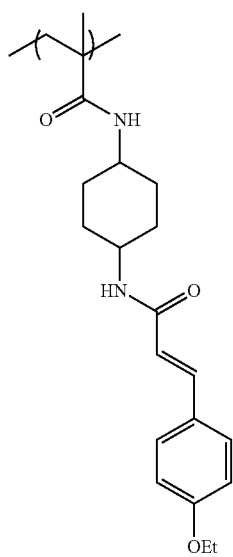

A-7
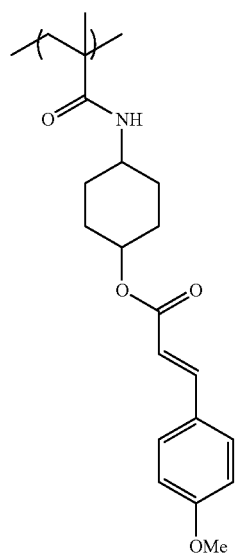
A-8
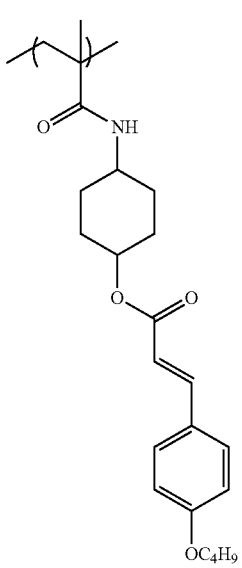
A-9
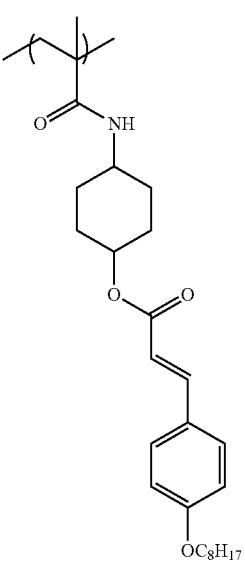
A-10
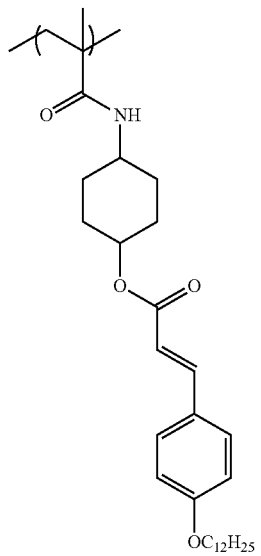
A-11
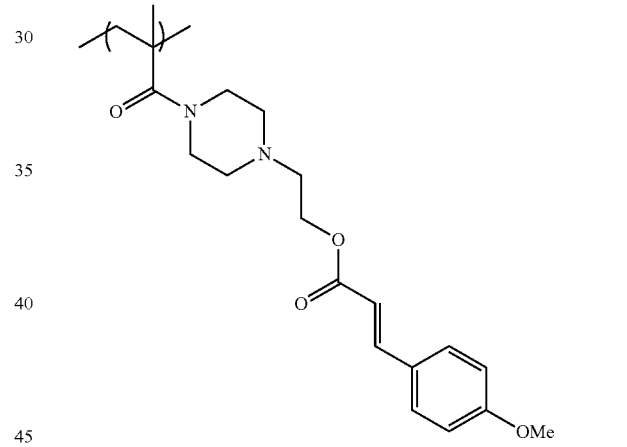
A-12
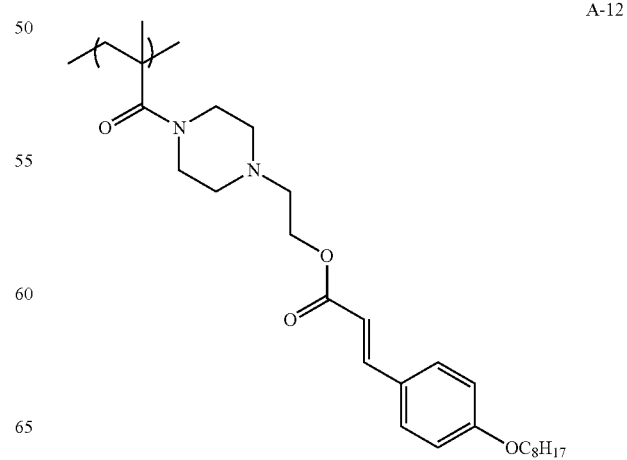

A-13
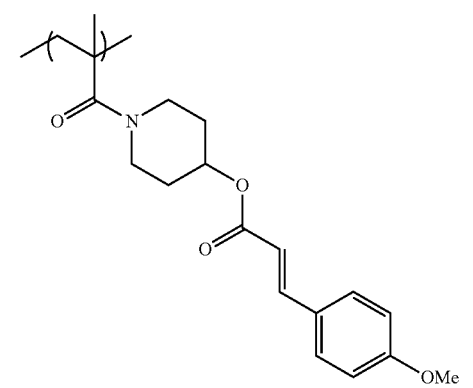
A-14
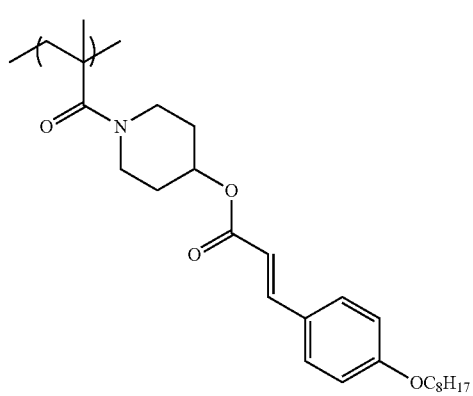
A-15
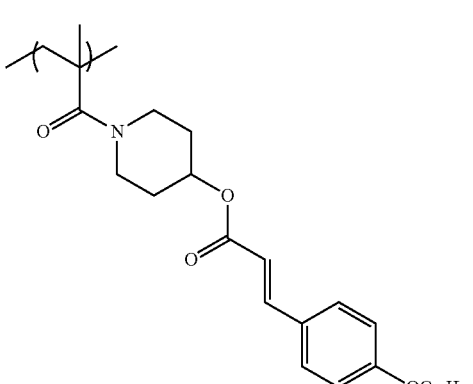
A-16
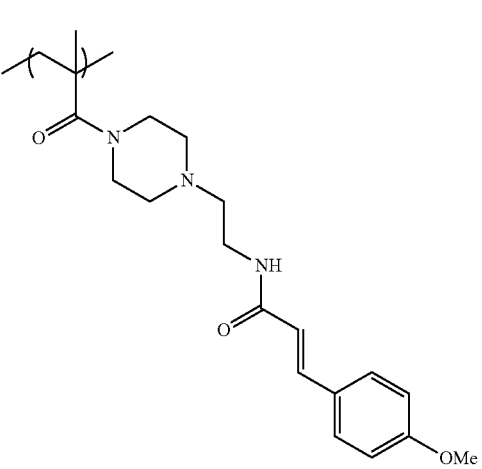
A-17
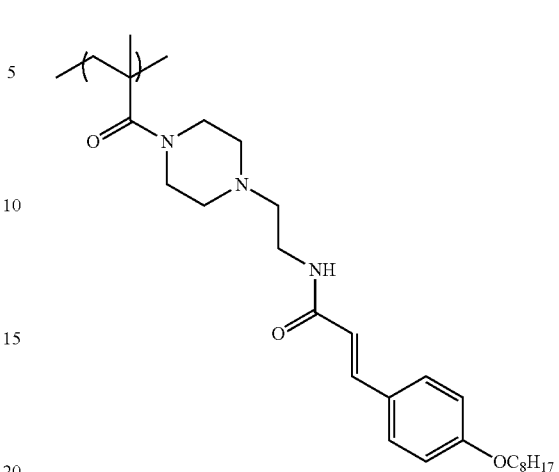
A-18
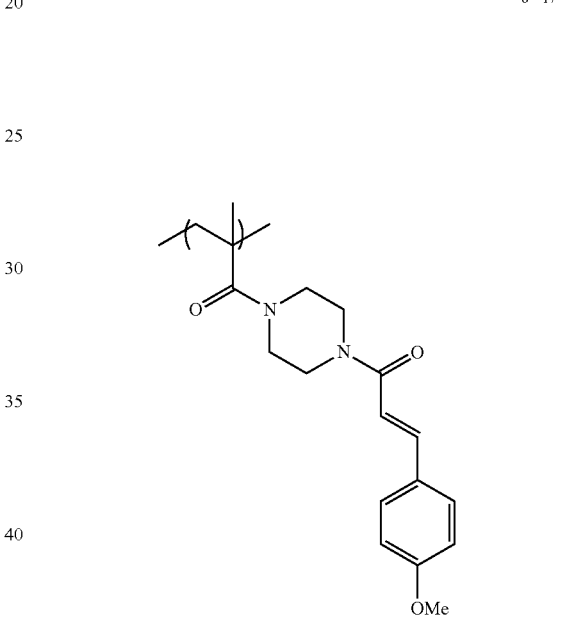
A-19

A-20
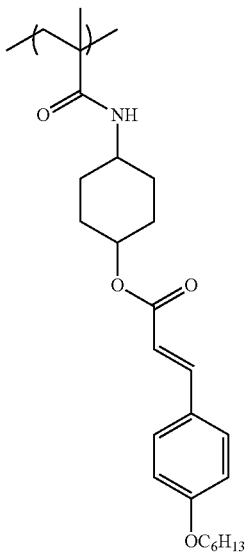
A-21
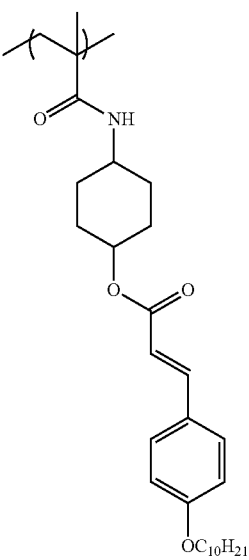
A-22
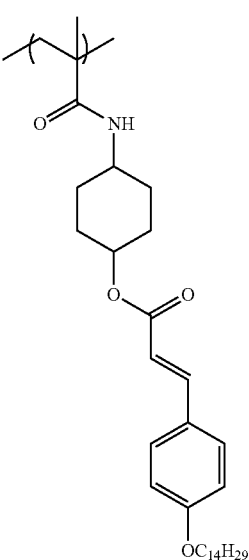
A-23
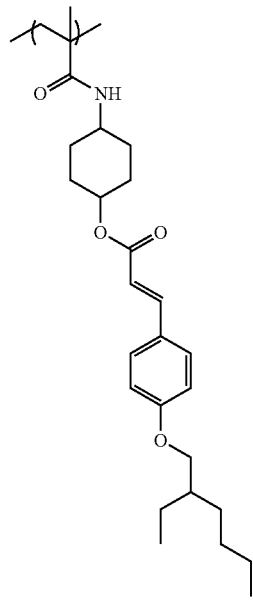
A-24
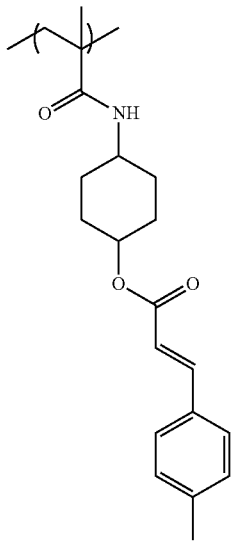

A-25
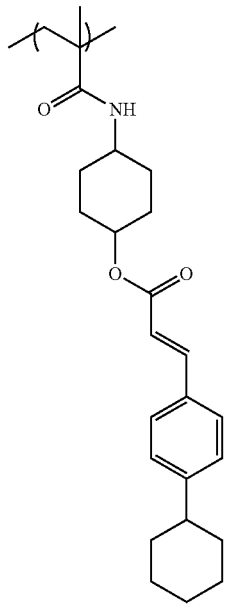
A-27
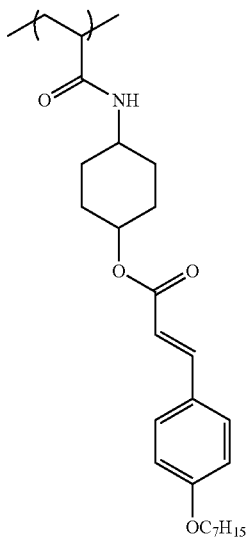
A-26
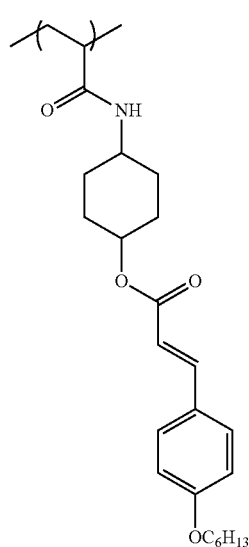
A-28
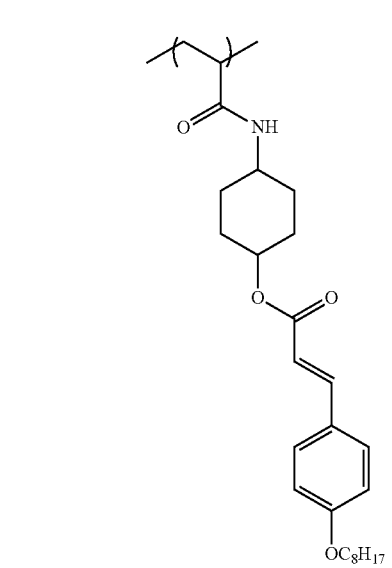

A-29
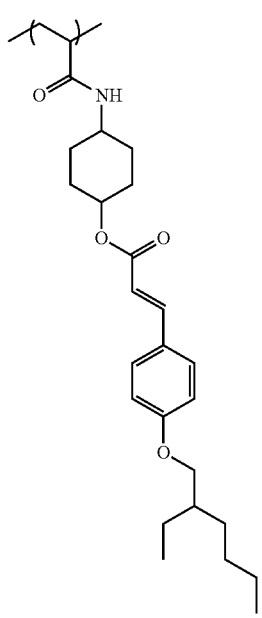
A-30
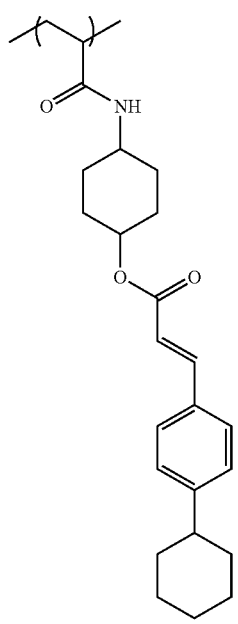
A-31
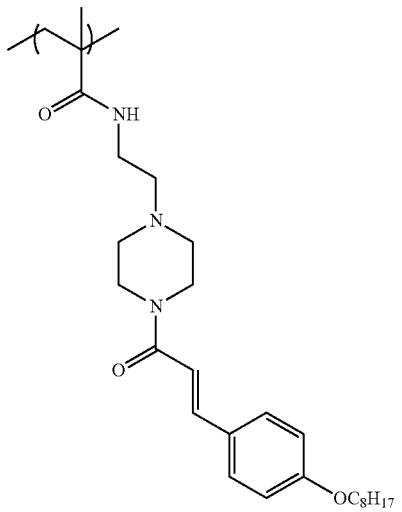
A-32
A-33
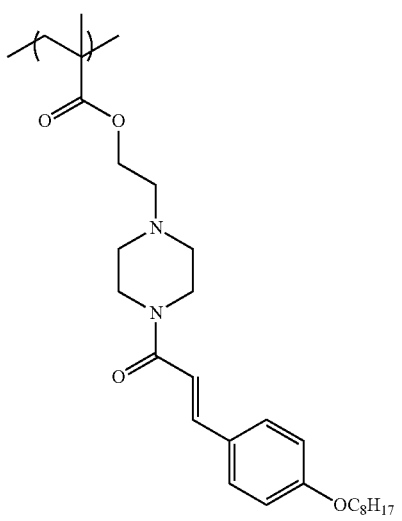

A-34
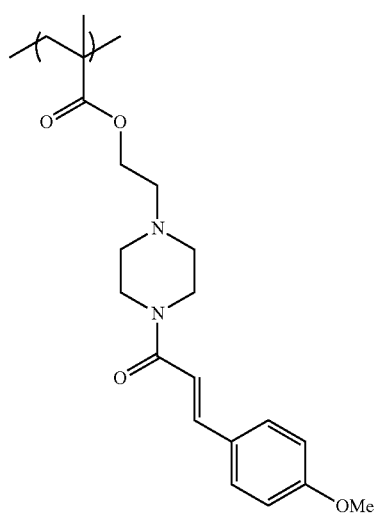
A-35
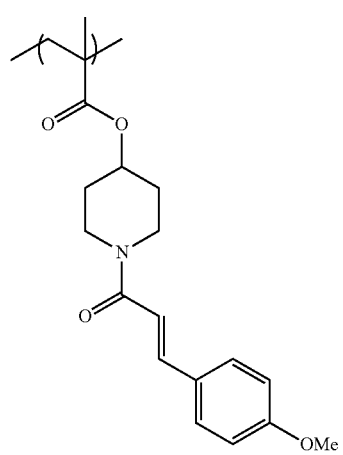
A-36
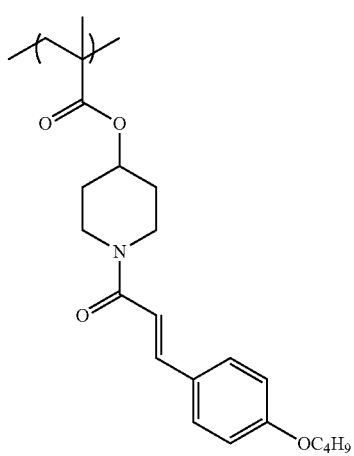
A-37
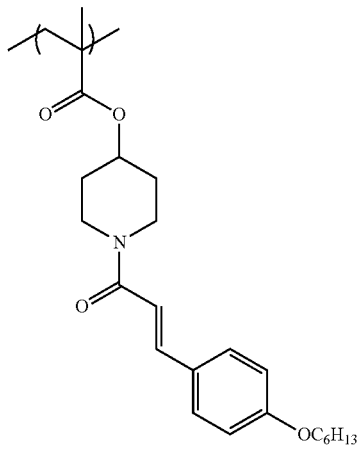
A-38
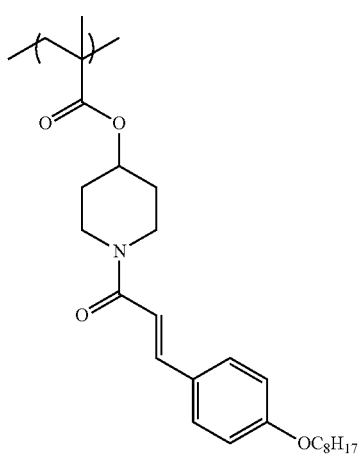
A-39
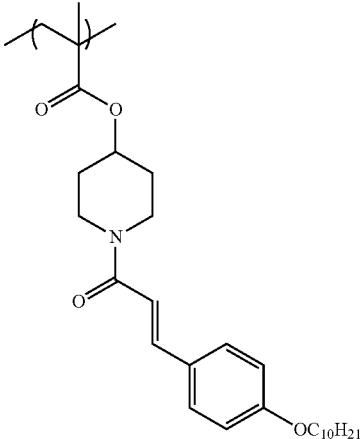

A-40
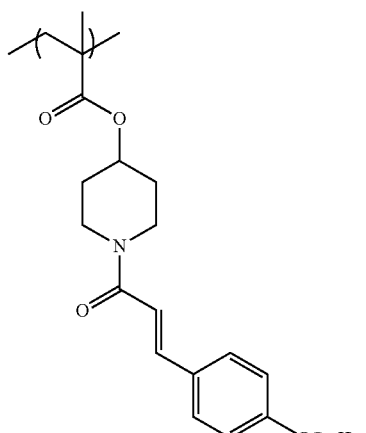
A-41
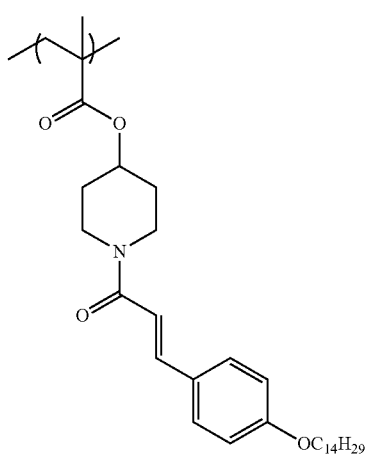
A-42
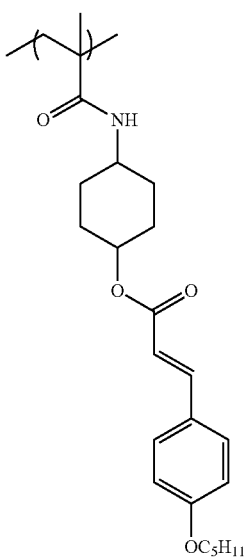
A-43
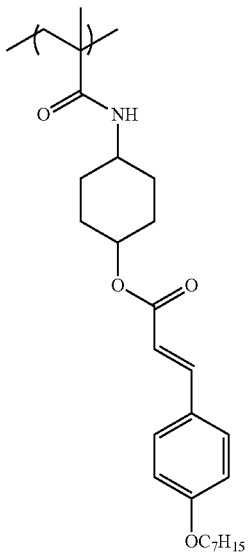
A-44
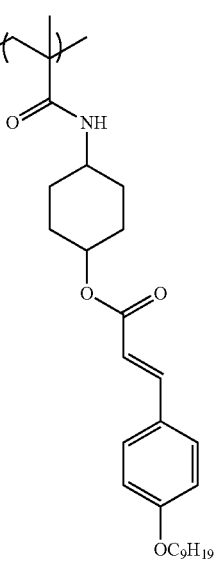
Specific examples of the repeating Unit B (repeating unit B1) containing a crosslinkable group represented by Formula (9) include repeating units B-1 to 9-17 shown below.
B-1
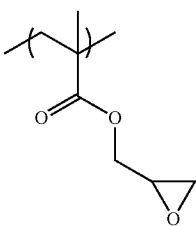

-continued
B-2
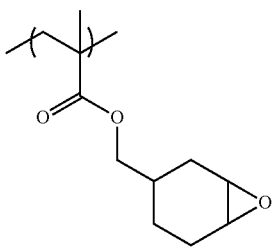
B-3
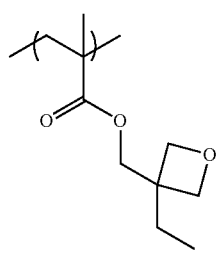
B-4
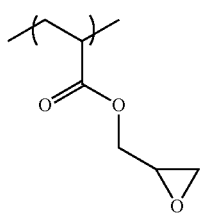
B-5
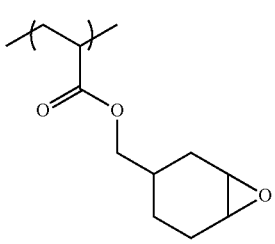
B-6
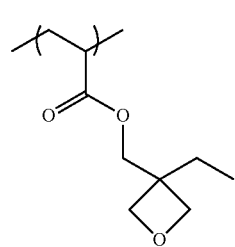
-continued
B-7
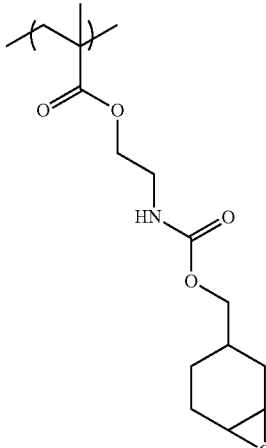
B-8
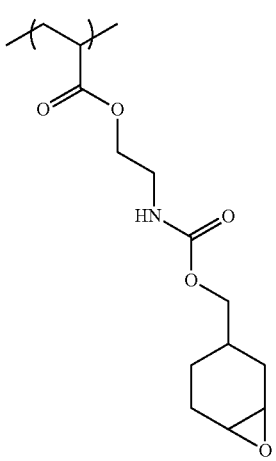
B-9
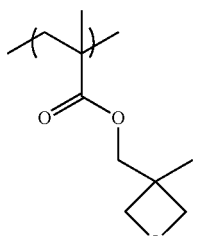
B-10
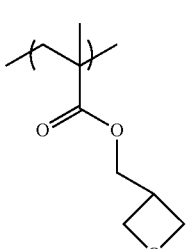

B-11
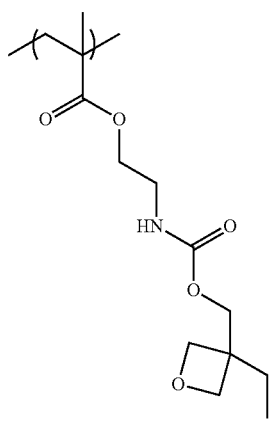
B-12
B-13
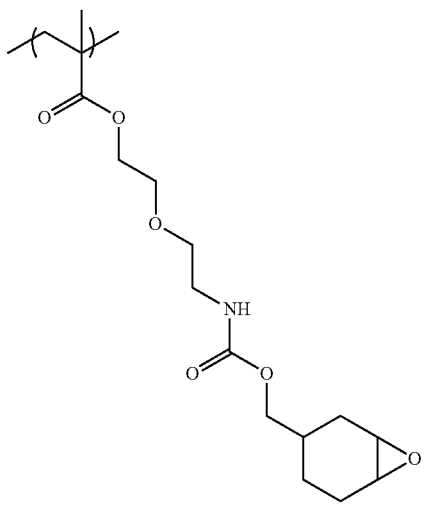
B-14
B-15
B-16
B-17
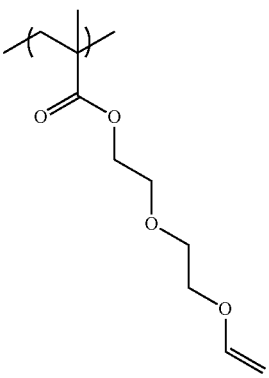
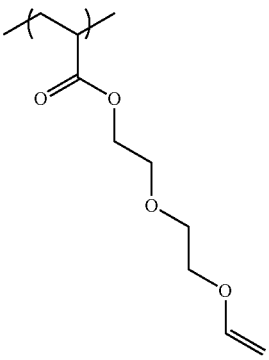
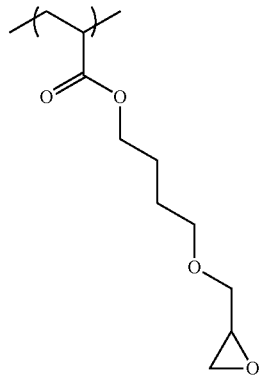

Further, specific examples of the repeating unit B (repeating unit B2) containing a crosslinkable group represented by Formula (B) include repeating units B-18 to B-47 shown below.
B-18
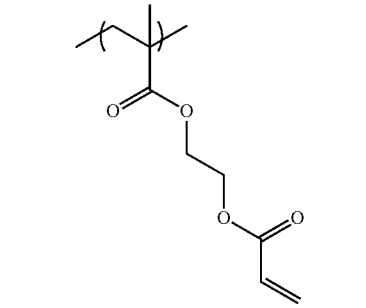
B-19
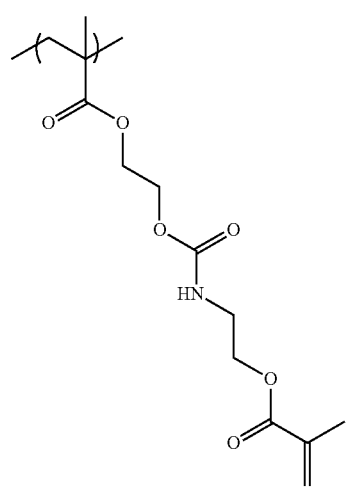
B-20
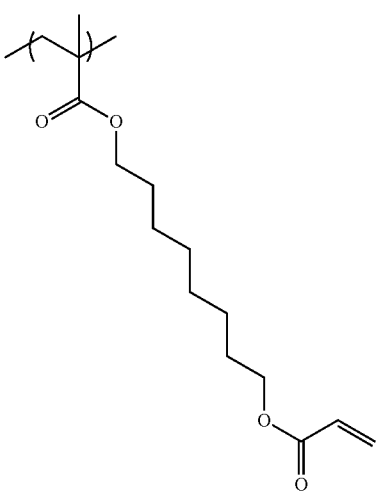
B-21
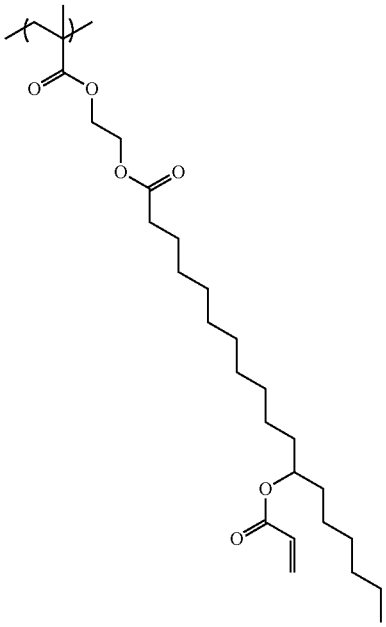
B-22
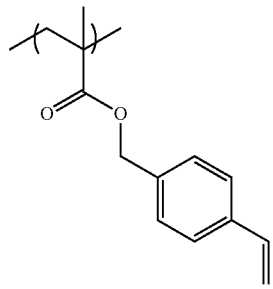
B-23
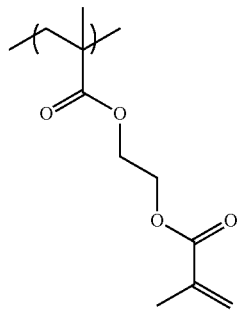

B-24
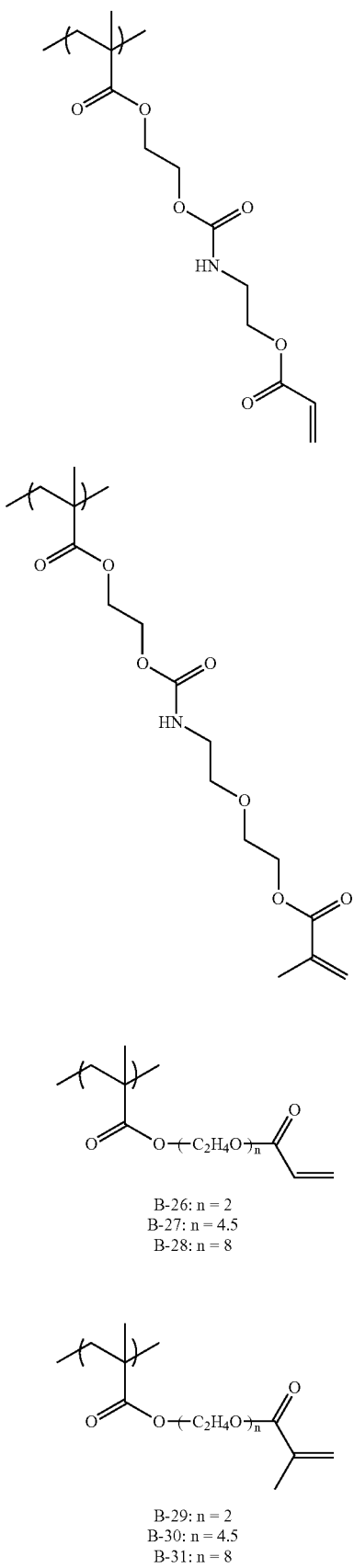
B-25
B-26: n = 2
B-27: n = 4.5
B-28: n = 8
B-29: n = 2
B-30: n = 4.5
B-31: n = 8
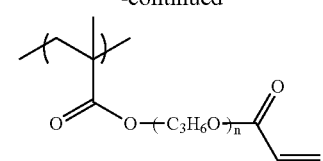
B-32: n = 4 ~ 6
B-33: n = 4.5
B-34: n = 8
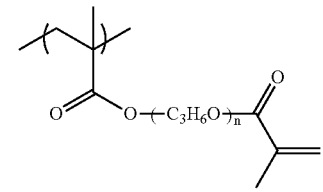
B-35: n = 4 ~ 6
B-36: n = 4.5
B-37: n = 8
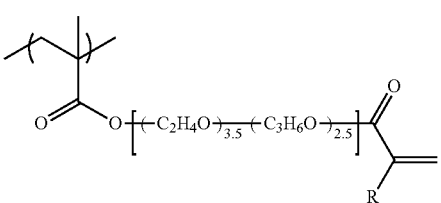
B-38: R = H
B-39: R = $CH_3$
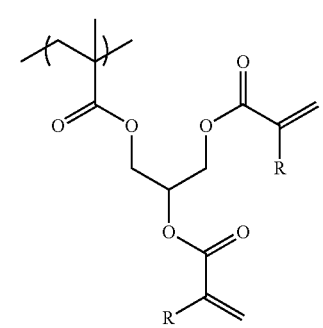
B-40: R = H
B-41: R = $CH_3$
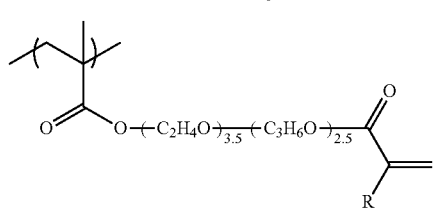
B-42: R = H
B-43: R = $CH_3$
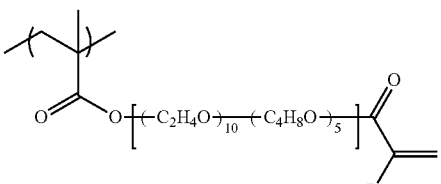
B-44: R = H
B-45: R = $CH_3$

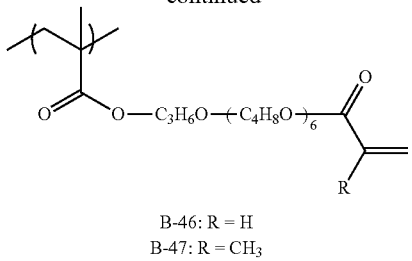

B-46: R = H
B-47: R = CH₃

In the photo-alignment copolymer, a content a of the repeating unit A described above and a content b of the repeating unit B described above satisfy preferably Expression (12), more preferably Expression (13), still more preferably Expression (14), and particularly preferably Expression (15) in terms of the mass ratio.

$$0.03 \le a/(a+b) \le 0.5 \quad (12)$$

$$0.03 \le a/(a+b) \le 0.3 \quad (13)$$

$$0.03 \le a/(a+b) \le 0.2 \quad (14)$$

$$0.05 \le a/(a+b) \le 0.2 \quad (15)$$

Further, in a case where the photo-alignment copolymer has the repeating unit B1 described above and the repeating unit B2 described above, from the viewpoint of further increasing the strength of the optically anisotropic layer including the photo-alignment layer while maintaining satisfactory liquid crystal aligning properties and adhesiveness, the content a of the repeating unit A described above, a content b1 of the repeating unit B1 described above, and a content b2 of the repeating unit B2 described above satisfy preferably Expression (16), more preferably Expression (17), and still more preferably Expression (18) in terms of the mass ratio.

$$0.05 \le b2/(a+b1+b2) \le 0.7 \quad (16)$$

$$0.10 \le b2/(a+b1+b2) \le 0.5 \quad (17)$$

$$0.12 \le b2/(a+b1+b2) \le 0.35 \quad (18)$$

The photo-alignment copolymer may have repeating units other than the repeating unit A and the repeating unit B described above as long as the effects of the present invention are not impaired.

Examples of the monomer (radical polymerizable monomer) forming such repeating units include an acrylic acid ester compound, a methacrylic acid ester compound, a maleimide compound, an acrylamide compound, acrylonitrile, a maleic acid anhydride, a styrene compound, and a vinyl compound.

A method of synthesizing the photo-alignment copolymer is not particularly limited, and für example, the photo-alignment copolymer can be synthesized by mixing a monomer forming the repeating unit A described above, a monomer forming the repeating unit B described above, and monomer forming any other repeating units and polymerizing the mixture in an organic solvent using a radically polymerization initiator.

From the viewpoint of further improving the liquid crystal aligning properties, the weight-average molecular weight (Mw) of the photo-alignment copolymer is preferably in a range of 10000 to 500000 and more preferably in a range of 30000 to 300000.

In a case where the photo-alignment copolymer is used, the content of the photo-alignment copolymer in the composition for forming a photo-alignment layer is not particularly limited, but in a case where the composition contains an organic solvent, the content thereof is preferably in a range of 0.1 to 50 parts by mass and more preferably in a range of 0.5 to 10 parts by mass with respect to 100 parts by mass of the organic solvent.

(Additive)

The composition for forming a photo-alignment layer may contain one or more additives other than the photoactive compound. For example, the additive is added for the purpose of adjusting the refractive index of the composition for forming a photo-alignment layer. As the additive, a compound containing a hydrophilic group and a (meth) acryloyloxy group is preferable from the viewpoint of the compatibility with the photoactive compound, and the additive can be added to the extent that the alignment ability is not significantly reduced. Examples of the hydrophilic group include a hydroxyl group, a carboxyl group, a sulfo group, and an amino group.

(Organic Solvent)

From the viewpoint of the workability for preparing a photo-alignment layer, it is preferable that the composition for forming a photo-alignment layer contains an organic solvent.

Specific examples of the organic solvent include ketones (such as acetone, 2-butanone, methyl isobutyl ketone, cyclohexanone, and cyclopentanone), ethers (such as dioxane and tetrahydrofuran), aliphatic hydrocarbons (such as hexane), alicyclic hydrocarbons (suck as cyclohexane), aromatic hydrocarbons (such as toluene, xylene, and trimethylbenzene), carbon halides (such as dichloromethane, dichloroethane, dichlorobenzene, and chlorotoluene), esters (such as methyl acetate, ethyl acetate, and butyl acetate), water, alcohols (such as ethanol, isopropanol, butanol, and cyclohexanol), cellosolve (such as methylcellosolve and ethyl cellosolve), cellosolve acetates, sulfoxides (such as dimethylsulfoxide), and amides (such as dimethylformamide and dimethylacetamide), and such solvents may be used alone or in combination of two or more kinds thereof.

The composition for forming a photo-alignment layer may contain components other than the above-described components, and examples thereof include a crosslinking catalyst (such as a thermally reactive acid generator), an adhesion improver, a leveling agent, a surfactant, and a plasticizer.

In a case where the additive is used for the purpose of adjusting the refractive index of the composition for forming a photo-alignment layer, the refractive index of the additive is preferably in a range of 1.4 to 1.6 and more preferably in a range of 1.4 to 1.55.

In the present invention, from the viewpoint of enhancing the adhesiveness between the photo-alignment layer and the light absorption anisotropic layer, it is preferable that the composition for forming a photo-alignment layer is a composition containing a compound (such as the photo-alignment copolymer described above) that contains a photoreactive group and a crosslinkable group and containing no radical polymerization initiator, (Coating Method)

As a method of coating the above-described polymer film with the composition for forming a photo-alignment layer, known methods, for example, a coating method such as a spin coating method, an extrusion method, a gravure coating method, a die coating method, a bar coating method, or an applicator method and a printing method such as a flexographic method are employed.

In a case where the optical laminate is produced by a Roll-to-Roll type continuous production method, a printing method such as a gravure coating method, a die coating method, or a flexographic method is typically employed as the coating method.

<Drying Step>

A method of heating the coating film formed by the coating step so that the coating film is dried is not particularly limited, and the drying temperature is preferably in a range of 50° C. to 180° C. and more preferably in a range of 80° C. to 150° C.

The drying time is preferably in a range of 10 seconds to 10 minutes and more preferably in a range of 30 seconds to 5 minutes.

In a case where the composition for forming a photo-alignment layer contains a compound containing a cross-linking catalyst such as a thermally reactive acid generator and a cationically polymerizable crosslinkable group, it is preferable that curing of the coating film is promoted by the crosslinking reaction by being heated.

<Light Irradiation Step>

The polarized light to be applied to the coating film after the drying step is not particularly limited, and examples thereof include linearly polarized light, circularly polarized light, and elliptically polarized light. Among these, linearly polarized light is preferable.

Further, the "diagonal direction" in which non-polarized light is applied is not particularly limited as long as the direction is inclined at a polar angle θ (0<θ<90°) with respect to the normal direction of the surface of the coating film, and the polar angle θ can be appropriately selected depending on the purpose thereof, but is preferably in a range of 20° to 80°.

In the present specification, the "irradiation with linearly polarized light" and the "irradiation with non-polarized light" are operations for causing a photoreaction in the photoactive compound. The wavelength of the light to be used varies depending on the photoactive compound to be used and is not particularly limited as long as the wavelength is required for the photoreaction. The peak wavelength of light to be used for irradiation with light is preferably in a range of 200 nm to 700 nm, and ultraviolet light having a peak wavelength of 400 nm or less is more preferable.

Examples of the light source used for irradiation with light include commonly used light sources, for example, lamps such as a tungsten lamp, a halogen lamp, a xenon lamp, a xenon flash lamp, a mercury lamp, a mercury xenon lamp, or a carbon arc lamp, various lasers [such as a semiconductor laser, a helium neon laser, an argon ion laser, a helium cadmium laser, and a yttrium aluminum garnet (YAG) laser], a light emitting diode, and a cathode ray tube.

As means for obtaining linearly polarized light, a method of using a polarizing plate (for example, an iodine polarizing plate, a dichroic dye polarizing plate, or a wire grid polarizing plate), a method of using a prism-based element (for example, a Ulan-Thompson prism) or a reflective type polarizer for which a Brewster's angle is used, or a method of using light emitted from a laser light source having polarized light can be employed. In addition, only light having a required wavelength may be selectively applied using a filter or a wavelength conversion element.

In a case where light to be applied is linearly polarized light, a method of applying light vertically or obliquely to the upper surface with respect to the alignment layer or the surface of the alignment layer from the rear surface is employed. The incidence angle of light varies depending on the photoactive compound, but is preferably in a range of 0° to 90° (vertical) and more preferably in a range of 40° to 90°.

In a case where light to be applied is non-polarized light, the alignment layer is irradiated with non-polarized light obliquely. The incidence angle thereof is preferably in a range of 10° to 80°, more preferably in a range of 20° to 60°, and still more preferably in a range of 30° to 50°.

The irradiation time is preferably in a range of 1 minute to 60 minutes and more preferably in a range of 1 minute to 10 minutes.

In a case where patterning is required, a method of performing irradiation with light using a photomask as many times as necessary for pattern preparation or a method of writing a pattern by laser light scanning can be employed.

It is preferable that the photo-alignment layer used in the present invention is an alignment layer having an average refractive index of 1.55 or greater and 1.8 or less at a wavelength of 550 nm. From the viewpoint of further improving the antireflection performance, the average refractive index at a wavelength of 550 nm is more preferably in a range of 1.55 to 1.7 in order to reduce a difference in the refractive index between the photo-alignment layer and the light absorption anisotropic layer.

Further, in the photo-alignment layer used in the present invention, the in-plane refractive index anisotropy Δn at a wavelength of 550 μm is preferably 0.05 or greater and 0.45 or less. The in-plane refractive index anisotropy Δn at a wavelength of 550 am is more preferably 0.1 or greater and 0.4 or less and still more preferably 0.1 or greater and 0.3 or less.

By appropriately controlling the refractive index anisotropy of the photo-alignment layer, the antireflection function can be further improved.

[Rubbing Treatment Alignment Layer]

A rubbing treatment alignment layer is a layer o which an alignment regulation force is applied by a rubbing treatment.

A polymer material used for the rubbing treatment alignment layer is described in a plurality of documents, and a plurality of commercially available products can be used. In the present invention, polyvinyl alcohol or polyimide and derivatives thereof are preferably used. As the alignment layer, the description on page 43, line 24 to page 49, line 8 of WO2001/88574A1 can be referred to,

[Thickness of Alignment Layer]

From the viewpoint that the effects of the present invention are more excellent, the thickness of the alignment layer is preferably in a range of 0.05 to 10 μm, more preferably in a range of 0.1 to 0.5 μm, and still more preferably in a range of 0.2 to 3 μm.

[Cured Layer]

The laminate according to the embodiment of the present invention may include a cured layer having a thickness of 1.00 nm or less for the purpose of reducing a difference in refractive index between the specific polarizer layer and the adjacent layer. It is preferable that the laminate include the cured layer on the specific polarizer layer on a side opposite to the alignment layer (particularly, the photo-alignment layer).

Such a cured layer is not particularly limited, and various known layers can be used. Examples of such a cured layer include a layer containing a liquid crystal compound and a layer obtained by curing a composition containing a polyfunctional monomer. It is preferable that the cured layer has a refractive index that enables index matching with the optically anisotropic layer (particularly, the light absorption anisotropic layer).

[Oxygen Blocking Layer]

The laminate according to the embodiment of the present invention may include an oxygen blocking layer for the purpose of improving light resistance. It is preferable that the laminate includes the oxygen blocking layer on any one or both on a side of the alignment layer (particularly, the photo-alignment layer) opposite to the specific polarizer layer and on a side of the specific polarizer layer opposite to the alignment layer (particularly, the photo-alignment layer). In the following description, the oxygen blocking layer on the side of the alignment layer (particularly, the photo-alignment layer) opposite to the specific polarizer layer is also referred to as an "oxygen blocking layer 1" and the oxygen blocking layer on the side of the specific polarizer layer opposite to the alignment layer (particularly, the photo-alignment layer) is also referred to as an "oxygen blocking layer 2".

The "oxygen blocking layer" is an oxygen blocking film with an oxygen blocking function, and specific examples thereof include layers containing organic compounds such as polyvinyl alcohol, polyethylene vinyl alcohol, polyvinyl ether, polyvinylpyrrolidone, polyacrylamide, polyacrylic acid, cellulose ether, polyamide, polyimide, a styrene/maleic acid copolymer, gelatin, vinylidene chloride, and cellulose nanofibers.

In the present specification, the oxygen blocking function is not limited to a function for making a state where oxygen is not allowed to pass at all, and also includes a function for making a state where a small amount of oxygen is allowed to pass depending on the desired performance.

In a case where an oxygen blocking layer is provided on a transparent polymer film and a photo-alignment layer containing an azobenzene compound represented by Formula (1) is provided on the oxygen blocking layer, from the viewpoint of enhancing the aligning properties, it is preferable that polyvinyl alcohol having a saponification degree of 95 mol % or greater or modified polyvinyl alcohol having a saponification degree of 95 mol % or greater is used as the oxygen blocking layer.

Further, examples of the oxygen blocking layer also include a thin layer consisting of a metal compound (metal compound thin layer). As a method of forming the metal compound thin layer, any method can be used as long as a desired thin layer can be formed. Suitable examples thereof include a sputtering method, a vacuum deposition method, an ion plating method, and a plasma chemical vapor deposition (CND) method. Specifically, the forming methods described in JP3400324B, SP2002-322561A, and JP2002-361774A can be employed.

The component contained in the metal compound thin layer is not particularly limited as long as the component can exhibit an oxygen blocking function, and an oxide, a nitride, an oxynitride, or the like containing one or more metals selected from Si, Al, In, Sn, Zn, Ti, Cu, Ce, Ta and the like can be used. Among these, an oxide, a nitride, or an oxynitride of a metal selected from Si, Al, In, Sn, Zn, and Ti is preferable, and a metal oxide, a nitride, or an oxynitride selected from Si, Al, Sn, and Ti is particularly preferable. These may contain other elements as secondary components.

Further, the oxygen blocking layer may be in the form of lamination of the layer containing an organic material and the metal compound thin layer as described in, for example, US6413645B, JP2015-226995A, JP2013-202971A, JP2003-335880A, JP1978-12953A (JP-S53-12953A), and JP1983-217344A (JP-S58-217344A) and may be a layer obtained by hybridizing an organic compound and an inorganic compound as described in WO2011/11836A, JP2013-248832A, and JP3855004B.

The oxygen blocking layer may also serve as an alignment layer of an optically anisotropic layer having a λ/4 function. In such a case, an oxygen blocking layer containing polyvinyl alcohol, polyamide, or polyimide is preferable.

[Thickness of Oxygen Blocking Layer]

In a case of the layer containing an organic compound, from the viewpoint that the effects of the present invention are more excellent, the thickness of the oxygen blocking layer is preferably in a range of 0.1 to 10 µm and more preferably in a range of 0.5 to 5.5 µm. In a case of the metal compound thin layer, the thickness of the oxygen blocking layer is preferably in a range of 5 mm to 500 nm and more preferably in a range of 10 nm to 200 nm from the viewpoint that the effects of the present invention are more excellent.

[UV Absorbing Layer]

It is preferable that the laminate according to the embodiment of the present invention includes a functional layer (UV absorbing layer) having a function of reducing short wave light on the side of the glass plate with respect to the specific polarizer layer. By reducing short wave light, an optical laminate that suppresses photodecomposition of a dye compound and has excellent light resistance can be provided.

As one embodiment, it is preferable that the above-described cohesive adhesive layer or oxygen blocking layer has a function of reducing short wave light.

As another aspect, it is also preferable that a layer having a function of reducing short wave light is newly provided on the viewing side with respect to the specific polarizer layer.

A method of reducing short wave light is not particularly limited, and examples thereof include a method of applying light absorption using an absorbing agent or the like and a method of applying wavelength selective reflection using a multilayer film.

The above-described short wave light is light having a wavelength of 430 nm or less. By reducing the light having a wavelength of 430 nm or less, photodecomposition of a dye compound due to sunlight or light from a light source used in the light resistance test of JIS B 7751 and JIS B 7754 can be suppressed.

Further, it is preferable to be transparent in a wavelength range of 450 nm or greater so as not to affect the performance of the polarizer in visible light.

From the viewpoint that the effects of the present invention are more excellent, the UV absorbing layer is a UV absorbing layer that has an absorbance of 0.5 or greater at a wavelength of 360 nm and a wavelength of 400 nm.

[Touch Sensor]

The laminate according to the embodiment of the present invention may include a touch sensor inside. In this case, it is preferable that the touch sensor is provided between the above-described specific glass plate and the above-described first pressure-sensitive adhesive layer.

[9] Applications

The laminate according to the embodiment of the present invention can be used as a polarizing element (polarizing plate), and is useful as, for example, an optical laminate for antireflection. In particular, the laminate is useful as an optical laminate for an organic EL display device used in a foldable device.

[10] Substituent W

The substituent W in the present specification will be described.

Examples of the substituent W include a halogen atom, an alkyl group (such as a tort-butyl group) (including a cycloalkyl group, a bicycloalkyl group, and a tricycloalkyl group), an alkenyl group (including a cycloalkenyl group and a bicycloalkenyl group), an alkynyl group, an aryl group, a heterocyclic group, a cyano group, a hydroxy group, a nitro group, a carboxy group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonium group, an acylamino group, an aminocarbonylamino group, an alkoxycarbonylamino group, an aryloxycarbonylamino group, a sulfamoylamino group, an Alkyl or arylsulfonylamino group, a mercapto group, an alkylthio group, an arylthio group, a heterocyclic thio group, a sulfamoyl group, a sulfa group, an alkyl or arylsulfinyl group, an alkyl or arylsulfonyl group, an acyl group, an aryloxycarbonyl group, an alkoxycarbonyl group, a carbamoyl, an amyl oar heterocyclic azo group, an imide group, a phosphine group, a phosphinyl group, a phosphinyloxy group, a phosphinylamino group, a phosphono group, a silyl group, a hydrazine group, a ureido group, a boronic acid group (—B(OH)$_2$), a phosphate group (—OPO(OH)$_2$), a sulfate group (—OSO$_3$H), and other known substituents.

The details of the substituent are described in paragraph [0023] of JP2007-234651A.

[II] Organic EL Display Device

The organic EL display device according to the embodiment of the present invention is an organic EL display device having the laminate according to the embodiment of the present invention. As the organic EL display device according to the embodiment of the present invention, an embodiment of a display device including the above-described optical laminate according to the embodiment of the present invention and an organic EL display panel in order from the viewing side is suitably exemplified.

Further, the organic EL display panel is a display panel formed using an organic EL element having an organic light-emitting layer (organic electroluminescence layer) interposed between electrodes (between a cathode and an anode). The configuration of the organic EL display panel is not particularly limited, and a known configuration is employed.

[III] Foldable Device

The foldable device according to the embodiment of the present invention is a foldable device formed of the organic EL display device according to the embodiment of the present invention.

EXAMPLES

Hereinafter, the present invention will be described in more detail with reference to examples. Materials, used amounts, ratios, treatment contents, treatment procedures, and the like described in the following examples can be appropriately changed without departing from the spirit of the present invention. Therefore, the scope of the present invention should not be limitatively interpreted by the following examples.

[Preparation of Cellulose Acylate Film]

Cellulose acylate films 1 and 2 were prepared as follows.

[Preparation of Cellulose Acylate Film 1]

A cellulose acylate film 1 was prepared in the following manner.

<Preparation of Core Layer Cellulose Acylate Dope>

The following composition was put into a mixing tank and stirred to dissolve each component, thereby preparing a cellulose acetate solution used as a core layer cellulose acylate done,

| Core layer cellulose acylate dope |
| --- |
| Cellulose acetate having acetyl substitution degree of 2.88: 100 parts by mass |
| Polyester compound B described in example of JP2015-227955B: 12 parts by mass |
| Compound F shown below: 2 parts by mass |
| Methylene chloride (first solvent): 430 parts by mass |
| Methanol (second solvent): 64 parts by mass |
| Compound F |

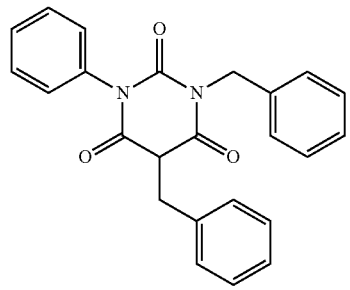 [SMILES: O=C1C(Cc2ccccc2)C(=O)N(c2ccccc2)C(=O)N1Cc1ccccc1]

<Preparation of Outer Layer Cellulose Acylate Dope>

10 parts by mass of the following matting agent solution was added to 90 parts by mass of the above-described core layer cellulose acylate dope, thereby preparing a cellulose acetate solution used as an outer layer cellulose acylate dope.

| Matting agent solution | |
| --- | --- |
| Silica particles with average particle size of 20 nm (A.EROSIL R972, manufactured by Nippon Aerosil Co,, Ltd.): | 2 parts by mass |
| Methylene chloride (first solvent): | 76 parts by mass |
| Methanol (second solvent): | 11 parts by mass |
| Core layer cellulose acylate dope described above: | 1 parts by mass |

<Preparation of Cellulose Acylate Film 1>

The core layer cellulose acylate dope and the outer layer cellulose acylate dope were filtered through filter paper having an average pore size of 34 μm and a sintered metal filter having an average pore size of 10 μm, and three layers which were the core layer cellulose acylate dope and the outer layer cellulose acylate dopes provided on both sides of the core layer cellulose acylate dope were simultaneously cast from a casting port onto a drum at 20° C. (band casting machine).

Next, the film was peeled off in a state where the solvent content was approximately 20% by mass, both ends of the film, in the width direction were fixed by tenter clips, and the film was dried while being stretched at a stretching ratio of 1.1 times in the lateral direction.

Thereafter, the film was further dried by being transported between the rolls of the heat treatment device to prepare an optical film having a thickness of 40 μm, and the optical film was used as a cellulose acylate film 1. The in-plane retardation of the obtained cellulose acylate film 1 was 0 nm.

[Preparation of Cellulose Acylate Film 2]

A cellulose acylate film 2 was prepared in the same manner as that for the cellulose acylate film 1 except that the thickness thereof was set to 25 μm.

Example 1

A laminate of Example 1 was prepared as follows.

[Preparation of Laminate 1B]

First, as described below, a laminate 1B including the cellulose acylate film 1, the photo-alignment layer PA1, the liquid crystal layer P1, the cured layer N1, and the oxygen blocking layer B1 adjacent to each other in this order was prepared.

<Preparation of TAC Film Provided with Photo-Alignment Layer>

The cellulose acylate film 1 was continuously coated with a coating solution PA1 for forming an alignment layer described below with a wire bar. The support on which a coating film was formed was dried with warm air at 140° C. for 120 seconds, and the coating film was irradiated with polarized ultraviolet rays (10 mJ/cm², using an ultra-high pressure mercury lamp) to form a photo-alignment layer PA1, thereby obtaining a TAC film provided with a photo-alignment layer.

The thickness d of the photo-alignment layer PA1 was 1.0 μm.

(Coating solution PA1 for forming alignment layer)

Polymer PA-1 shown below: 100.00 parts by mass
Acid generator PAG-1 shown below: 5.00 parts by mass
Acid generator CPI-110TF shown below: 0.005 parts by mass
Xylene: 1220.00 parts by mass
Methyl isobutyl ketone: 122.00 parts by mass Polymer PA-1

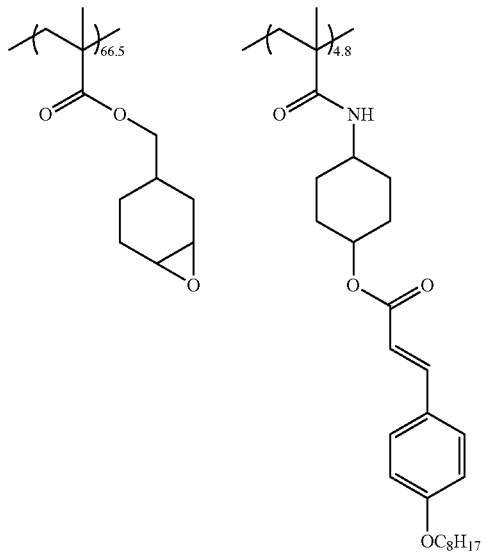

(Coating solution PA1 for forming alignment layer)

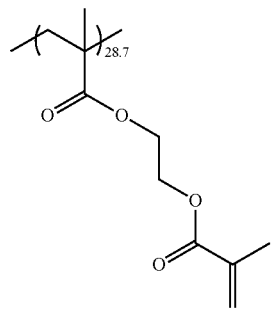

Acid generator PAG-1

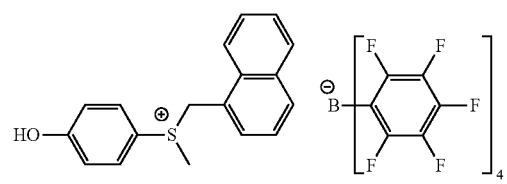

Acid generator CPI-110TF

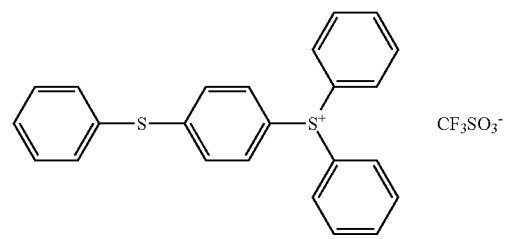

<Formation of Liquid Crystal Layer P1>

A coating layer P1 was formed by continuously coating the photo-alignment layer PA1 of the obtained TAC film provided with the photo-alignment layer with the following composition P1 for forming a liquid crystal layer using a wire bar.

Next, the coating layer P1 was heated at 140° C. for 30 seconds, and the coating layer P1 was cooled to room temperature (23° C.).

Next, the coating layer was heated at 90° C. for 60 seconds and cooled to room temperature again.

Thereafter, a liquid crystal layer P1 (polarizer layer) was formed on the photo-alignment layer PA1 by irradiation with light (center wavelength of 365 nm) of a light emitting diode (LED) for 2 seconds under an irradiation condition of an illuminance of 200 mW/cm². The thickness of the liquid crystal layer P1 was 0.4 μm.

| Composition of composition P1 for forming liquid crystal layer |
|---|
| Dichroic material D-1 shown below: 0.36 parts by mass |
| Dichroic material D-2 shown below: 0.53 parts by mass |
| Dichroic material D-3 shown below: 0.31 parts by mass |
| Polymer liquid crystal compound P-1 shown below: 3.58 parts by mass |
| Polymerization initiator IRGACURE OXE-02 (manufactured by BASF SE): 0.050 parts by mass |
| Surfactant F-1 shown below: 0.026 parts by mass |
| Cyclopentanone: 45.00 parts by mass |
| Tetrahydrofuran: 45.00 parts by mass |
| Benzyl alcohol: 5.00 parts by mass |

D-1

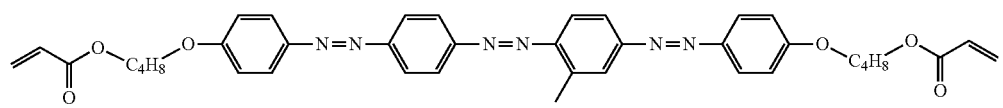

D-2

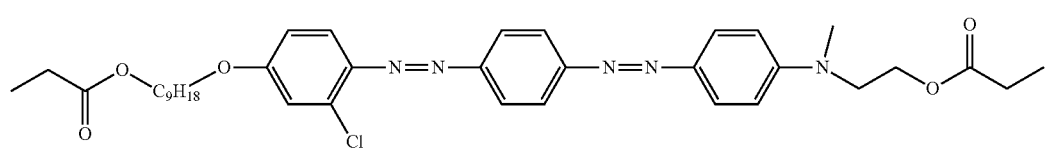

D-3

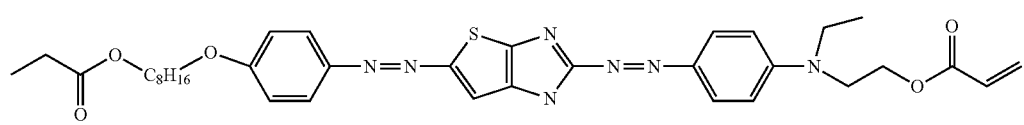

Polymer liquid crystal compound P-1

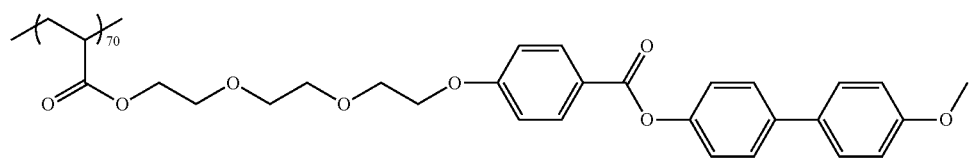

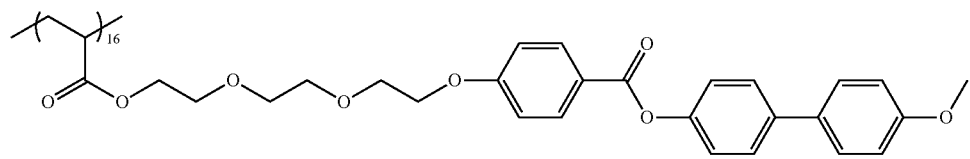

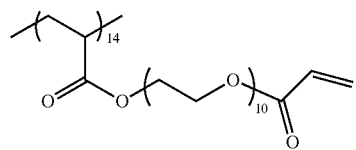

Surfactant F-1

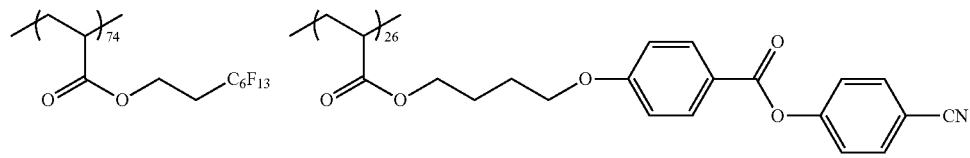

<Formation of Cured Layer N1>

The formed liquid crystal layer P1 was continuously coated with the following composition N1 for forming a cured layer using a wire bar, thereby forming a cured layer N1.

Thereafter, the cured layer N1 was dried at room temperature and irradiated using a high-pressure mercury lamp under an irradiation condition of an illuminance of 28 mW/cm$^2$ for 15 seconds, thereby preparing a cured layer N1 on the liquid crystal layer P1.

The film thickness of the cured layer N1 was 0.05 μm (50 nm).

| Composition of composition N1 for forming a cured layer |
| --- |

Mixture L1 of rod-like liquid crystal compounds shown below: 2.61 parts by mass
Modified trimethylolpropane triacrylate shown below: 0.11 parts by mass
Photopolymerization initiator I-1 shown below: 0.05 parts by mass
Interface improver F-3 shown below: 0.21 parts by mass
Methyl isobutyl ketone: 297 parts by mass
Mixture L1 of rod-like liquid crystal compounds (the numerical values in the following
formulae are denoted in units of % by mass, and R represents a group bonded with respect to an oxygen atom).

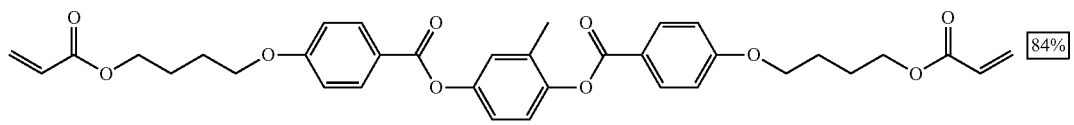 [SMILES: C=CC(=O)OCCCCOc1ccc(C(=O)Oc2ccc(OC(=O)c3ccc(OCCCCOC(=O)C=C)cc3)c(C)c2)cc1]

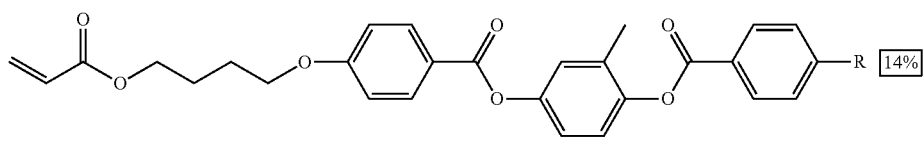

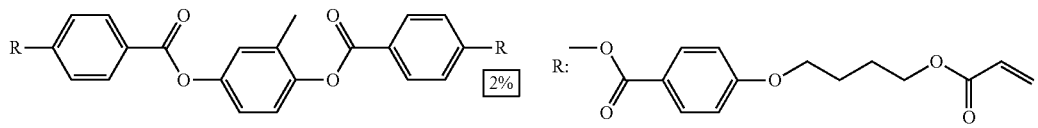

Modified trimethylolpropane triacrylate
Modified trimethylolpropane triacrylate

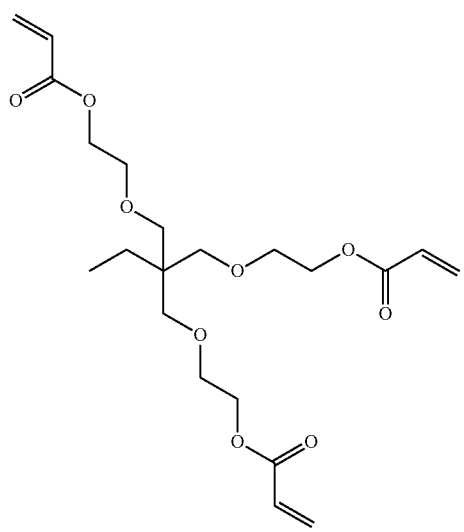 [SMILES: C=CC(=O)OCCOCC(CC)(COCCOC(=O)C=C)COCCOC(=O)C=C]

Photopolymerization initiator I-1

| Composition of composition N1 for forming a cured layer |
|---|
| 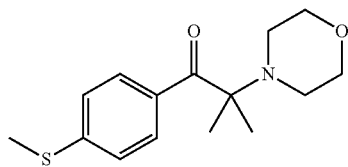 [SMILES: CSc1ccc(C(=O)C(C)(C)N2CCOCC2)cc1]<br>Interface improver F-3<br>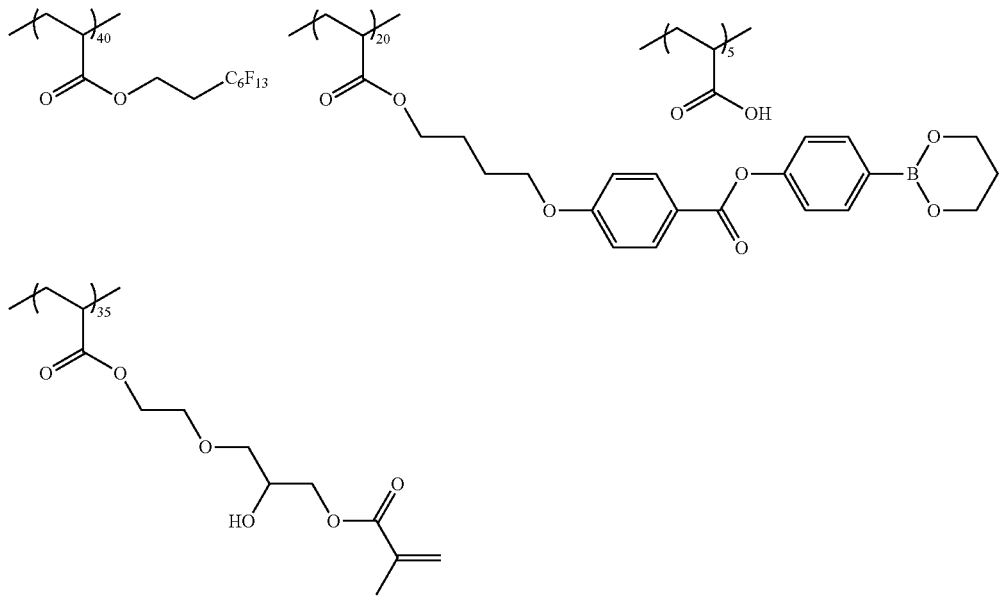 |

<Formation of Oxygen Blocking Layer B1>

The formed cured layer N1 was continuously coated with a coating solution having the following composition (composition B1 for forming an oxygen blocking layer) using a wire bar. Thereafter, the cured layer was dried with warns air at 100° C. for 2 minutes, thereby forming a polyvinyl alcohol (PVA) alignment layer (oxygen blocking layer B1) having a thickness of 1.0 μm on the cured layer N1.

In this manner, a laminate 1B including the cellulose acylate film 1, the photo-alignment layer PA1, the liquid crystal layer P1, the cured layer N1, and the oxygen blocking layer B1 adjacent to each other in this order was obtained.

| Composition of composition B1 for forming oxygen blocking layer |
|---|
| Modified polyvinyl alcohol shown below: 3.80 parts by mass |
| Polymerization initiator IRGACURE 2959 (manufactured by BASE SE): 0.20 parts by mass |
| Water: 70 parts by mass |
| Methanol: 30 parts by mass |
| Modified polyvinyl alcohol<br>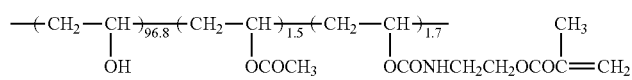 |

[Preparation of TAC Film A1 Having Positive A-Plate A1]

The cellulose acylate film 1 was continuously coated with a coating solution. PA2 for forming an alignment layer described below with a wire her. The support on which a coating film was formed was dried with warm air at 10° C. for 120 seconds, and the coating film was irradiated with polarized ultraviolet rays (10 mJ/cm$^2$, using an ultra-high pressure mercury lamp) to form a photo-alignment layer PA2 having a thickness of 0.2 μm, thereby obtaining a TAC film provided with a photo-alignment layer.

The photo-alignment layer PA2 was coated with the composition A-1 having the composition described below using a bar coater. The coating film formed on the photo-alignment layer PA2 was heated to 120° C. with warm air, cooled to 60° C., irradiated with ultraviolet rays at a wavelength of 365 am with an illuminance of 100 mJ/cm$^2$ using a high-pressure mercury lamp in a nitrogen atmosphere, and continuously irradiated with ultraviolet rays with an illuminance of 500 mJ/cm$^2$ while being heated at 120° C. so that the alignment of the liquid crystal compound was fixed, thereby preparing a TAC film A1 having a positive A-plate A1.

The thickness of the positive A-plate A1 was 2.5 μm, and Re(550) was 144 nm. Further, the positive. A-plate A1 satisfied the relationship of "Re(450)≤Re(550)≤Re(650)". Re(450)/Re(550) was 0.82.

(Coating solution PA2 for forming alignment layer)

Polymer PA-2 shown below: 100.00 parts by mass
Acid generator PAG-1 shown below: 5.00 parts by mass (Coating solution PA2 for forming alignment layer)

Acid generator CPI-110TF shown below: 0.005 parts by mass
Isopropyl alcohol: 16.50 parts by mass
Butyl acetate: 1072.00 parts by mass
Methyl ethyl ketone: 268.00 parts by mass Polymer PA-2

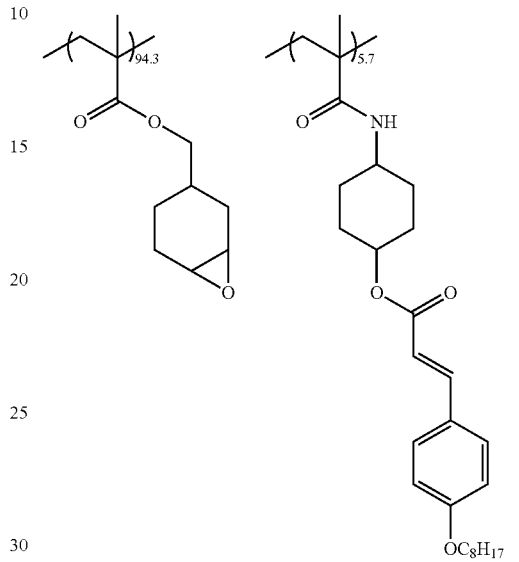

(Composition A-1)

Polymerizable liquid crystal compound L-1 shown below: 43.50 parts by mass
Polymerizable liquid crystal compound L-2 shown below: 43.50 parts by mass
Polymerizable liquid crystal compound L-3 shown below: 8.00 parts by mass
Polymerizable liquid crystal compound L-4 shown below: 5.00 parts by mass
Photopolymerization initiator PI-1 shown below: 0.55 parts by mass
Leveling agent T-1: 0.20 parts by mass
Cyclopentanone: 235.00 parts by mass
Polymerizable liquid crystal compound L-1 (tBu represents a tertiary butyl group)

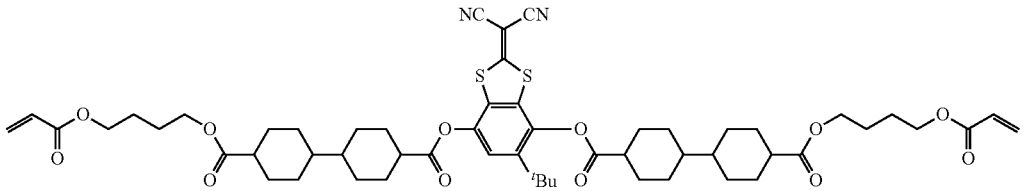 [SMILES: C=CC(=O)OCCCCOC(=O)C1CCC(C2CCC(C(=O)Oc3cc(C(C)(C)C)c(OC(=O)C4CCC(C5CCC(C(=O)OCCCCOC(=O)C=C)CC5)CC4)c4c3SC(=C(C#N)C#N)S4)CC2)CC1]

Polymerizable liquid crystal compound L-2

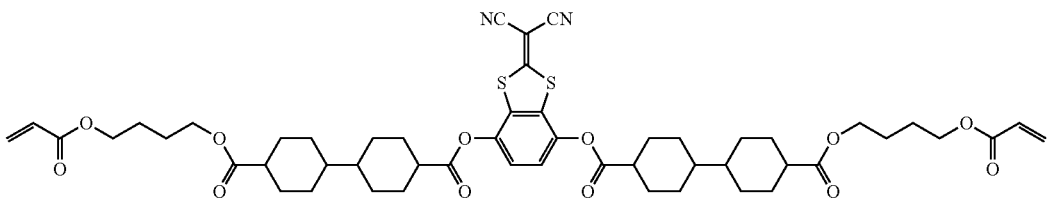 [SMILES: C=CC(=O)OCCCCOC(=O)C1CCC(C2CCC(C(=O)Oc3ccc(OC(=O)C4CCC(C5CCC(C(=O)OCCCCOC(=O)C=C)CC5)CC4)c4c3SC(=C(C#N)C#N)S4)CC2)CC1]

Polymerizable liquid crystal compound L-3

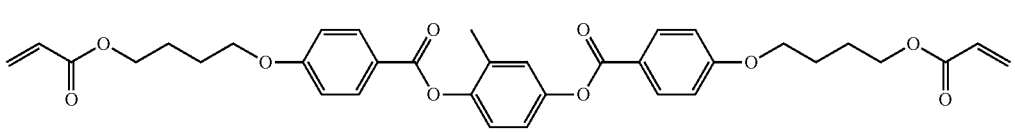 [SMILES: C=CC(=O)OCCCCOc1ccc(C(=O)Oc2ccc(OC(=O)c3ccc(OCCCCOC(=O)C=C)cc3)c(C)c2)cc1]

(Composition A-1)

Polymerizable liquid crystal compound L-4 (Me represents a methyl group)

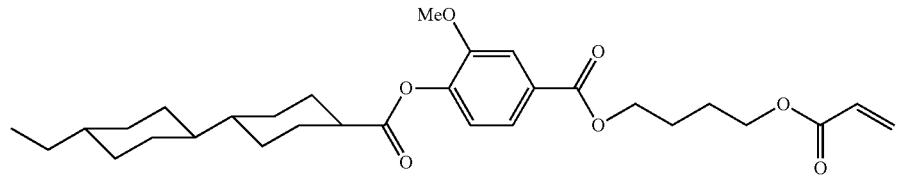 [SMILES: C=CC(=O)OCCCCOC(=O)c1ccc(OC(=O)C2CCC(C3CCC(CC)CC3)CC2)c(OC)c1]

Photopolymerization initiator PI-1

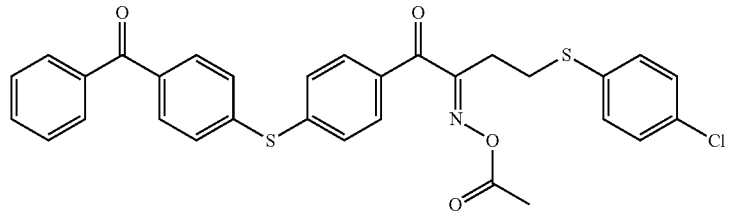 [SMILES: CC(=O)O/N=C(\CCSc1ccc(Cl)cc1)C(=O)c1ccc(Sc2ccc(C(=O)c3ccccc3)cc2)cc1]

Leveling agent T-1

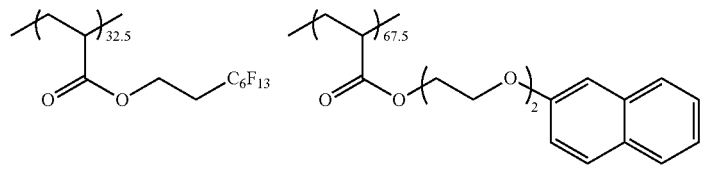

[Preparation of UV Adhesive Composition]

The following UV adhesive composition was prepared.

| UV adhesive composition |
|---|
| CEL2021P (manufactured by Daicel Corporation) shown below: 70 parts by mass |
| 1,4-Butanediol diglycidyl ether: 20 parts by mass |
| 2-Ethylhexyl glycidyl ether: 10 parts by mass |
| CPI-100P: 2.25 parts by mass |
| CPI-100P |
| 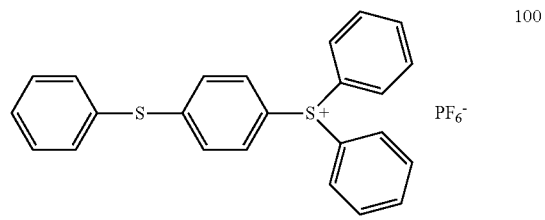 |

[Preparation of Pressure-Sensitive Adhesive Ad1]

Next, an acrylate-based polymer was prepared according to the following procedures.

70 parts by mass of 2-ethylhexyl acrylate, 20 parts by mass of ethyl acrylate, 6 parts by mass of hydroxyethyl methacrylate, and 4 parts by mass of acrylic acid were polymerized by a solution polymerization method in a reaction container equipped with a cooling pipe, a nitrogen introduction pipe, a thermometer, and a stirrer, thereby obtaining an acrylate-based polymer (A1) with an average molecular weight of 300000.

Next, an acrylate-based pressure-sensitive adhesive was prepared using the obtained acrylate-based polymer (A1) according to the following procedure.

2 parts by mass of trimethylolpropane tolylene diisocyanate ("CORONATE L", manufactured by Nippon Polyurethane Industry Co., Ltd.) was added to 100 parts by mass of the solid content of the acrylate-based polymer (A1), and a separate film subjected to a surface treatment with a silicone-based release agent was coated with the mixture using a die coater and dried at 150° C. for 3 hours, thereby obtaining an acrylate-based pressure-sensitive adhesive Ad1 having a film thickness of 150 μm.

[Preparation of Laminate of Example 1]

The surface of the oxygen blocking layer B1 of the laminate 1B was attached to thin plate glass (D263, manufactured by SCHOTT AG) (thickness: 50 μm) using the pressure-sensitive adhesive Ad1. Next, the cellulose acylate film 1 of the laminate 1B was peeled off and removed, the removed surface and the TAC film A1 having the positive A-plate A1 on the phase difference side were attached to each other by irradiation with UV rays with a light dose of 600 mJ/cm² using the UV adhesive composition (thickness of UV adhesive layer: 1 μm), and the cellulose acylate film 1 and the photo-alignment layer PA2 were peeled off and removed from the TAC film A1 having the positive A-plate A1, thereby obtaining a laminate of Example 1.

In this manner, the laminate of Example 1 having the thin glass (D263, manufactured by SCHOTT AG), the pressure-sensitive adhesive Ad1 (first pressure-sensitive adhesive layer), the oxygen blocking layer B1, the cured layer N1, the liquid crystal layer P1 (polarizer layer), the photo-alignment layer PA1, the UV adhesive layer (second pressure-sensitive adhesive layer), and the positive A-plate A1 (λ/4 plate) (optically anisotropic layer) adjacent to each other in this order was obtained.

The laminate of Example 1 has the thin plate glass (D263, manufactured by SCHOTT AG), the pressure-sensitive adhesive Ad1 (first pressure-sensitive adhesive layer), the liquid crystal layer P1 (polarizer layer), the UV adhesive layer (second pressure-sensitive adhesive layer), and the positive A-plate A1 (λ/4 plate) (optically anisotropic layer) in order.

Further, in the laminate of Example 1, the thin plate glass (D263 manufactured by SCHOTT AG) has a thickness of less than 100 μm and thus corresponds to the above-described specific glass plate. Further, in the laminate of Example 1, the liquid crystal layer P1 is a polarizer layer formed from the composition for forming a polarizer layer which contains a liquid crystal compound and an organic dichroic material and thus corresponds to the above-described specific polarizer layer. Further, in the laminate of Example 1, the layers present between the pressure-sensitive adhesive Ad1 (first pressure-sensitive adhesive layer) and the liquid crystal layer P1 (polarizer layer) are the oxygen blocking layer B1 (thickness: 1.0 μm) and the cured layer N1 (thickness: 0.05 μm), and the distance A is 1.05 μm, which is 10 μm or less. Further, in the laminate of Example 1, the layer present between the liquid crystal layer P1 (polarizer layer) and the UV adhesive layer (second pressure-sensitive adhesive layer) is the photo-alignment layer PA1 (thickness: 1.0 μm), and the distance B is 1.0 μm, which is 10 μm or less.

Therefore, the laminate of Example 1 corresponds to the above-described laminate according to the embodiment of the present invention.

Example 2

A laminate of Example 2 was obtained in the same manner as in Example 1 except that the pressure-sensitive adhesive sheet (2) of Example 2 of JP2019-7001A having a thickness of 150 μm was used in place of the pressure-sensitive adhesive Ad1.

The laminate of Example 2 has the thin plate glass (D263, manufactured by SCHOTT), the pressure-sensitive adhesive sheet (2) (first pressure-sensitive adhesive layer), the oxygen blocking layer B1, the cured layer N1, the liquid crystal layer P1 (polarizer layer), the photo-alignment layer PA1, the UV adhesive layer (second pressure-sensitive adhesive layer), and the positive A-plate A1 (λ/4 plate) (optically anisotropic layer) adjacent to each other in this order.

The laminate of Example 2 corresponds to the above-described laminate according to the embodiment of the present invention in the same manner as that for the laminate of Example 1.

Example 3

A laminate of Example 3 was prepared as follows.
[Preparation of Pressure-Sensitive Adhesive Ad2]

An acrylate-based pressure-sensitive adhesive Ad2 was obtained in the same manner as that for the above-described acrylate-based pressure-sensitive adhesive Ad1 except that the film thickness thereof was set to 20 μm.
[Preparation of Polyimide Film S-1]

The polyimide film S-1 was produced as follows.
<Production of Polyimide Powder>

832 g of N,N-dimethylacetamide (DMAc) was added to a 1 L reactor equipped with a stirrer, a nitrogen injection device, a dropping funnel, a temperature controller, and a cooler under a nitrogen stream, and the temperature of the reactor was set to 25° C. 64.046 g (0.2 mol) of bistrifluoromethylbenzidine (TFDB) was added to the mixture and dissolved therein 31.09 g (0.07 mol) of a 2,2-bis (3,4-dicarboxyphenyl) hexafluoropropane dianhydride (6FDA) and 8.83 g (0.03 mol) of a biphenyltetracarboxylic dianhydride (BPDA) were added to the obtained solution while the solution was maintained at 25° C., and the solution was stirred for a certain period of time and allowed to react. Thereafter, 20.302 g (0.1 mol) of terephthaloyl chloride (TPC) was added to the solution, thereby obtaining a polyamic acid solution having a concentration of solid contents of 13% by mass. Next, 25.6 g of pyridine and 33.1 g of acetic anhydride were added to the polyamic acid solution, and the resulting solution was stirred for 30 minutes, further stirred at 70° C. for 1 hour, and cooled to room temperature. 20 L of methanol was added thereto, and the precipitated solid content was filtered and crushed. Thereafter, the crushed solid content was dried in vacuum at 100° C. for 6 hours, thereby obtaining 1.11 g of polyimide powder.
<Production of Polyimide Film S-1>

100 g of the polyimide powder was dissolved in 670 g of N,N-dimethylacetamide (DMAc) to obtain a 13 mass % solution. The obtained solution was cast on a stainless steel plate and dried with hot air at 130° C. for 30 minutes. Thereafter, the film was peeled off from the stainless steel plate and fixed to a frame with a pin, and the frame to which the film was fixed was placed in a vacuum oven, heated for 2 hours while the heating temperature was gradually raised from 100° C. to 300° C., and gradually cooled. The cooled film was separated from the frame and further subjected to a heat treatment at 300° C. for 30 minutes as a final heat treatment step, thereby obtaining a base material S-1 consisting of a polyimide film and having a thickness of 30 μm.
[Preparation of Laminate of Example 3]

The polyimide film S-1 was attached to thin plate glass (D263, manufactured by SCHOTT AG) (thickness: 50 μm) using the pressure-sensitive adhesive Ad2. Next, the surface of the oxygen blocking layer B1 of the laminate 1B was attached to the surface of the polyimide film S-1 opposite to the thin glass plate using the above-described adhesive Ad1. Next, the cellulose acylate film 1 of the laminate 1B was peeled off and removed, the removed surface and the TAC film A1 having the positive A-plate A1 on the phase difference side were attached to each other by irradiation with IN rays with a light dose of 600 mJ/cm² using the UV adhesive composition (thickness of UV adhesive layer: 1 μm), and the cellulose acylate film 1 and the photo-alignment layer PA2 were peeled off and removed from the TAC film A1 having the positive A-plate A1, thereby obtaining a laminate of Example 3.

The laminate of Example 3 has the thin plate glass (D263, manufactured by SCHOTT AG), the pressure-sensitive adhesive Ad2, the polyimide film S-1, the pressure-sensitive adhesive Ad1 (first pressure-sensitive adhesive layer), the oxygen blocking layer B1, the cured layer N1, the liquid crystal layer P1 (polarizer layer), the photo-alignment layer PA1, the UV adhesive layer (second pressure-sensitive adhesive layer), and the positive A-plate A1 (λ/4 plate) (optically anisotropic layer) adjacent to each other in this order.

Further, the laminate of Example 3 has two pressure-sensitive adhesive layers (the adhesive Ad2 and the pressure-sensitive adhesive Ad1) between the thin plate glass and the liquid crystal layer P1 (polarizer layer), and since the pressure-sensitive adhesive layer Ad1 is a pressure-sensitive adhesive layer closest to the liquid crystal layer P1 (polarizer layer), the pressure-sensitive adhesive Ad1 corresponds to the above-described first pressure-sensitive adhesive layer.

The laminate of Example 3 corresponds to the above-described laminate according to the embodiment of the present invention in the same manner as that for the laminate of Example 1.

Example 4

A laminate of Example 4 was obtained in the same manner as in Example 1 except that the oxygen blocking layer B1 was not formed in the laminate 1B.

The laminate of Example 4 has thin plate glass (D263, manufactured by SCHOTT AG), the pressure-sensitive adhesive Ad1 (first pressure-sensitive adhesive layer), the cured layer N1, the liquid crystal layer P1 (polarizer layer), the photo-alignment layer PA1, the UV adhesive layer (second pressure-sensitive adhesive layer), and the positive A-plate A1 ($\lambda/4$ plate) (optically anisotropic layer) adjacent to each other in this order.

The laminate of Example 4 corresponds to the above-described laminate according to the embodiment of the present invention in the same manner as that for the laminate of Example 1.

Comparative Example 1

One surface of the polarizer (thickness: 12 µm) (also referred to as the "comparative polarizer layer") described in paragraph [0157] of JP2019-7001A was attached to thin plate glass (D263, manufactured by scram AG) (thickness: 50 µm) using the pressure-sensitive adhesive Ad1. Next, the other surface of the comparative polarizer layer and the TAC film A1 having the positive A-plate A1 on the phase difference side were attached to each other by irradiation with UV rays with a light dose of 600 mJ/cm$^2$ using the UV adhesive composition (thickness of UV adhesive layer: 1 µm), and the cellulose acylate film 1 and the photo-alignment layer PA2 were peeled off and removed from the TAC film A1 having the positive A-plate A1, thereby obtaining a laminate of Comparative Example 1.

The laminate of Comparative Example 1 has the thin plate glass (D263, manufactured by SCHOTT AG), the pressure-sensitive adhesive Ad1 (first pressure-sensitive adhesive layer), the comparative polarizer layer, the UV adhesive layer (second pressure-sensitive adhesive layer), and the positive A-plate A1 ($\lambda/4$ plate) (optically anisotropic layer) adjacent to each other in this order.

In the laminate of Comparative Example 1, the comparative polarizer layer is not a polarizer layer formed of the composition for forming a polarizer layer which contains a liquid crystal compound and an organic dichroic material and thus does not correspond to the specific polarizer layer described above.

Therefore, the laminate of Comparative Example 1 does not correspond to the above-described laminate according to the embodiment of the present invention.

Comparative Example 2

First, the cellulose acylate film 2 was bonded to one surface of the polarizer (thickness: 12 µm) (comparative polarizer layer) described in paragraph [0157] of JP2019-7001A, and the cellulose triacylate film TJ40 (manufactured by FUJIFILM Co., Ltd.) (thickness: 40 µm) was bonded to the other surface of the polarizer, thereby obtaining a comparative laminate.

Next, the surface of the cellulose triacetate film TJ40 of the comparative laminate was attached to the thin plate glass (D263, manufactured by SCHOTT) (thickness: 50 µm) using the pressure-sensitive adhesive Ad1. Next, the surface of the cellulose acrylate film 2 of the comparative laminate and the TAC film A1 having the positive A-plate A1 on the phase difference side were attached to each other by irradiation with UV rays with a light dose of 600 mJ/cm$^2$ using the UV adhesive composition (thickness of UV adhesive layer: 1 µm), and the cellulose acylate film 1 and the photo-alignment layer PA2 were peeled off and removed from the TAC film A1 having the positive A-plate A1, thereby obtaining a laminate of Comparative Example 2.

The laminate of Comparative Example 2 has the thin plate glass (D263, manufactured by SCHOTT AG), the pressure-sensitive adhesive Ad1 (first pressure-sensitive adhesive layer), the cellulose triacetate film TJ40, the comparative polarizer layer, the cellulose acylate film 2, the UV adhesive layer (second pressure-sensitive adhesive layer), and the positive A-plate A1 ($\lambda/4$ plate) (optically anisotropic layer).

In the laminate of Comparative Example 2, the comparative polarizer layer is not a polarizer layer formed of the composition for forming a polarizer layer which contains a liquid crystal compound and an organic dichroic material and thus does not correspond to the specific polarizer layer described above. Further, in the laminate of Comparative Example 2, since the cellulose triacetate film TA0 (thickness: 40 µm) is present between the pressure-sensitive adhesive Ad1 (first pressure-sensitive adhesive layer) and the comparative polarizer layer, the distance A is greater than 10 µm. Further, in the laminate of Comparative Example 2, since the cellulose acylate film 2 (thickness: 25 µm) is present between the comparative polarizer layer and the UV adhesive layer (second pressure-sensitive adhesive layer), the distance B is greater than 10 µm.

Therefore, the laminate of Comparative Example 2 does not correspond to the above-described laminate according to the embodiment of the present invention.

Comparative Example 3

A laminate of Comparative Example 3 was obtained in the same manner as in Comparative Example 2 except that Gorilla Glass 5 (thickness: 600 µm) (manufactured by Corning Inc.) was used in place of the thin plate glass (D263, manufactured by SCHOTT AG).

The laminate of Comparative Example 3 has Gorilla Glass 5 (manufactured by Corning Inc.), the pressure-sensitive adhesive Ad1 (first pressure-sensitive adhesive layer), the cellulose triacetate film TJ40, the comparative polarizer layer, the cellulose acylate film 2, the UV adhesive layer (second pressure-sensitive adhesive layer), and the positive A-plate A1 ($\lambda/4$ plate) (optically anisotropic layer).

In the laminate of Comparative Example 3, Gorilla Glass 5 (manufactured by Corning Inc.) has a thickness of 100 µm or greater and thus does not correspond to the above-described specific glass plate. Further, in the laminate of Comparative Example 3, the comparative polarizer layer is not a polarizer layer formed of the composition for forming a polarizer layer which contains a liquid crystal compound and an organic dichroic material and thus does not correspond to the above-described specific polarizer layer. Further, in the laminate of Comparative Example 3, since the cellulose triacetate film TJ40 (thickness: 40 µm) is present between the pressure-sensitive adhesive Ad1 (first pressure-sensitive adhesive layer) and the comparative polarizer layer, the distance A is greater than 10 µm. Further, in the laminate of Comparative Example 3, since the cellulose acylate film 2 (thickness: 25 μm) is present between the comparative polarizer layer and the UV adhesive layer (second pressure-sensitive adhesive layer), the distance B is greater than 10 μm.

Therefore, the laminate of Comparative Example 3 does not correspond to the above-described laminate according to the embodiment of the present invention.

[Evaluation]

The following evaluations were performed on each of the obtained laminates.

[Bending Resistance]

A sample film having a width of 15 mm and a length of 150 μm was cut out from the obtained laminate and allowed to stand at a temperature of 25° C. and a relative humidity of 60% for 1 hour or longer. Thereafter, the bending resistance test was repeatedly performed with the glass plate on the outside using a 180° bending resistance tester (IMC-0755 type, manufactured by Imoto Machinery Co., Ltd.). The tester used is a tester that performs an operation of bending the sample film along the curved surface of a rod (cylinder) with a diameter of 20 mm at a bending angle of 180° at the central part in the longitudinal direction and returning the bent film to the original state (widening the sample film) as one test and repeatedly performs this test. In a case where the 180° bending test was repeatedly performed at 200 times/minute, a case where the maximum number of times at which cracks did not occur was greater than 1000 times was denoted as A, a case where the maximum number of times thereof was greater than 100 times and 1000 times or less was denoted as B, a case where the maximum number of times thereof was greater than 1 time and 100 times or less was denoted as C, and a case where the maximum number of times thereof was 0 times was denoted as D. Further, the presence or absence of cracks was evaluated with an optical microscope.

The results are listed in Table 1. Practically, A or B is preferable, and A is more preferable as the evaluation result.

[Scratch Resistance]

The scratch resistance was evaluated by performing a rubbing test on the surface of the glass plate of the obtained laminate under the following conditions using a rubbing tester.

Evaluation environmental conditions: 25° C., relative humidity of 60% Rubbing material: Steel wool (manufactured by Nihon Steel Wool Co., Ltd., grade No. #0000)

The material was wrapped around the rubbing tip (2 cm×2 cm) of the tester brought into contact with the sample and fixed to the band.

Movement distance (one way): 13 cm
Rubbing speed: 13 cm/sec
Load: 1 kg/cm²
Tip contact area: 2 cm×2 cm
Number of times of rubbing: 10 round trips, 100 round trips, 1000 round trips The surface of the laminate after the test on a side opposite to the rubbed was coated with oil-based black ink and visually observed with reflected light, and the number of times of rubbing in a case where scratches occurred on the part that was in contact with steel wool was measured and evaluated.

A: No scratches occurred in a case where the surface was rubbed 1000 times back and forth B: No scratches occurred in a case where the surface was rubbed 100 times back and forth, but scratches occurred in a case where the surface was rubbed 1000 times back and forth C: No scratches occurred in a case where the surface was rubbed 10 times back and forth, but scratches occurred in a case where the surface was rubbed 100 times back and forth D: Scratches occurred in a case where the surface was rubbed 10 times back and forth.

The results are listed in Table 1. Practically, A or B is preferable, and A is more preferable as the evaluation result.

The results are listed in Table 1. Practically, A or B is preferable, and A is more preferable as the evaluation result.

[Durability]

The obtained laminate was cut into a size of 50 mm×50 mm, and the surface of the positive A plate A1 was pressure-bonded onto a glass substrate (Eagle XG, manufactured by Corning Inc.) using a pressure-sensitive adhesive SK2057 (manufactured by Soken Chemical & Engineering Co., Ltd.). The glass substrate pressure-bonded sample was subjected to a durability test at 813° C., and the following changes in the degree of polarization were evaluated.

Each laminate of the examples and the comparative examples was set on a sample table in a state in which a linear polarizer was inserted on a light source side of an optical microscope (product name, "ECLIPSE E600 POL", manufactured by Nikon Corporation), the transmittance of each laminate was measured using a multi-channel spectrometer (product name, "QE65000", manufactured by Ocean Optics, Inc.), and the degrees of polarization was calculated according to the following equation.

$$\text{Degree of polarization: } P = \sqrt{[(Ty0 - Tz0)(Ty0 + Tz0)]}$$

Tz0: Transmittance of laminate with respect to polarized light in absorption axis direction Ty0: Transmittance of laminate with respect to polarized light in transmission axis direction A: Change in the degree of polarization was less than 5%

B: Change in the degree of polarization was greater than or equal to 5% and less than 10%

C: Change in the degree of polarization was 10% or greater

The results are listed in Table 1. Practically, A or B is preferable, and A is more preferable as the evaluation result.

[Shape Stability]

The obtained laminate was cut into a size of 50 mm×50 mm, and the surface of the positive A plate A1 was pressure-bonded onto a glass substrate (Eagle XG, manufactured by Corning Inc.) using a pressure-sensitive adhesive SK2057 (manufactured by Soken Chemical & Engineering Co., Ltd.). This glass substrate pressure-bonded sample was subjected to a durability test at 60° C. and 90%, and the sample was observed and visually evaluated.

A: No wrinkles occurred in 400 hours or longer

B: Wrinkles occurred in 100 hours or longer and shorter than 400 hours

C: Wrinkles occurred in 50 hours or longer and shorter than 100 hours

D: Wrinkles occurred in shorter than 50 hours

The results are listed in Table 1. Practically, A is preferable.

TABLE 1

|  | Example 1 | Example 2 | Example 3 | Example 4 | Comparative Example 1 | Comparative Example 2 | Comparative Example 3 |
|---|---|---|---|---|---|---|---|
| Bending resistance | A | A | A | A | A | C | D |
| Scratch resistance | A | A | A | A | A | A | A |
| Durability | A | A | A | B | C | A | A |
| Shape stability | A | A | A | A | B | A | A |

As listed in Table 1, each of the laminates of Examples 1 to 4, in which the specific glass plate, the first pressure-sensitive adhesive layer, the specific polarizer layer, the second pressure-sensitive adhesive layer, and the optically anisotropic layer were provided in order and the distance A and the distance B were respectively 1.0 µm or less, exhibited excellent bending resistance, scratch resistance, durability, and shape stability. Among these, the laminates of Examples 1 to 3 which had the oxygen blocking layer exhibited more excellent durability.

On the contrary, the laminate of Comparative Example 3 in which the thickness of the glass plate was 100 µm or greater had insufficient bending resistance.

Further, the laminate of Comparative Example 2 in which the thickness of the glass plate was less than 100 µm but the distance A and the distance B were respectively greater than 10 µm also had insufficient bending resistance. The reason for this is considered to be that the cellulose acylate film and the cellulose triacetate film attached to the polarizer layer were deteriorated.

Further, the laminate of Comparative Example 1 in which the glass plate was a specific glass plate and the distance A and the distance B were respectively 10 µm or less, but the polarizer layer was not the specific polarizer layer had insufficient durability and insufficient shape stability. The reason fir this is considered to be that the degree of deflection was decreased due to the outflow of iodine in the polarizer layer.

EXPLANATION OF REFERENCES

10: glass plate
20: first pressure-sensitive adhesive layer
30: polarizer layer (specific polarizer layer)
40: second pressure-sensitive adhesive layer
50: λ/4 plate (optically anisotropic layer)
60: photo-alignment layer
70: cured layer
80: oxygen blocking layer
100: optical laminate
200: optical laminate

What is claimed is:

1. An optical laminate comprising:
a glass plate;
a first pressure-sensitive adhesive layer;
a polarizer layer;
a second pressure-sensitive adhesive layer; and
an optically anisotropic layer in this order,
wherein:
the glass plate has a thickness of less than 100 µm,
the first pressure-sensitive adhesive layer has a thickness of 100 µm or more,
the polarizer layer is a polarizer layer formed of a composition for forming a polarizer layer which contains a liquid crystal compound and an organic dichroic material,
a distance A between the first pressure-sensitive adhesive layer and the polarizer layer is 10 µm or less,
a distance B between the polarizer layer and the second pressure-sensitive adhesive layer is 10 µm or less,
in a case where two or more pressure-sensitive adhesive layers are provided between the glass plate and the polarizer layer, the first pressure-sensitive adhesive layer denotes a pressure-sensitive adhesive layer closest to the polarizer layer among the two or more pressure-sensitive adhesive layers provided between the glass plate and the polarizer layer, and
in a case where two or more pressure-sensitive adhesive layers are provided between the polarizer layer and the optically anisotropic layer, the second pressure-sensitive adhesive layer denotes a pressure-sensitive adhesive layer closest to the polarizer layer among the two or more pressure-sensitive adhesive layers provided between the polarizer layer and the optically anisotropic layer.

2. The optical laminate according to claim 1, wherein the second pressure-sensitive adhesive layer is an adhesive layer.

3. The optical laminate according to claim 2, wherein the adhesive layer is an adhesive layer formed of a PVA-based adhesive or a UV adhesive.

4. The optical laminate according to claim 1, wherein a functional layer is provided in at least one of between the first pressure-sensitive adhesive layer and the polarizer layer or between the polarizer layer and the second pressure-sensitive adhesive layer.

5. The optical laminate according to claim 1, wherein the polarizer layer has a thickness of 10 µm or less.

6. The optical laminate according to claim 1, wherein the optically anisotropic layer is formed by being coated with a liquid crystal composition.

7. The optical laminate according to claim 1, wherein the first pressure-sensitive adhesive layer has an absorbance of 0.5 or greater at a wavelength of 360 nm and a wavelength of 400 nm.

8. The optical laminate according to claim 1, further comprising:
a UV absorbing layer having an absorbance of 0.5 or greater at a wavelength of 360 nm and a wavelength of 400 nm on a side of the glass plate with respect to the polarizer layer.

9. An organic EL display device comprising:
the optical laminate according to claim 1.

10. A foldable device which is formed of the organic EL display device according to claim 9.

11. The optical laminate according to claim 1, wherein the glass plate has a thickness of 80 μm or less.

* * * * *